US008817943B2

(12) United States Patent
Jang

(10) Patent No.: US 8,817,943 B2
(45) Date of Patent: Aug. 26, 2014

(54) SHIFT REGISTER

(71) Applicant: LG Display Co., Ltd., Seoul (KR)

(72) Inventor: Yong-Ho Jang, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 62 days.

(21) Appl. No.: 13/727,245

(22) Filed: Dec. 26, 2012

(65) Prior Publication Data

US 2014/0072092 A1   Mar. 13, 2014

(30) Foreign Application Priority Data

Sep. 7, 2012 (KR) .......................... 10-2012-0099517

(51) Int. Cl.
*G11C 19/00* (2006.01)
(52) U.S. Cl.
CPC ....................................... *G11C 19/00* (2013.01)
USPC .................. 377/64; 377/78; 377/79
(58) Field of Classification Search
None
See application file for complete search history.

(56) References Cited

U.S. PATENT DOCUMENTS

| 7,203,264 | B2 * | 4/2007 | Lo et al. ........................... | 377/64 |
| 8,238,512 | B2 * | 8/2012 | Kim ................................... | 377/64 |
| 8,373,637 | B2 * | 2/2013 | Ieong et al. .................... | 345/100 |
| 8,633,888 | B2 * | 1/2014 | Kim et al. ...................... | 345/100 |
| 8,731,136 | B2 * | 5/2014 | Shin et al. ...................... | 377/64 |
| 2007/0104307 | A1 * | 5/2007 | Kim et al. ...................... | 377/64 |
| 2008/0002803 | A1 * | 1/2008 | Kim et al. ...................... | 377/64 |
| 2009/0058790 | A1 * | 3/2009 | Chiang et al. ................. | 345/100 |
| 2012/0269315 | A1 * | 10/2012 | Jang et al. ...................... | 377/75 |
| 2013/0010916 | A1 * | 1/2013 | Jang et al. ...................... | 377/64 |
| 2013/0243150 | A1 * | 9/2013 | Jang et al. ...................... | 377/64 |
| 2014/0044228 | A1 * | 2/2014 | Jang ................................ | 377/64 |
| 2014/0093027 | A1 * | 4/2014 | Jang ................................ | 377/64 |

FOREIGN PATENT DOCUMENTS

| KR | 1020090110483 A | 10/2009 |
| KR | 1020100072139 A | 6/2010 |

OTHER PUBLICATIONS

Office Action issued in corresponding Korean Patent Application No. 10-2012-0099517, mailed Oct. 28, 2013, 3 pages.

* cited by examiner

*Primary Examiner* — Tuan T Lam
(74) *Attorney, Agent, or Firm* — Brinks Gilson & Lione

(57) ABSTRACT

A shift register includes a plurality of stages for sequentially outputting A-scan pulses and B-scan pulses. At least one of the stages includes an A-sub-stage for controlling a voltage at an A-set node and a voltage at at least one A-reset node in response to an external A-control signal and generating an A-carry pulse based on the voltage at the A-set node, the voltage at the A-reset node and any one A-clock pulse, a B-sub-stage for controlling a voltage at a B-set node and a voltage at at least one B-reset node in response to an external B-control signal and generating a B-carry pulse based on the voltage at the B-set node, the voltage at the B-reset node and any one B1-clock pulse, and a scan output controller for generating a corresponding one of the A-scan pulses and a corresponding one of the B-scan pulses.

38 Claims, 41 Drawing Sheets

FIG.18
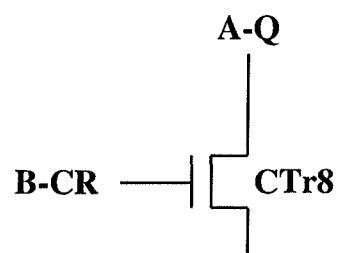
(a)
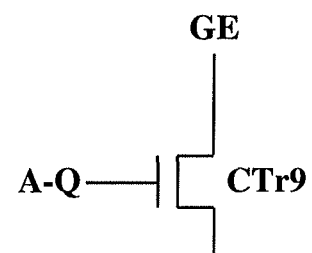
(b)

SHIFT REGISTER

This application claims the benefit of Korean Patent Application No. 10-2012-0099517 filed on Sep. 7, 2012 which is hereby incorporated by reference as if fully set forth herein.

BACKGROUND

1. Field of the Disclosure

The present disclosure relates to a shift register, and more particularly, to a shift register which is capable of stably outputting a scan pulse of a composite waveform in an organic light emitting diode display device.

2. Discussion of the Related Art

In an organic light emitting diode display device, there may be deviations among driving currents applied to respective pixels. A number of transistors are integrated inside of each pixel to prevent such deviations.

This display device includes a shift register for sequentially generating a number of control signals to drive the transistors.

Such a conventional shift register employs a multiplexer structure to output a scan pulse of a composite waveform, which consists of two waveforms having different widths and timings.

This structure generates the scan pulse of the composite waveform by switching a fixed, constant voltage externally provided. In this regard, stably outputting the scan pulse may involve increasing the sizes of output transistors which switch the scan pulse, resulting in an increase in the size of the display device.

SUMMARY

A shift register includes a plurality of stages for sequentially outputting A-scan pulses and B-scan pulses, wherein at least one of the stages includes an A-sub-stage that controls a voltage at an A-set node and a voltage at at least one A-reset node in response to an external A-control signal and generates an A-carry pulse based on the voltage at the A-set node, the voltage at the at least one A-reset node and any one A-clock pulse, a B-sub-stage that controls a voltage at a B-set node and a voltage at at least one B-reset node in response to an external B-control signal and generates a B-carry pulse based on the voltage at the B-set node, the voltage at the at least one B-reset node and any one B1-clock pulse, and a scan output controller that generates a corresponding one of the A-scan pulses based on the voltage at the A-set node and the A-clock pulse and generates a corresponding one of the B-scan pulses based on the B-carry pulse and any one B2-clock pulse.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings:

FIG. 18 is a view illustrating other switching devices which may be additionally provided in the scan output controller;

DETAILED DESCRIPTION OF THE EXEMPLARY EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

Figure 1:
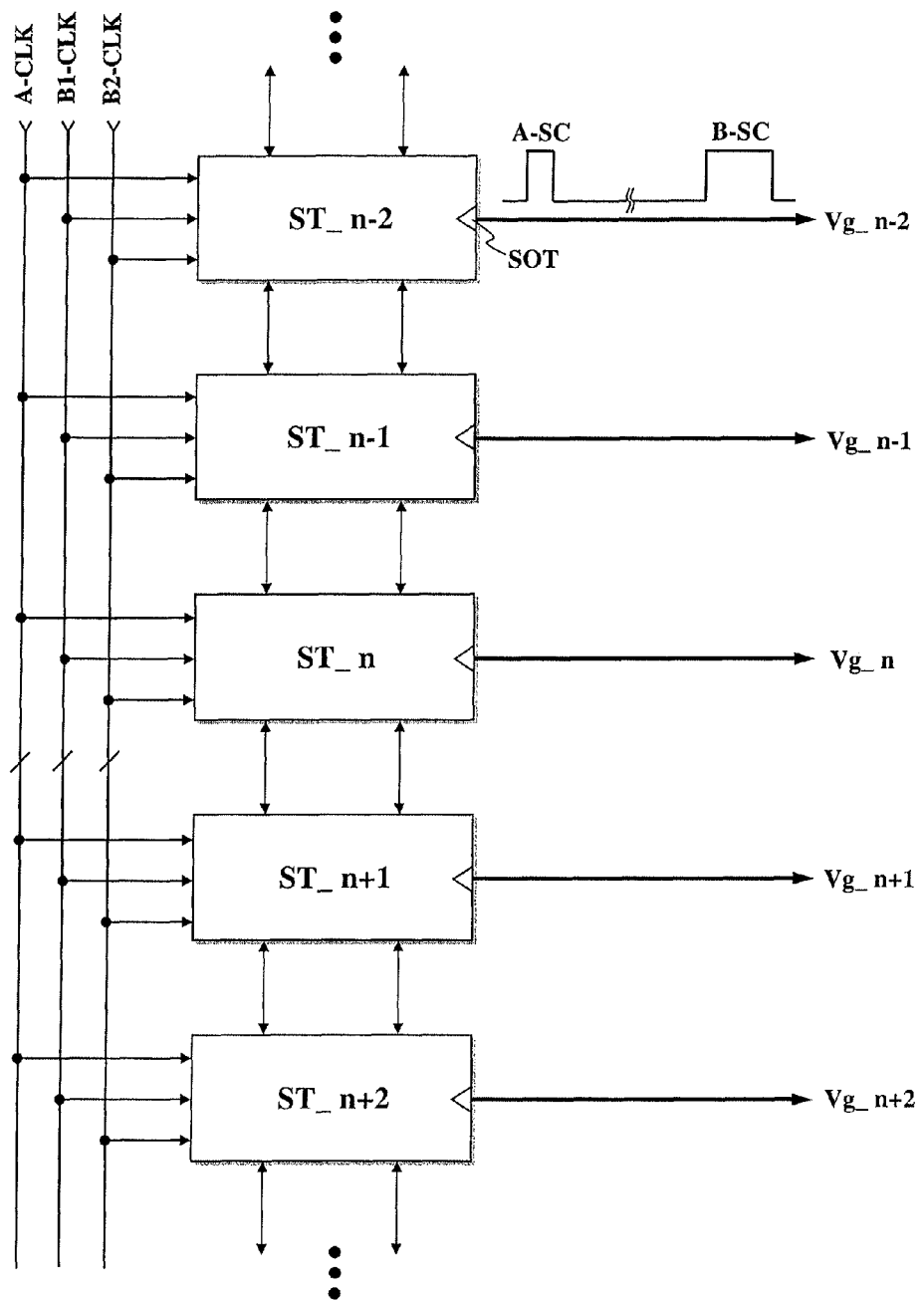
FIG. 1 is a block diagram showing the configuration of a shift register according to an embodiment of the present invention.

FIG. 1 is a block diagram showing the configuration of a shift register according to an embodiment of the present invention.

The shift register according to the present embodiment includes a plurality of stages ST_n−2 to ST_n+2, as shown in FIG. 1.

Each stage ST_n−2 to ST_n+2 outputs a scan pulse Vg_n−2 to Vg_n+2 through a scan output terminal SOT thereof.

Each scan pulse Vg_n−2 to Vg_n+2 is divided into an A-scan pulse and a B-scan pulse, which are output at different periods. For example, seeing an A-scan pulse A-SC and a B-scan pulse B-SC output from the (n−2)th stage ST_n−2, the A-scan pulse A-SC may be generated once in every frame, and the B-scan pulse B-SC may be generated once in several frames.

As a detailed example, assume that a total number of gate lines of a panel to be driven is ten, a shift register for driving of the ten gate lines includes a total of ten stages, the (n−2)th stage ST_n−2 is a first one of the ten stages which drives a first one of the ten gate lines, a time for which one gate line is driven is one horizontal period, and a time for which the ten gate lines are all driven once is one frame period.

On this assumption, the first stage outputs an A-scan pulse A-SC in a first horizontal period of each of first to tenth frame periods to drive the first gate line in the first horizontal period of each frame period. Further, the first stage outputs a B-scan pulse B-SC immediately after a tenth horizontal period of the first frame period. That is, the B-scan pulse B-SC may be generated at any time in a period between the end of generation of a last A-scan pulse in the current frame period and the start of the next frame period.

Here, the B-scan pulse B-SC is again output through the first stage in an eleventh frame period. That is, under the above condition, the first stage outputs an A-scan pulse A-SC once in every frame period and a B-scan pulse B-SC once in ten frame periods. In the same manner, each of the other stages outputs an A-scan pulse A-SC in a corresponding horizontal period of every frame period and a B-scan pulse B-SC in an end period of a corresponding frame period (a period subsequent to a last horizontal period in each frame period). As stated above, the "period subsequent to the last horizontal period" signifies any specific period belonging to the period between the end of the generation of the last A-scan pulse in the current frame period and the start of the next frame period.

In order to generate the above A-scan pulse and B-scan pulse, each stage ST_n−2 to ST_n+2 is supplied with any one of a plurality of A-clock pulses A-CLK having different phases, any one of a plurality of B1-clock pulses B1-CLK having different phases, and any one of a plurality of B2-clock pulses B2-CLK having different phases.

That is, each stage ST_n−2 to ST_n+2 generates an A-scan pulse based on an A-clock pulse A-CLK supplied thereto and generates a B-scan pulse based on a B1-clock pulse B1-CLK and a B2-clock pulse B2-CLK supplied thereto.

On the other hand, the B2-clock pulses B2-CLK may be one in number, not plural in number. That is, only a B2-clock pulse B2-CLK of one phase may be used.

In this manner, each stage ST_n−2 to ST_n+2 drives a gate line connected thereto using a scan pulse Vg_n−2 to Vg_n+2 of a composite waveform including an A-scan pulse and a B-scan pulse.

Hereinafter, the configuration of each stage will be described in detail with reference to FIG. 2.

Figure 2:
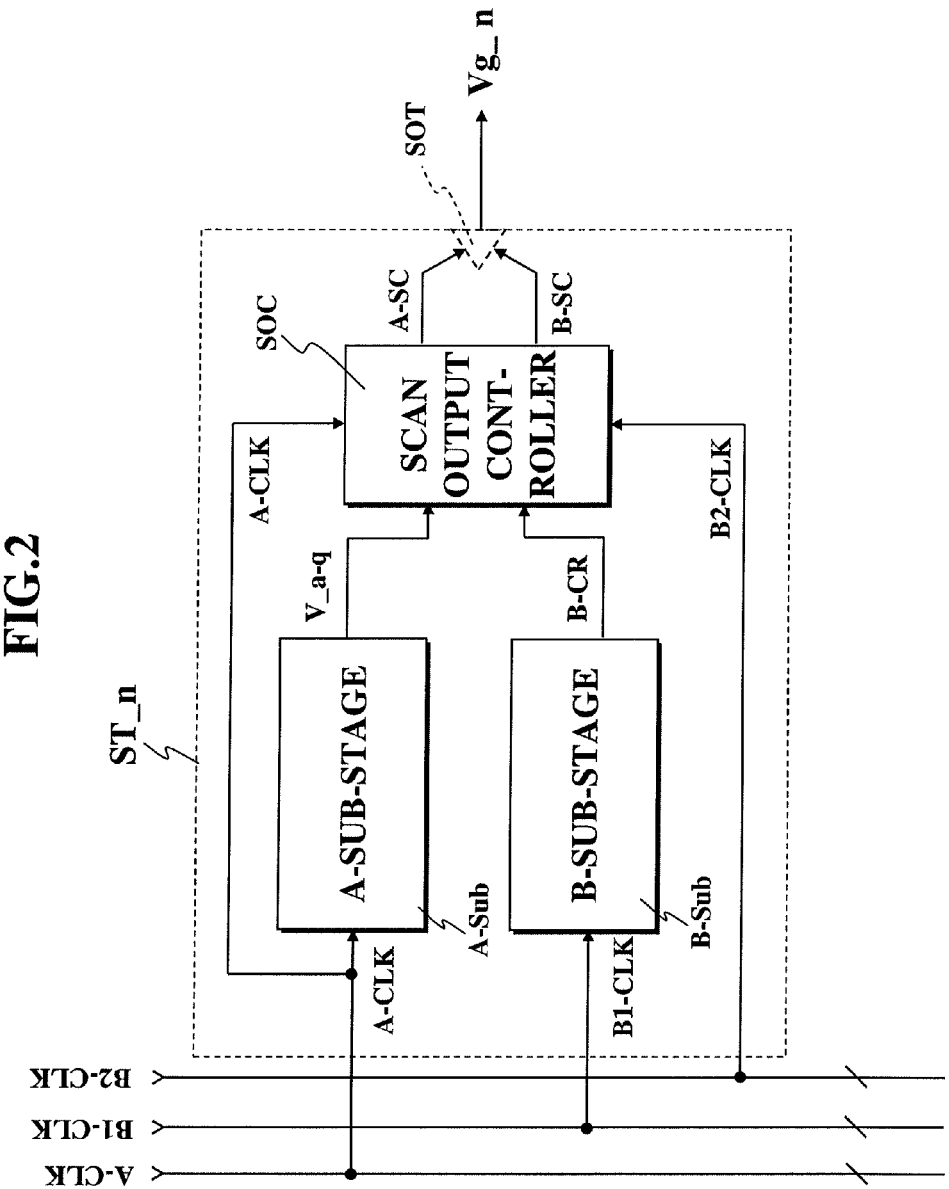
FIG. 2 is a detailed block diagram of any one stage in FIG. 1.

FIG. 2 is a detailed block diagram of any one stage in FIG. 1.

The stage includes an A-sub-stage A-Sub, a B-sub-stage B-Sub, and a scan output controller SOC, as shown in FIG. 2.

The A-sub-stage A-Sub controls a voltage V_a-q at an A-set node and a voltage at at least one A-reset node in response to an external A-control signal. Also, the A-sub-stage A-Sub generates an A-carry pulse based on the voltage V_a-q at the A-set node, the voltage at the at least one A-reset node and any one A-clock pulse A-CLK.

The B-sub-stage B-Sub controls a voltage at a B-set node and a voltage at at least one B-reset node in response to an external B-control signal. Also, the B-sub-stage B-Sub generates a B-carry pulse B-CR based on the voltage at the B-set node, the voltage at the at least one B-reset node and any one B1-clock pulse B1-CLK.

The scan output controller SOC generates an A-scan pulse A-SC based on the voltage V_a-q at the A-set node and the A-clock pulse A-CLK. Also, the scan output controller SOC generates a B-scan pulse B-SC based on the B-carry pulse B-CR and any one B2-clock pulse B2-CLK.

The A-control signal and B-control signal supplied to each stage ST_n−2 to ST_n+2 may be signals as will hereinafter be described in detail with reference to FIG. 3.

Figure 3:
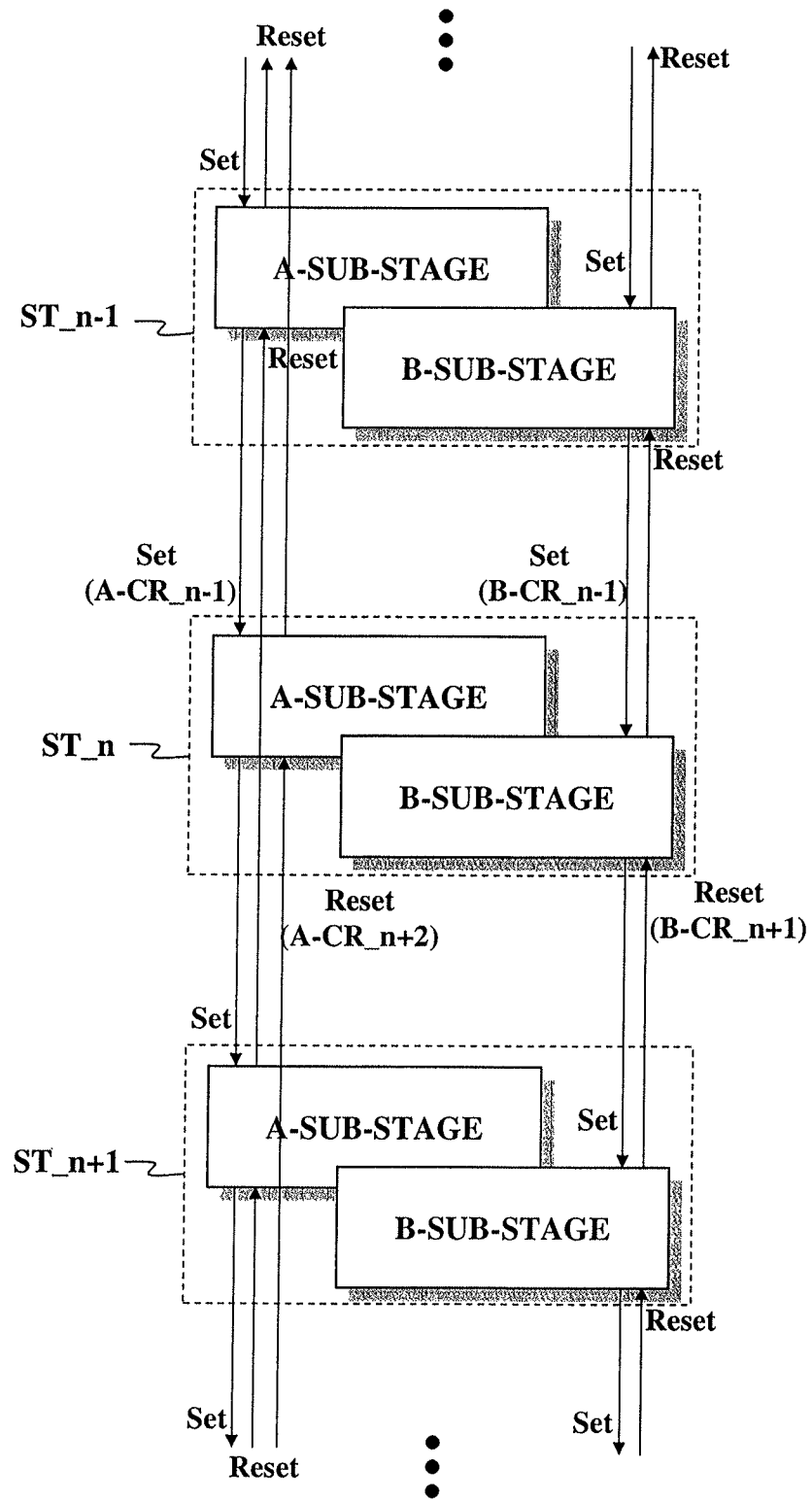
FIG. 3 is a block diagram illustrating an example of use of outputs from each stage in FIG. 1 as an A-control signal and a B-control signal.

FIG. 3 is a block diagram illustrating an example of use of outputs from each stage in FIG. 1 as an A-control signal and a B-control signal. Although not shown in FIG. 3, each stage of FIG. 3 includes the above scan output controller SOC therein.

The A-control signal may be divided into an A-set signal and an A-reset signal. The A-set signal is required to set the A-sub-stage A-Sub of a corresponding stage supplied with the A-set signal, and the A-reset signal is required to reset the A-sub-stage A-Sub of a corresponding stage supplied with the A-reset signal.

The A-set signal may be an output from any one of stages upstream of the current stage supplied with the A-set signal. That is, the A-sub-stage A-Sub of the nth stage ST_n (where n is a natural number) may receive, as the above A-set signal, an A-carry pulse output from the A-sub-stage A-Sub of an (n-p)th stage (where p is a natural number less than n). For example, the A-sub-stage A-Sub of the nth stage ST_n may receive, as the above A-set signal, an A-carry pulse A-CR_n−1 output from the A-sub-stage A-Sub of the (n−1)th stage ST_n−1, as shown in FIG. 3. Here, the upstream stages signify stages that operate earlier than the current stage.

In contrast, the A-reset signal may be an output from any one of stages downstream of the current stage supplied with the A-reset signal. That is, the A-sub-stage A-Sub of the nth stage ST_n may receive, as the above A-reset signal, an A-carry pulse output from the A-sub-stage A-Sub of an (n+q)th stage (where q is an arbitrary natural number or a natural number equal to p). For example, the A-sub-stage A-Sub of the nth stage ST_n may receive, as the above A-reset signal, an A-carry pulse A-CR_n+2 output from the A-sub-stage A-Sub of the (n+2)th stage ST_n+2, as shown in FIG. 3. Here, the downstream stages signify stages that operate later than the current stage.

Similarly, the B-control signal may be divided into a B-set signal and a B-reset signal. The B-set signal is required to set the B-sub-stage B-Sub of a corresponding stage supplied with the B-set signal, and the B-reset signal is required to reset the B-sub-stage B-Sub of a corresponding stage supplied with the B-reset signal.

The B-set signal may be an output from any one of stages upstream of the current stage supplied with the B-set signal. That is, the B-sub-stage B-Sub of the nth stage ST_n (where n is a natural number) may receive, as the above B-set signal, a B-carry pulse output from the B-sub-stage B-Sub of an (n-r)th stage (where r is a natural number less than n or equal to p). For example, the B-sub-stage B-Sub of the nth stage ST_n may receive, as the above B-set signal, a B-carry pulse B-CR_n−1 output from the B-sub-stage B-Sub of the (n−1)th stage ST_n−1, as shown in FIG. 3.

In contrast, the B-reset signal may be an output from any one of stages downstream of the current stage supplied with the B-reset signal. That is, the B-sub-stage B-Sub of the nth stage ST_n may receive, as the above B-reset signal, a B-carry pulse output from the B-sub-stage B-Sub of an (n+s)th stage (where s is an arbitrary natural number or a natural number equal to r). For example, the B-sub-stage B-Sub of the nth stage ST_n may receive, as the above B-reset signal, a B-carry pulse B-CR_n+1 output from the B-sub-stage B-Sub of the (n+1)th stage ST_n+1, as shown in FIG. 3.

In this manner, the A-sub-stages A-Sub are interconnected to constitute one shift register that sequentially outputs A-scan pulses A-SC, and the B-sub-stages B-Sub are interconnected to constitute another shift register that sequentially outputs B-scan pulses B-SC.

Figure 4:
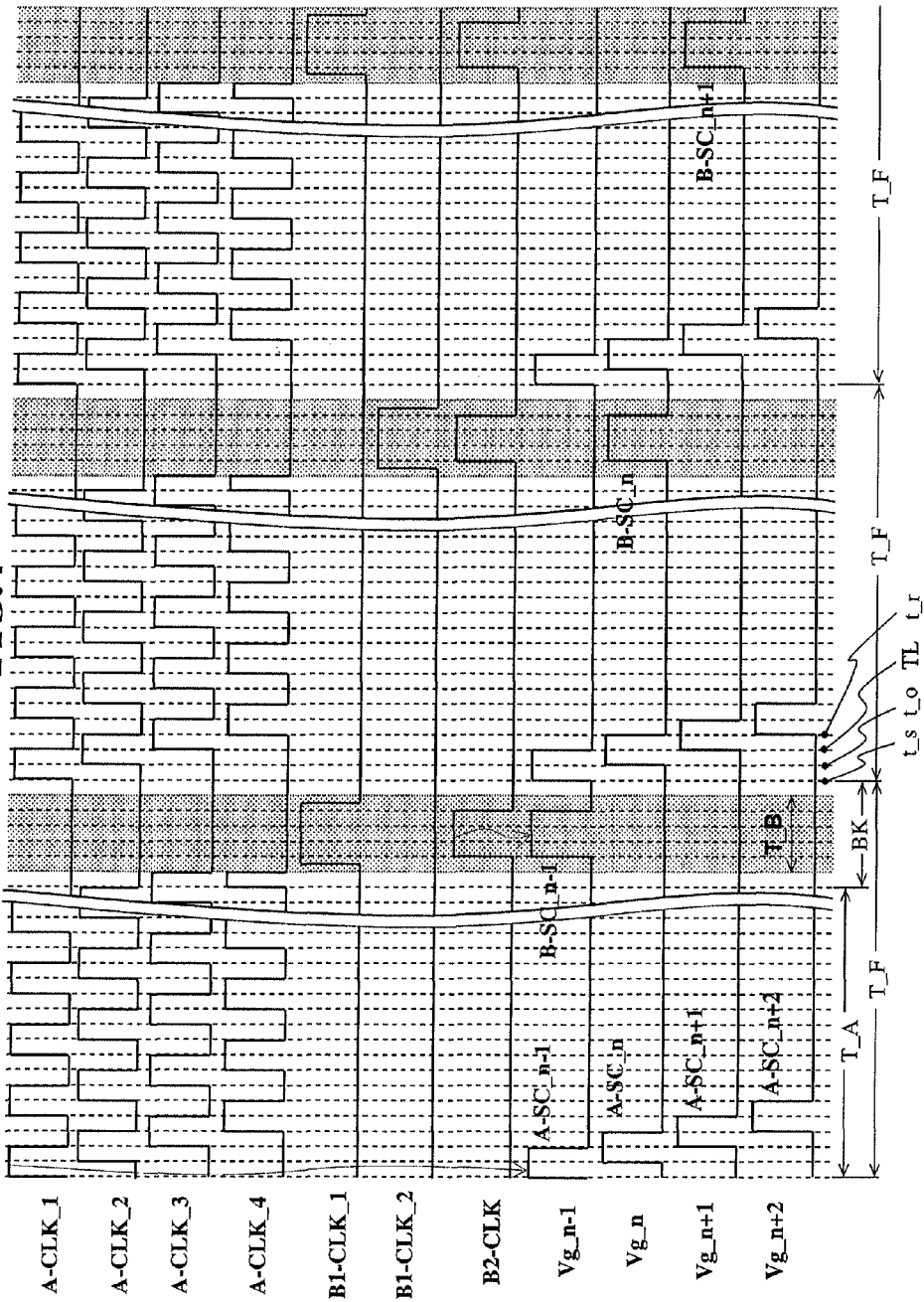
FIG. 4 is a timing diagram illustrating an example of an A-clock pulse, a B1-clock pulse and a B2-clock pulse, and scan pulses generated thereby.

FIG. 4 is a timing diagram illustrating an example of an A-clock pulse A-CLK, a B1-clock pulse B1-CLK and a B2-clock pulse B2-CLK, and scan pulses generated thereby.

As shown in FIG. 4, the A-clock pulse A-CLK may be composed of clock pulses A-CLK_1 to A-CLK_4 of four phases, the B1-clock pulse B1-CLK may be composed of clock pulses B1-CLK_1 and B1-CLK_2 of two phases, and the B2-clock pulse B2-CLK may be composed of a clock pulse B2-CLK of one phase.

The A-clock pulse A-CLK may include first to fourth A-clock pulses A-CLK_1 to A-CLK_4 having different phases and the same pulse widths. Here, the pulse widths of adjacent ones of the first to fourth A-clock pulses A-CLK_1 to A-CLK_4 may partially overlap with each other. FIG. 4 shows an example in which the respective pulse widths of the adjacent A-clock pulses A-CLK overlap with each other by ½. It should be noted that this example is nothing but one example and the overlap size is changeable to any value. Also, the A-clock pulses A-CLK may be output without overlap in their pulse widths.

When the A-clock pulses A-CLK_1 to A-CLK_4 are output without overlap in their pulse widths, an A-carry pulse from the A-sub-stage A-Sub of the (n+1)th stage ST_n+1, not the above (n+2)th stage ST_n+2, may be used to reset the A-sub-stage A-Sub of the nth stage ST_n.

The A-clock pulse A-CLK is used as an A-scan pulse A-SC and an A-carry pulse A-CR. For example, when the A-clock pulses A-CLK_1 to A-CLK_4 of four phases are used as shown in FIG. 4, a (4x+1)th stage (where x is a natural number including 0) may receive the first A-clock pulse A-CLK_1 and output a (4x+1)th A-scan pulse A-SC and a (4x+1)th A-carry pulse A-CR, a (4x+2)th stage may receive the second A-clock pulse A-CLK_2 and output a (4x+2)th A-scan pulse A-SC and a (4x+2)th A-carry pulse A-CR, a (4x+3)th stage may receive the third A-clock pulse A-CLK_3 and output a (4x+3)th A-scan pulse A-SC and a (4x+3)th A-carry pulse A-CR, and a (4x+4)th stage may receive the fourth A-clock pulse A-CLK_4 and output a (4x+4)th A-scan pulse A-SC and a (4x+4)th A-carry pulse A-CR.

The B1-clock pulse B1-CLK may include first and second B1-clock pulses B1-CLK_1 and B1-CLK_2 having different phases.

Each of the first and second B1-clock pulses B1-CLK_1 and B1-CLK_2 controls output timing of a B-scan pulse B-SC and is used as a B-carry pulse B-CR. For example, when the B1-clock pulses B1-CLK_1 and B1-CLK_2 of two phases are used as shown in FIG. 4, the B-sub-stage B-Sub of an odd-numbered stage may receive the first B1-clock pulse B1-CLK_1 and determine output timings of a B-carry pulse B-CR and a B-scan pulse B-SC based on the first B1-clock pulse B1-CLK_1, and the B-sub-stage B-Sub of an even-numbered stage may receive the second B1-clock pulse B1-CLK_2 and determine output timings of a B-carry pulse B-CR and a B-scan pulse B-SC based on the second B1-clock pulse B1-CLK_2.

Also, the B-sub-stage B-Sub of the odd-numbered stage may receive the first B1-clock pulse B1-CLK_1 and output an odd-numbered B-carry pulse B-CR, and the B-sub-stage B-Sub of the even-numbered stage may receive the second B1-clock pulse B1-CLK_2 and output an even-numbered B-carry pulse B-CR.

Each of the first and second B1-clock pulses B1-CLK_1 and B1-CLK_2 is output in an end period of a corresponding frame period (a period subsequent to a last horizontal period in each frame period, which will hereinafter be referred to as a B-output period T_B), as stated previously. In this regard, the B-carry pulse B-CR and the B-scan pulse B-SC are also output in every B-output period TB. Here, the first B1-clock pulse B1-CLK_1 may be output in every odd-numbered frame period, and the second B1-clock pulse B1-CLK_2 may be output in every even-numbered frame period.

On the other hand, FIG. 4 shows three frame periods, each of which includes, at the end thereof, a blank period BK in which various signals necessary for the next frame period are set. Exceptionally, a data signal required for display of an image is not included in the various signals. That is, this data signal is not generated in the blank period BK.

The above B-output period TB is included in the blank period BK. That is, the first B1-clock pulse B1-CLK_1, the second B1-clock pulse B1-CLK_2, the B-carry pulse B-CR and the B-scan pulse B-SC are generated in the blank period BK.

The B2-clock pulse B2-CLK is used as a B-scan pulse B-SC. This B2-clock pulse B2-CLK is output synchronously with the first and second B1-clock pulses B1-CLK_1 and B1-CLK_2. In other words, the B2-clock pulse B2-CLK is output in the B-output period T_B of every frame period, too. Exceptionally, the B2-clock pulse B2-CLK has a narrower pulse width than that of the B1-clock pulse B1-CLK such that it is completely surrounded by the B1-clock pulse B1-CLK. That is, as shown in FIG. 4, the B1-clock pulse B1-CLK_1 or B1-CLK_2 has a rising edge, which is ahead of that of the B2-clock pulse B2-CLK and a falling edge which is behind that of the B2-clock pulse B2-CLK. As a result, the B2-clock pulse B2-CLK can be securely kept high while the B1-clock pulse B1—CLK_1 or B1-CLK_2 is kept high.

On the other hand, the pulse width of the B2-clock pulse B2-CLK may be equal to that of the B1-clock pulse B1—CLK. In this case, the rising edges of the respective clock pulses may coincide with each other and the falling edges thereof may coincide with each other.

Alternatively, the B2-clock pulse B2-CLK may be of two or more phases, not the single phase. For example, the B2-clock pulse B2-CLK may also be of two phases like the B1-clock pulse B1-CLK. As a detailed example, the first B2-clock pulse may be set to be synchronized with the first B1-clock pulse B1-CLK_1, and the second B2-clock pulse may be set to be synchronized with the second B1-clock pulse B1-CLK_2. In this case, the pulse width of the B2-clock pulse B2-CLK must be smaller than or equal to that of the B1-clock pulse B1-CLK_1 or B1-CLK_2. Also, the timing between the B2-clock pulse B2-CLK and the B1-clock pulse B1-CLK conforms to the above conditions.

On the other hand, each of the A-clock pulses A-CLK_1 to A-CLK_4 has a pulse width smaller than that of the B2-clock pulse B2-CLK.

A-scan pulses A-SC_n−1 to A-SC_n+2 are generated based on the A-clock pulses A-CLK_1 to A-CLK_4. Accordingly, the pulse widths of adjacent ones of the A-scan pulses A-SC_n−1 to A-SC_n+2 partially overlap with each other, as shown in FIG. 4. The A-scan pulses A-SC_n−1 to A-SC_n+2 are sequentially output once for one frame period.

B-scan pulses B-SC_n−1 to B-SC_n+1 are generated based on the B2-clock pulse B2-CLK. Accordingly, each of the B-scan pulses B-SC_n−1 to B-SC_n+1 has the same shape as that of the B2-clock pulse B2-CLK and is output with the same timing as that of the B2-clock pulse B2-CLK, as shown in FIG. 4. Each of the B-scan pulses B-SC_n−1 to B-SC_n+1 is output once in one frame period. In this regard, the B-scan pulses B-SC_n−1 to B-SC_n+1 are changed in output position on a frame period basis. For example, as shown in FIG. 4, the B-scan pulse B-SC_n−1 may be output from the (n−1)th B-sub stage B-Sub in the leftmost, first frame period, the B-scan pulse B-SC_n may be output from the nth B-sub stage B-Sub in the second frame period positioned at the right-hand side of the first frame period, and the B-scan pulse B-SC_n+1 may be output from the (n+1)th B-sub stage B-Sub in the third frame period positioned at the right-hand side of the second frame period.

Because the B-scan pulses B-SC_n−1 to B-SC_n+1 are changed in output position on a frame period basis in this manner, the distance between a pair of A-scan pulse A-SC and B-scan pulse B-SC output to the same gate line in one frame period is gradually reduced as shown in FIG. 4.

On the other hand, when a period of one frame period T_F in which the first to fourth A-clock pulses A-CLK_1 to A-CLK_4 are output is defined as an A-output period T_A and the remaining period of the one frame period T_F is defined as the B-output period T_B as stated previously, all of the first to fourth A-clock pulses A-CLK_1 to A-CLK_4 may be kept low in the B-output period T_B of the one frame period T_F, as shown in FIG. 4. Alternatively, in this B-output period T_B, the first to fourth A-clock pulses A-CLK_1 to A-CLK_4 may be output in the same manner as in the A-output period T_A.

Figure 5:
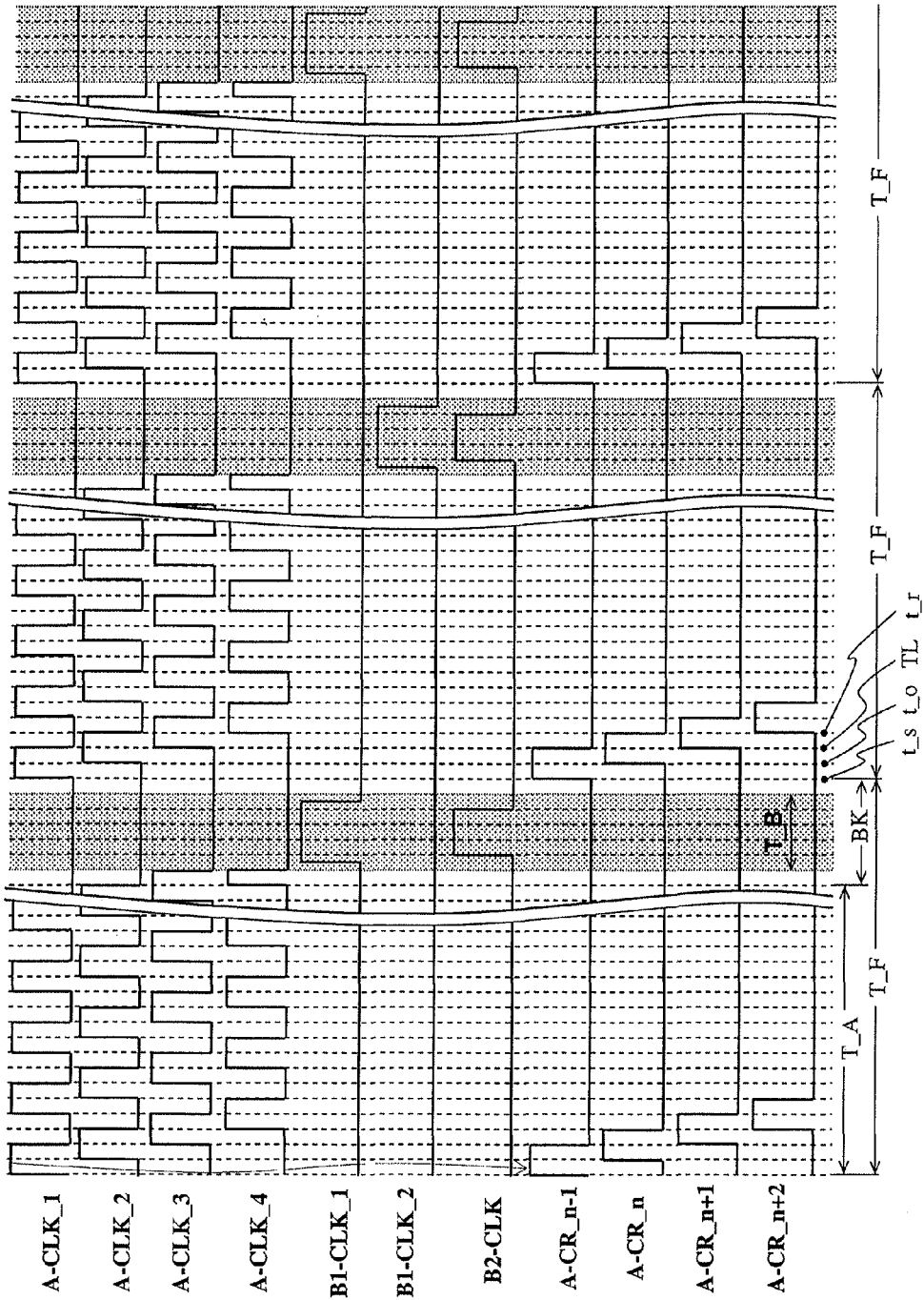
FIG. 5 is a timing diagram illustrating an example of the A-clock pulse, B1-clock pulse and B2-clock pulse, and A-carry pulses generated thereby.

FIG. 5 is a timing diagram illustrating an example of the A-clock pulse A-CLK, B1-clock pulse B1-CLK and B2-clock pulse B2-CLK, and A-carry pulses generated thereby.

A-carry pulses A-CR_n−1 to A-CR_n+2 are generated based on the A-clock pulses A-CLK_1 to A-CLK_4. Accordingly, the pulse widths of adjacent ones of the A-carry pulses A-CR_n−1 to A-CR_n+2 partially overlap with each other, as shown in FIG. 5. The A-carry pulses A-CR_n−1 to A-CR_n+2 are sequentially output once for one frame period. Here, the A-carry pulses A-CR_n−1 to A-CR_n+2 are substantially the same as the A-scan pulses A-SC_n−1 to A-SC_n+2.

Figure 6:
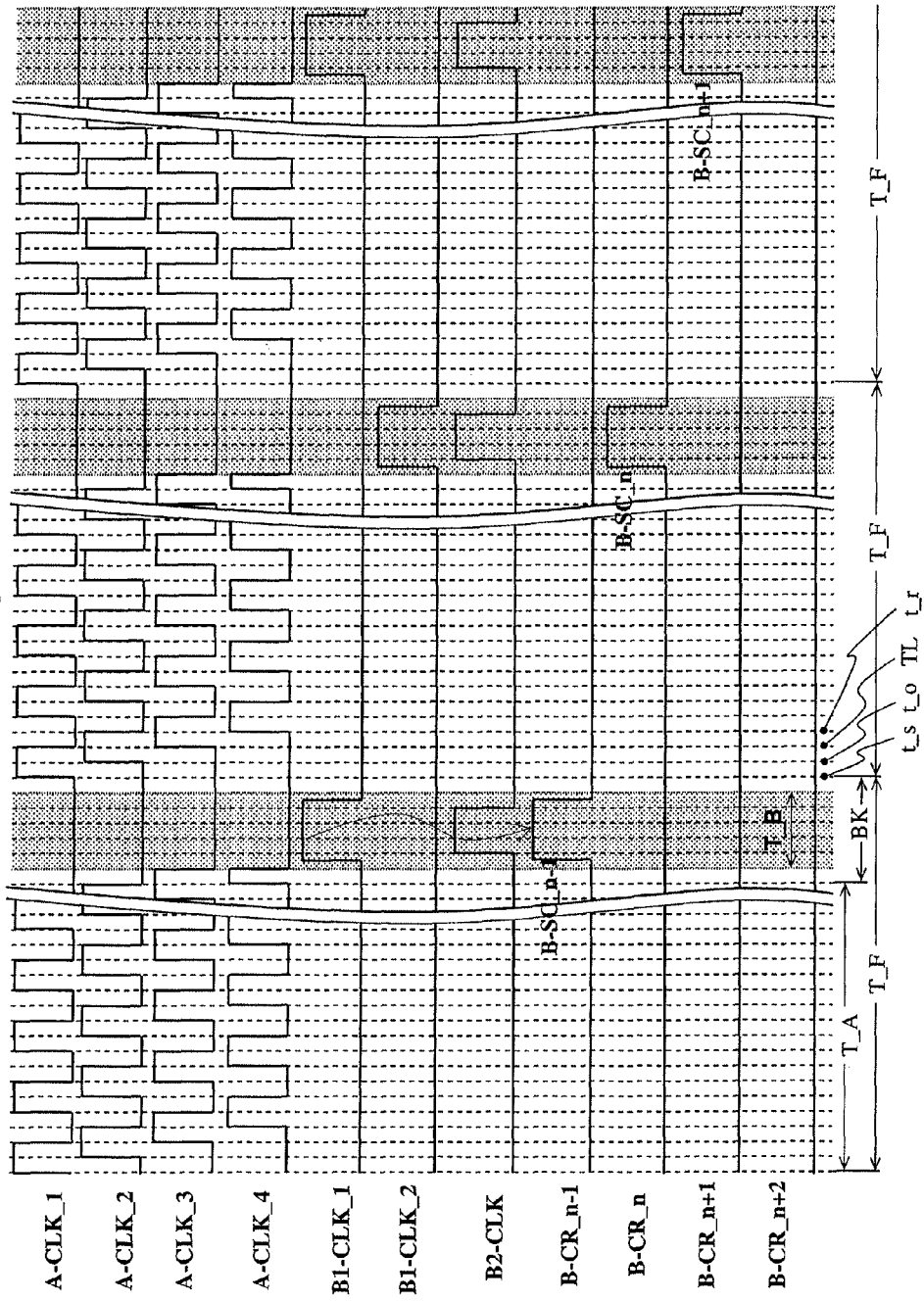
FIG. 6 is a timing diagram illustrating an example of the A-clock pulse, B1-clock pulse and B2-clock pulse, and B-carry pulses generated thereby.

FIG. 6 is a timing diagram illustrating an example of the A-clock pulse A-CLK, B1-clock pulse B1-CLK and B2-clock pulse B2-CLK, and B-carry pulses generated thereby.

B-carry pulses B-CR_n−1 to B-CR_n+2 are generated based on the B1-clock pulses B1-CLK_1 and B1-CLK_2. Accordingly, each of the B-carry pulses B-CR_n−1 to B-CR_n+2 has the same shape as that of a corresponding one of the B1-clock pulses B1-CLK_1 and B1-CLK_2 and is output with the same timing as that of the corresponding B1-clock pulse, as shown in FIG. 6. Each of the B-carry pulses B-CR_n−1 to B-CR_n+2 is output once in one frame period. In this regard, the B-carry pulses B-CR_n−1 to B-CR_n+2 are changed in output position on a frame period basis. For example, as shown in FIG. 6, the B-carry pulse B-CR_n−1 may be output from the (n−1)th B-sub stage B-Sub in the leftmost, first frame period T_F, the B-carry pulse B-CR_n may be output from the nth B-sub stage B-Sub in the second frame period T_F positioned at the right-hand side of the first frame period, and the B-carry pulse B-CR_n+1 may be output from the (n+1)th B-sub stage B-Sub in the third frame period T_F positioned at the right-hand side of the second frame period. Here, the B-carry pulses B-CR_n−1 to B-CR_n+2 are synchronized with the B-scan pulses B-SC_n−1 to B-SC_n+2.

On the other hand, in FIGS. 4 to 6, the A-clock pulse A-CLK may be of a phases, the B1-clock pulse B1-CLK may be of a*b phases, and the B2-clock pulse B2-CLK may be of a*c phases. Here, a is a natural number greater than 1, a*b is a natural number greater than 1, and a*c is a natural number equal to or greater than 1.

The period of the B2-clock pulse B2-CLK is a*c times the output generation period of the B-sub-stage B-Sub. For several examples, the respective clock pulses may be of:

1) A-clock pulse A-CLK: 4 phases, B1-clock pulse B1-CLK: 2 phases, and B2-clock pulse B2-CLK: 1 phase;

2) A-clock pulse A-CLK: 4 phases, B1-clock pulse B1-CLK: 2 phases, and B2-clock pulse B2-CLK: 2 phases (or 4 phases); or 3) A-clock pulse A-CLK: 6 phases, B1-clock pulse B1-CLK: 2 phases, and B2-clock pulse B2-CLK: 2 phases (or 4 phases).

In this manner, the scan output controller SOC according to the present invention generates a desired scan pulse (including an A-scan pulse A-SC and a B-scan pulse B-SC) using the A-clock pulse A-CLK, the B1-clock pulse B1-CLK and the B2-clock pulse B2-CLK. Therefore, output switching devices formed in the scan output controller SOC do not need to be large in size, and the voltage of the scan pulse is also prevented from being attenuated.

Hereinafter, the configuration of the scan output controller SOC according to the present invention will be described in detail.

First Embodiment of Scan Output Controller SOC

Figure 7:
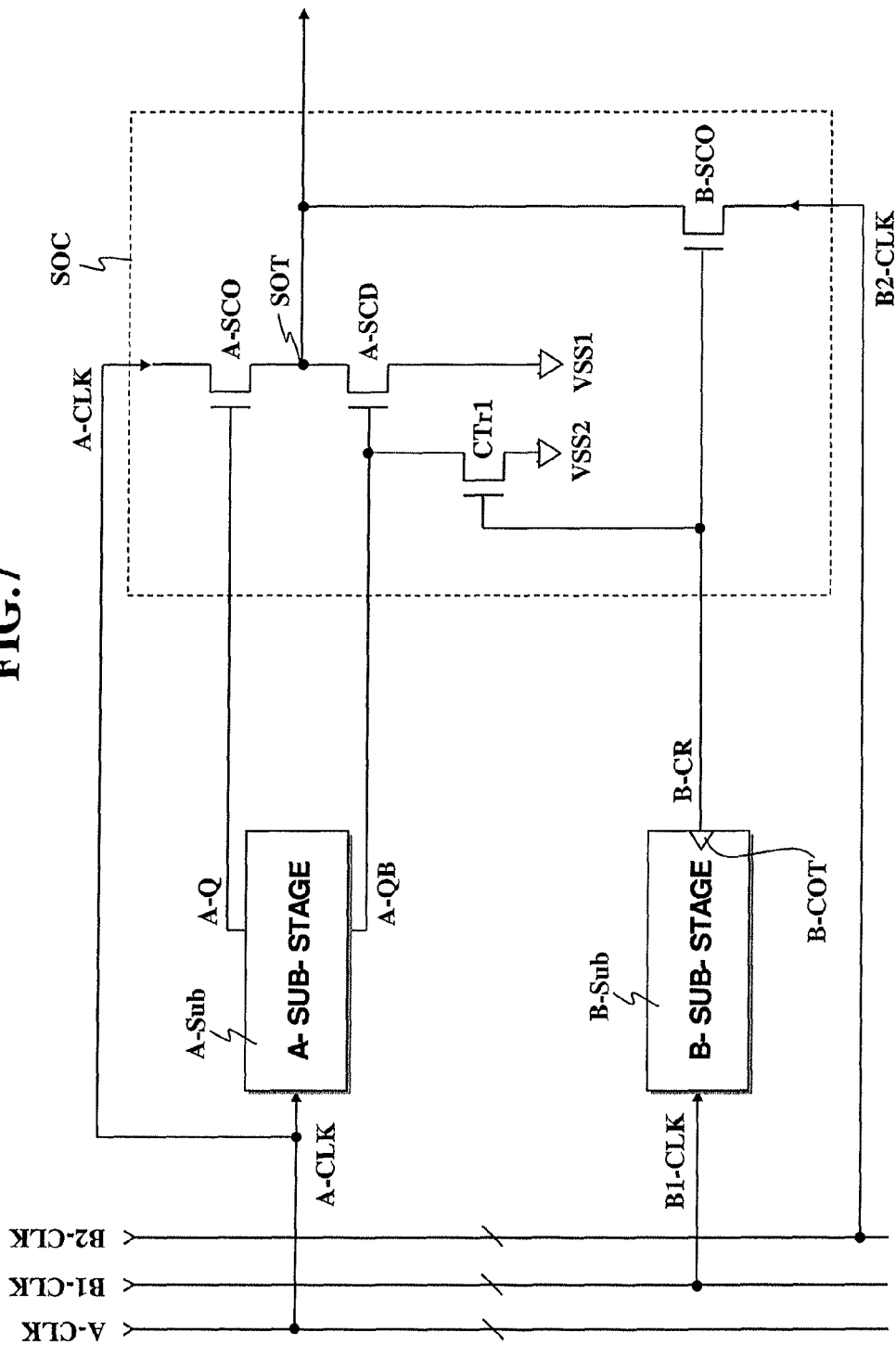
FIG. 7 is a circuit diagram of a first embodiment of a scan output controller according to the present invention.

FIG. 7 is a circuit diagram of a first embodiment of the scan output controller SOC according to the present invention.

The scan output controller SOC according to the first embodiment includes an A-scan output switching device A-SCO, a B-scan output switching device B-SCO, an A-scan discharging switching device A-SCD, and a first control switching device CTr1, as shown in FIG. 7.

The A-scan output switching device A-SCO is controlled by a voltage at an A-set node A-Q and is connected between an A-clock transfer line and a scan output terminal SOT of a corresponding stage. That is, the A-scan output switching device A-SCO is turned on or off in response to the voltage at the A-set node A-Q, and interconnects the A-clock transfer line and the scan output terminal SOT of the corresponding stage when turned on. Here, the A-clock transfer line is supplied with an A-clock pulse A-CLK.

The B-scan output switching device B-SCO is controlled by a B-carry pulse B-CR from a B-sub-stage B-Sub and is connected between the scan output terminal SOT and a B2-clock transfer line. That is, the B-scan output switching device B-SCO is turned on or off in response to the B-carry pulse B-CR, and interconnects the scan output terminal SOT and the B2-clock transfer line when turned on. Here, the B2-clock transfer line is supplied with a B2-clock pulse B2-CLK.

The A-scan discharging switching device A-SCD is controlled by a voltage at an A-reset node A-QB and is connected between the scan output terminal SOT and a first discharging voltage line. That is, the A-scan discharging switching device A-SCD is turned on or off in response to the voltage at the A-reset node A-QB, and interconnects the scan output terminal SOT and the first discharging voltage line when turned on. Here, the first discharging voltage line is supplied with a first discharging voltage VSS1.

The first control switching device CTr1 is controlled by the B-carry pulse B-CR and is connected between the A-reset node A-QB and a second discharging voltage line. That is, the first control switching device CTr1 is turned on or off in response to the B-carry pulse B-CR, and interconnects the A-reset node A-QB and the second discharging voltage line when turned on. Here, the second discharging voltage line is supplied with a second discharging voltage VSS2.

This first control switching device CTr1 acts to make the A-reset node A-QB discharged (namely, low) irrespective of an output from an A-inverter to be described later in detail.

On the other hand, the B-carry pulse B-CR is provided from the B-sub-stage B-Sub through a B-carry output terminal B-COT of the B-sub-stage B-Sub.

Second Embodiment of Scan Output Controller SOC

Figure 8:
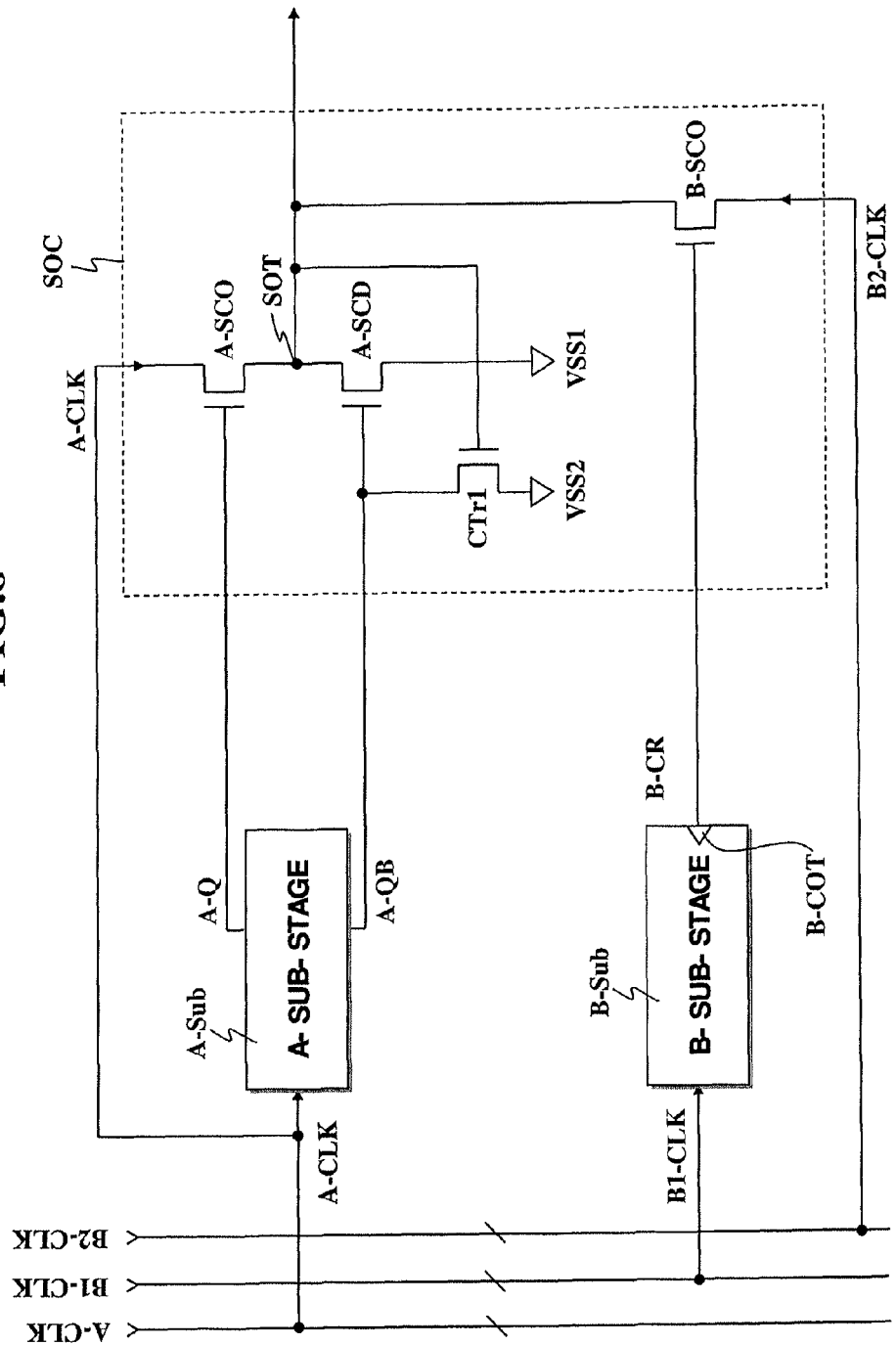
FIG. 8 is a circuit diagram of a second embodiment of the scan output controller according to the present invention.

FIG. 8 is a circuit diagram of a second embodiment of the scan output controller SOC according to the present invention.

The scan output controller SOC according to the second embodiment includes an A-scan output switching device A-SCO, a B-scan output switching device B-SCO, an A-scan discharging switching device A-SCD, and a first control switching device CTr1, as shown in FIG. 8.

The A-scan output switching device A-SCO, B-scan output switching device B-SCO and A-scan discharging switching device A-SCD in the second embodiment are the same as those in the first embodiment, stated above, respectively, and a description thereof will thus be replaced by the above description of the first embodiment.

The first control switching device CTr1 in the second embodiment is controlled by a voltage at the scan output terminal SOT and is connected between the A-reset node A-QB and a second discharging voltage line. That is, the first control switching device CTr1 is turned on or off in response to the voltage at the scan output terminal SOT, and interconnects the A-reset node A-QB and the second discharging voltage line when turned on. Here, the second discharging voltage line is supplied with a second discharging voltage VSS2.

Third Embodiment of Scan Output Controller SOC

Figure 9:
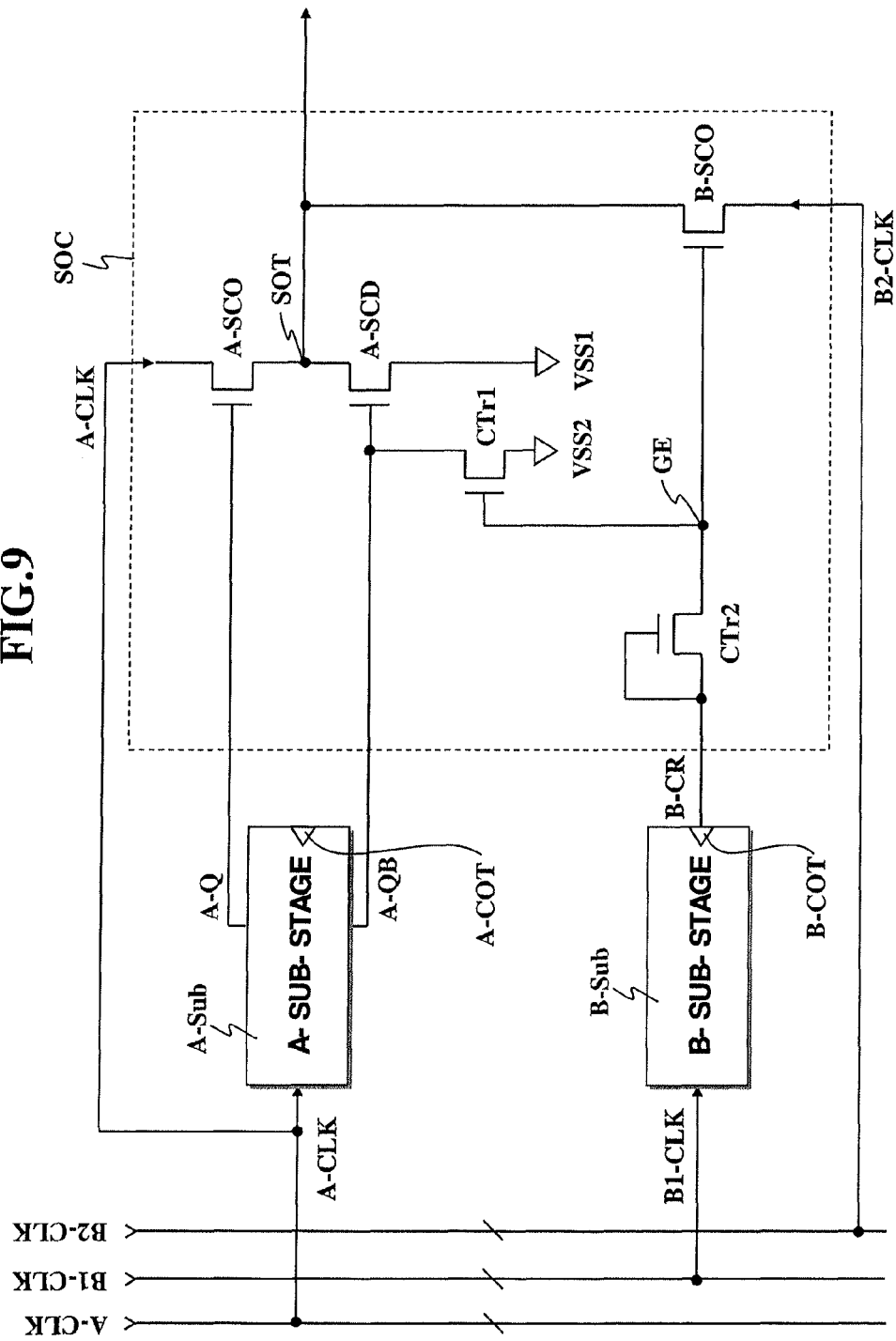
FIG. 9 is a circuit diagram of a third embodiment of the scan output controller according to the present invention.

FIG. 9 is a circuit diagram of a third embodiment of the scan output controller SOC according to the present invention.

The scan output controller SOC according to the third embodiment includes an A-scan output switching device A-SCO, a B-scan output switching device B-SCO, an A-scan discharging switching device A-SCD, a first control switching device CTr1, and a second control switching device CTr2, as shown in FIG. 9.

The A-scan output switching device A-SCO, B-scan output switching device B-SCO and A-scan discharging switching device A-SCD in the third embodiment are the same as those in the first embodiment, stated above, respectively, and a description thereof will thus be replaced by the above description of the first embodiment.

The first control switching device CTr1 in the third embodiment is controlled by a voltage applied to the gate electrode GE of the B-scan output switching device B-SCO and is connected between the A-reset node A-QB and a second discharging voltage line. That is, the first control switching device CTr1 is turned on or off in response to the voltage applied to the gate electrode GE of the B-scan output switching device B-SCO, and interconnects the A-reset node A-QB and the second discharging voltage line when turned on. Here, the second discharging voltage line is supplied with a second discharging voltage VSS2.

The second control switching device CTr2 in the third embodiment is controlled by the B-carry pulse B-CR from the B-sub-stage B-Sub and is connected between the B-carry output terminal B-COT of the B-sub-stage B-Sub and the gate electrode GE of the B-scan output switching device B-SCO. That is, the second control switching device CTr2 is turned on or off in response to the B-carry pulse B-CR, and interconnects the B-carry output terminal B-COT and the gate electrode GE of the B-scan output switching device B-SCO when turned on.

On the other hand, the signal (B-carry pulse B-CR) output from the B-carry output terminal B-COT or the voltage applied to the gate electrode GE of the B-scan output switching device B-SCO may be used as the above-stated B-set signal and B-reset signal.

Fourth Embodiment of Scan Output Controller SOC

Figure 10:
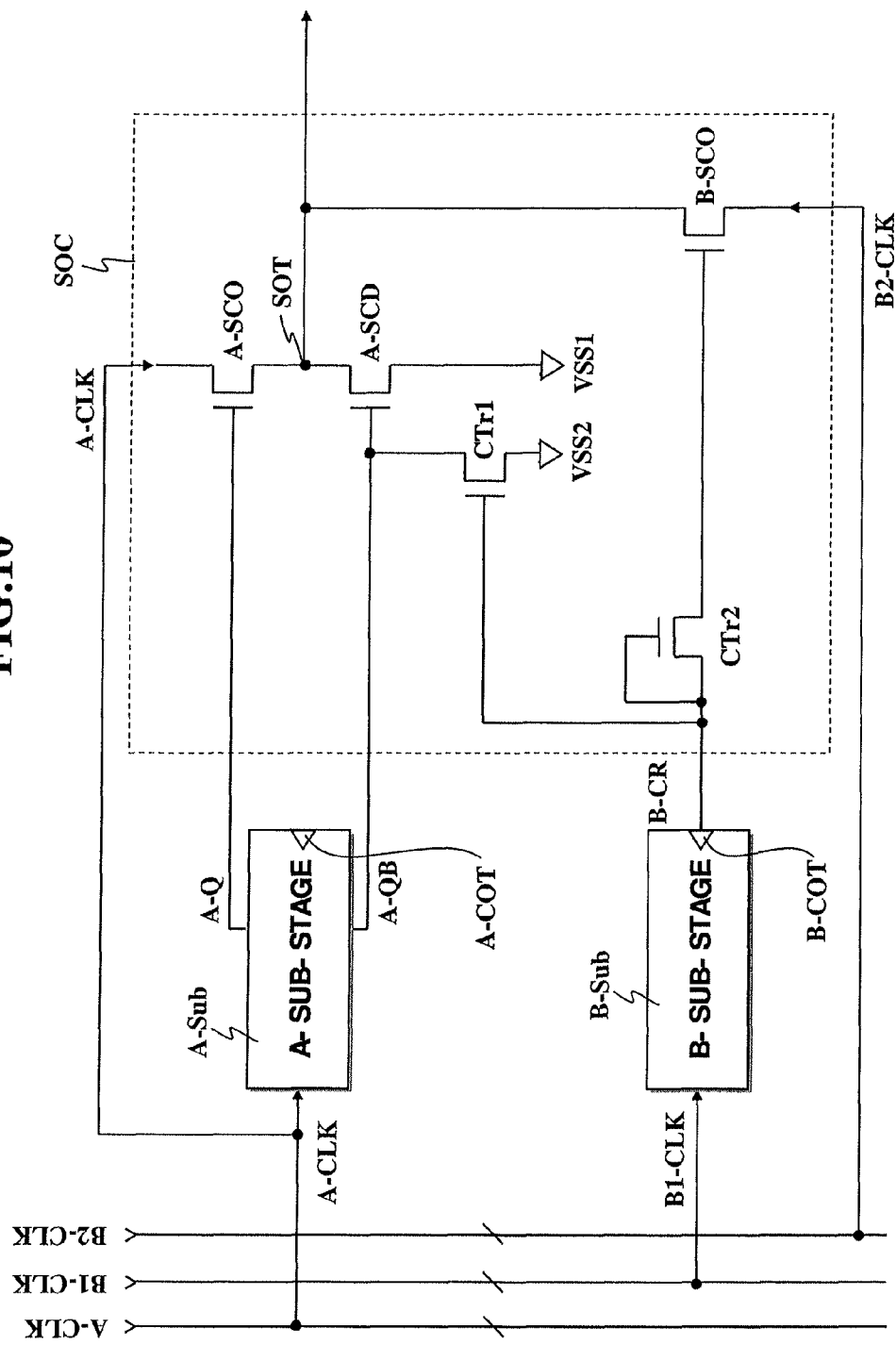
FIG. 10 is a circuit diagram of a fourth embodiment of the scan output controller according to the present invention.

FIG. 10 is a circuit diagram of a fourth embodiment of the scan output controller SOC according to the present invention.

The scan output controller SOC according to the fourth embodiment includes an A-scan output switching device A-SCO, a B-scan output switching device B-SCO, an A-scan discharging switching device A-SCD, a first control switching device CTr1, and a second control switching device CTr2, as shown in FIG. 10.

The A-scan output switching device A-SCO, B-scan output switching device B-SCO, A-scan discharging switching device A-SCD and first control switching device CTr1 in the fourth embodiment are the same as those in the first embodiment, stated above, respectively, and a description thereof will thus be replaced by the above description of the first embodiment.

Also, the second control switching device CTr2 in the fourth embodiment is the same as that in the third embodiment, stated above, and a description thereof will thus be replaced by the above description of the third embodiment.

On the other hand, the signal (B-carry pulse B-CR) output from the B-carry output terminal B-COT or the voltage applied to the gate electrode of the B-scan output switching device B-SCO may be used as the above-stated B-set signal and B-reset signal.

On the other hand, the gate electrode of the first control switching device CTr1 may be connected to the gate electrode of the B-scan output switching device B-SCO instead of the B-carry output terminal B-COT.

Fifth Embodiment of Scan Output Controller SOC

Figure 11:
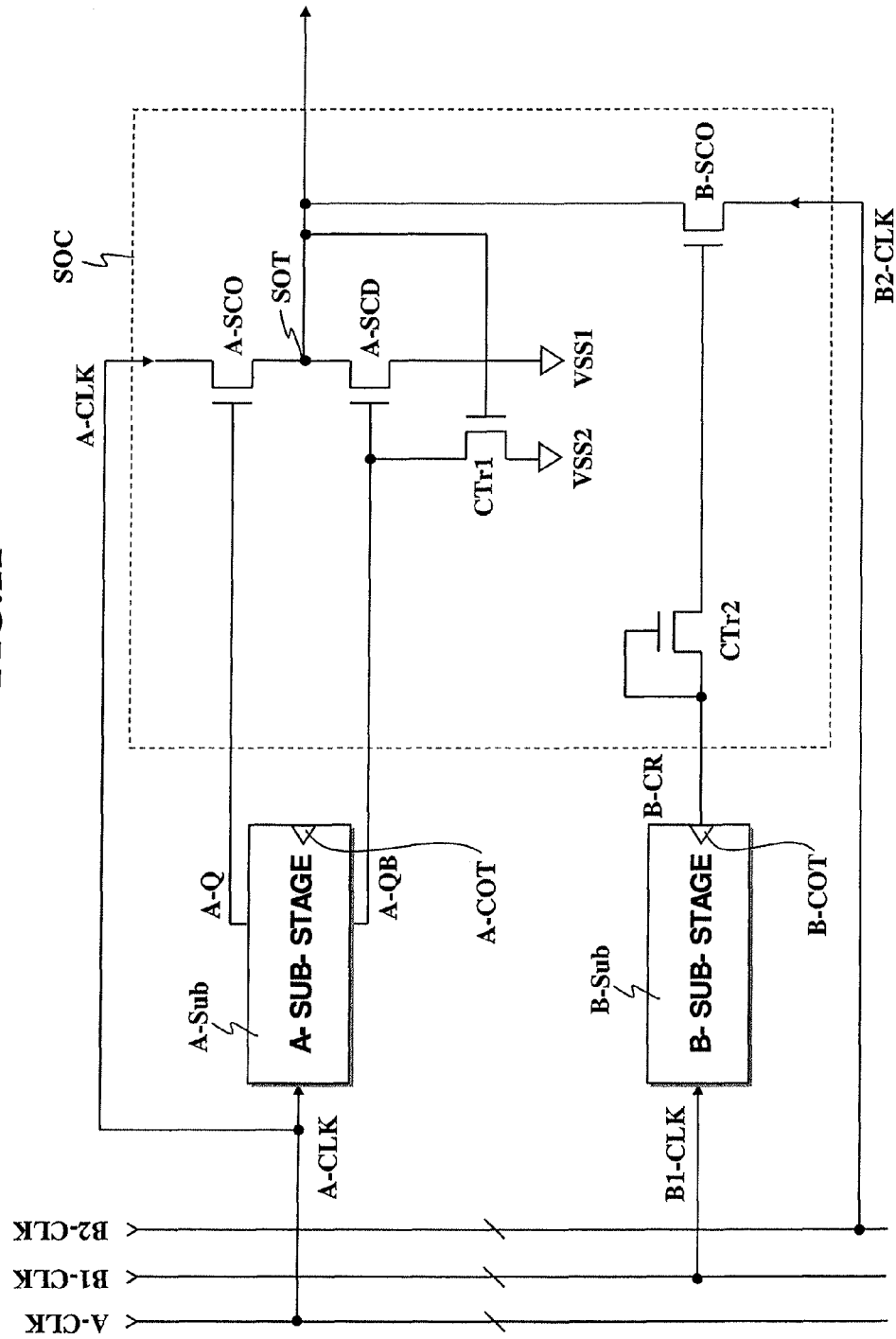
FIG. 11 is a circuit diagram of a fifth embodiment of the scan output controller according to the present invention.

FIG. 11 is a circuit diagram of a fifth embodiment of the scan output controller SOC according to the present invention.

The scan output controller SOC according to the fifth embodiment includes an A-scan output switching device A-SCO, a B-scan output switching device B-SCO, an A-scan discharging switching device A-SCD, a first control switching device CTr1, and a second control switching device CTr2, as shown in FIG. 11.

The A-scan output switching device A-SCO, B-scan output switching device B-SCO and A-scan discharging switching device A-SCD in the fifth embodiment are the same as those in the first embodiment, stated above, respectively, and a description thereof will thus be replaced by the above description of the first embodiment.

The first control switching device CTr1 in the fifth embodiment is the same as that in the second embodiment, stated above, and a description thereof will thus be replaced by the above description of the second embodiment.

Also, the second control switching device CTr2 in the fifth embodiment is the same as that in the third embodiment, stated above, and a description thereof will thus be replaced by the above description of the third embodiment.

On the other hand, the signal (B-carry pulse B-CR) output from the B-carry output terminal B-COT or the voltage applied to the gate electrode of the B-scan output switching device B-SCO may be used as the above-stated B-set signal and B-reset signal.

Sixth Embodiment of Scan Output Controller SOC

Figure 12:
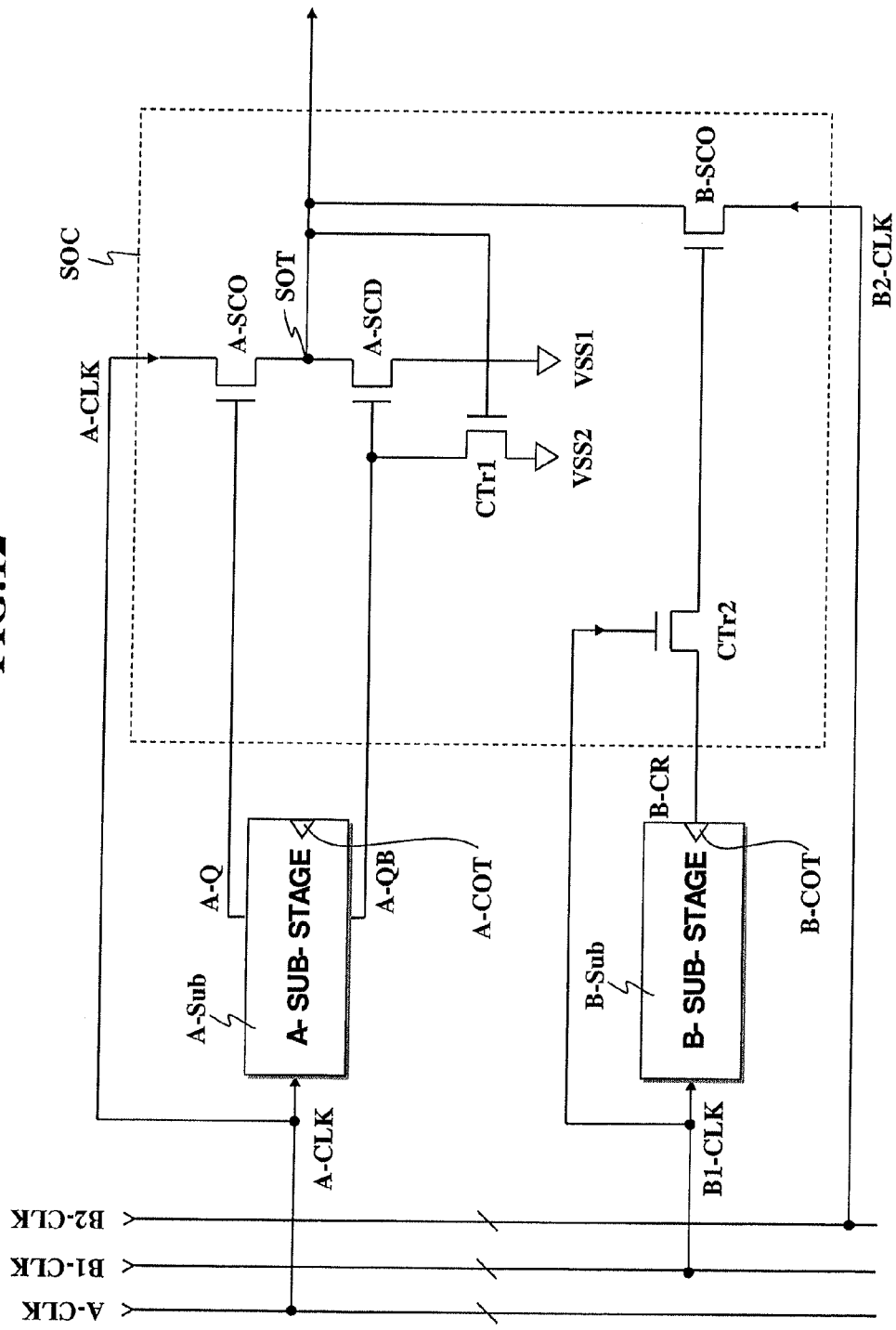
FIG. 12 is a circuit diagram of a sixth embodiment of the scan output controller according to the present invention.

FIG. 12 is a circuit diagram of a sixth embodiment of the scan output controller SOC according to the present invention.

The scan output controller SOC according to the sixth embodiment includes an A-scan output switching device A-SCO, a B-scan output switching device B-SCO, an A-scan discharging switching device A-SCD, a first control switching device CTr1, and a second control switching device CTr2, as shown in FIG. 12.

The A-scan output switching device A-SCO, B-scan output switching device B-SCO and A-scan discharging switching device A-SCD in the sixth embodiment are the same as those in the first embodiment, stated above, respectively, and a description thereof will thus be replaced by the above description of the first embodiment.

The first control switching device CTr1 in the sixth embodiment is the same as that in the second embodiment, stated above, and a description thereof will thus be replaced by the above description of the second embodiment.

The second control switching device CTr2 in the sixth embodiment is controlled by a B1-clock pulse B1-CLK from a B1-clock transfer line and is connected between the B-carry output terminal B-COT of the B-sub-stage B-Sub and the gate electrode of the B-scan output switching device B-SCO. That is, the second control switching device CTr2 is turned on or off in response to the B1-clock pulse B1-CLK, and interconnects the B-carry output terminal B-COT and the gate electrode of the B-scan output switching device B-SCO when turned on.

On the other hand, the signal (B-carry pulse B-CR) output from the B-carry output terminal B-COT or the voltage applied to the gate electrode of the B-scan output switching device B-SCO may be used as the above-stated B-set signal and B-reset signal.

On the other hand, the gate electrode of the first control switching device CTr1 may be connected to the gate electrode of the B-scan output switching device B-SCO or the B-carry output terminal B-COT instead of the scan output terminal SOT.

Seventh Embodiment of Scan Output Controller SOC

Figure 13:
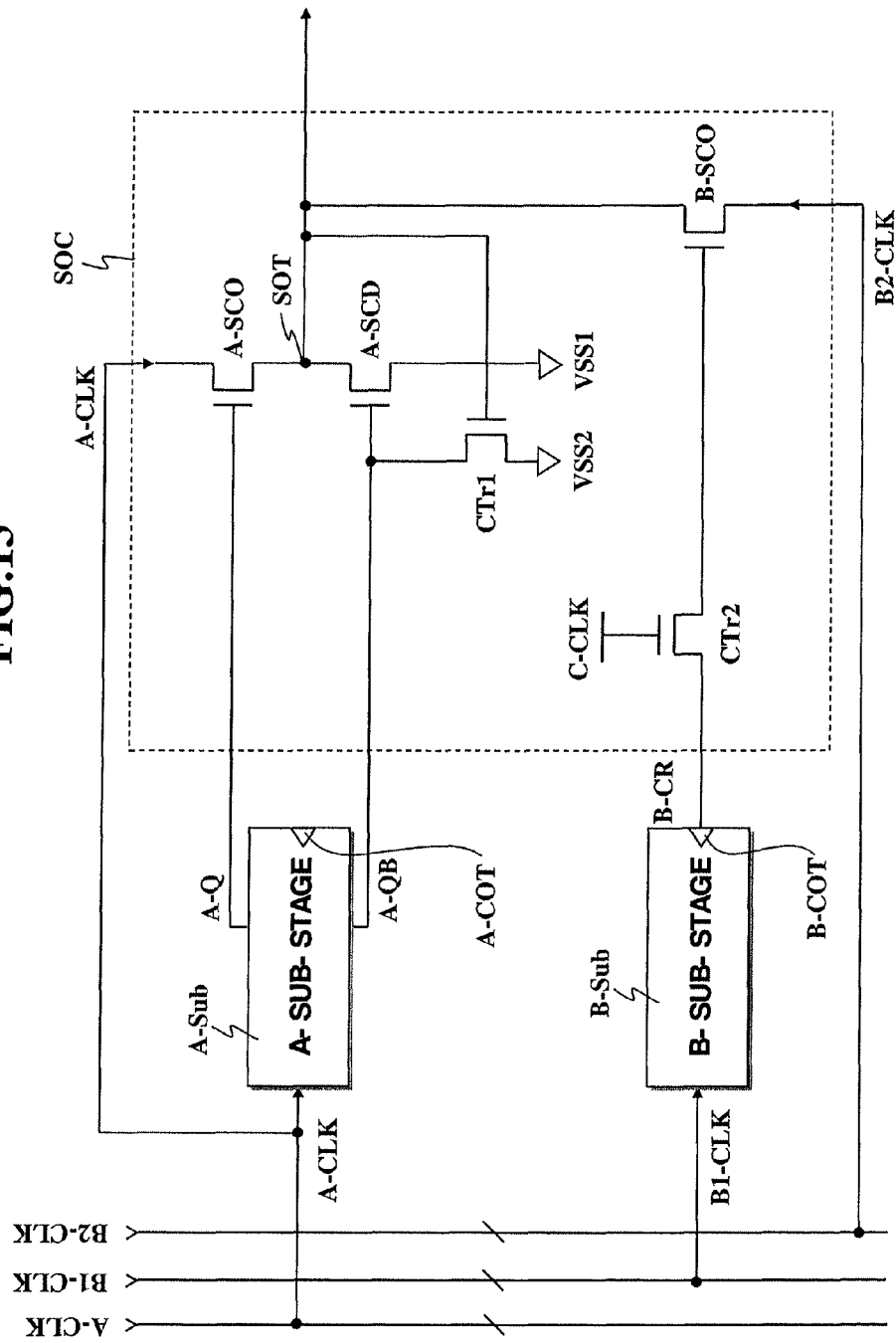
FIG. 13 is a circuit diagram of a seventh embodiment of the scan output controller according to the present invention.
Figure 14:
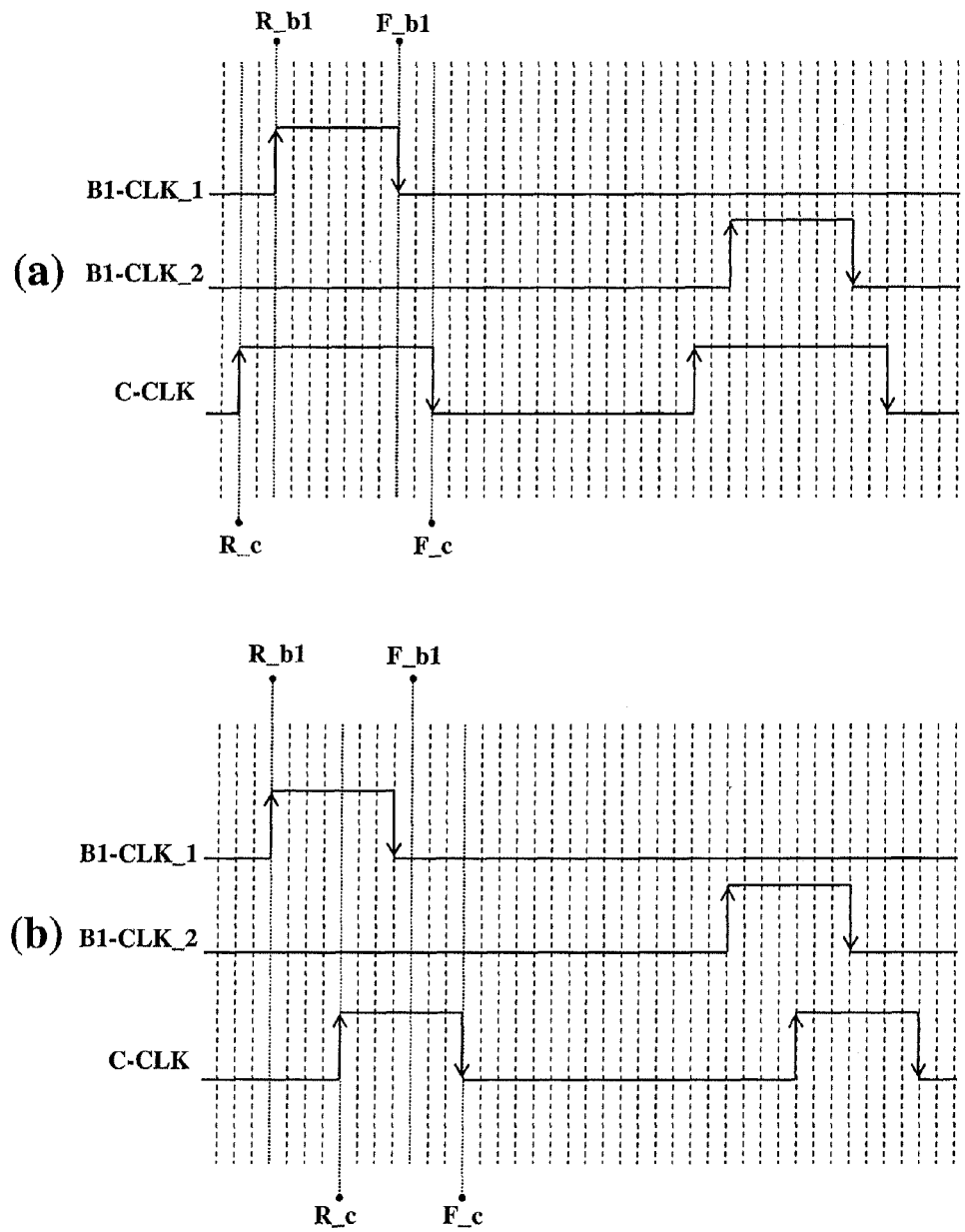
FIG. 14 is a timing diagram illustrating a C-clock pulse in FIG. 13.

FIG. 13 is a circuit diagram of a seventh embodiment of the scan output controller SOC according to the present invention, and FIG. 14 is a timing diagram illustrating a C-clock pulse C-CLK in FIG. 13.

The scan output controller SOC according to the seventh embodiment includes an A-scan output switching device A-SCO, a B-scan output switching device B-SCO, an A-scan discharging switching device A-SCD, a first control switching device CTr1, and a second control switching device CTr2, as shown in FIG. 13.

The A-scan output switching device A-SCO, B-scan output switching device B-SCO and A-scan discharging switching device A-SCD in the seventh embodiment are the same as those in the first embodiment, stated above, respectively, and a description thereof will thus be replaced by the above description of the first embodiment.

The first control switching device CTr1 in the seventh embodiment is the same as that in the second embodiment, stated above, and a description thereof will thus be replaced by the above description of the second embodiment.

The second control switching device CTr2 in the seventh embodiment is controlled by the C-clock pulse C-CLK from a C-clock transfer line and is connected between the B-carry output terminal B-COT of the B-sub-stage B-Sub and the gate electrode of the B-scan output switching device B-SCO. That is, the second control switching device CTr2 is turned on or off in response to the C-clock pulse C-CLK, and interconnects the B-carry output terminal B-COT and the gate electrode of the B-scan output switching device B-SCO when turned on.

Here, the relationship between the C-clock pulse C-CLK and the B1-clock pulse B1-CLK is as shown in FIG. 14.

For example, as shown in FIG. 14(a), the timing between the C-clock pulse C-CLK and the B1-clock pulse B1-CLK_1 or B1-CLK_2 may be set such that the rising edge of the C-clock pulse C-CLK is ahead of the rising edge of the B1-clock pulse B1-CLK_1 or B1-CLK_2 and the falling edge of the C-clock pulse C-CLK is behind the falling edge of the B1-clock pulse B1-CLK_1 or B1-CLK_2.

Alternatively, as shown in FIG. 14(b), the timing between the C-clock pulse C-CLK and the B1-clock pulse B1-CLK_1 or B1-CLK_2 may be set such that the rising edge of the C-clock pulse C-CLK is positioned between the rising edge and falling edge of the B1-clock pulse B1-CLK_1 or B1-CLK_2 and the falling edge of the C-clock pulse C-CLK is farther behind the falling edge of the B1-clock pulse B1-CLK_1 or B1-CLK_2.

The C-clock pulse C-CLK has a high voltage set to a value capable of turning on the second control switching device CTr2, and a low voltage set to a value capable of turning off the second control switching device CTr2.

On the other hand, the signal (B-carry pulse B-CR) output from the B-carry output terminal B-COT or the voltage applied to the gate electrode of the B-scan output switching device B-SCO may be used as the above-stated B-set signal and B-reset signal.

On the other hand, a constant voltage, instead of the C-clock pulse C-CLK, may be applied to the gate electrode of the second control switching device CTr2 in the seventh embodiment. This constant voltage is a direct current (DC) voltage set to a value capable of turning on the second control switching device CTr2.

Eighth Embodiment of Scan Output Controller SOC

Figure 15:
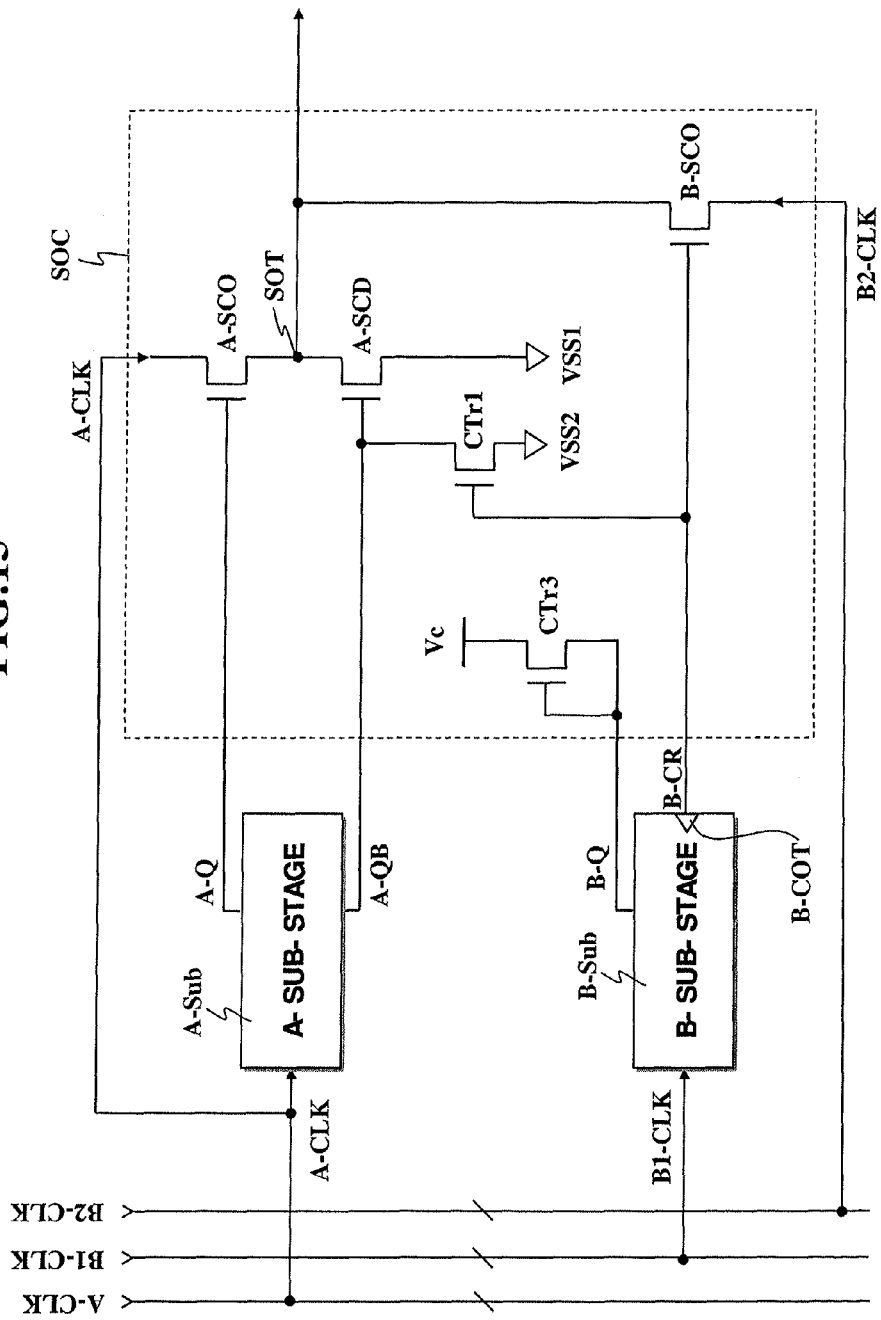
FIG. 15 is a circuit diagram of an eighth embodiment of the scan output controller according to the present invention.

FIG. 15 is a circuit diagram of an eighth embodiment of the scan output controller SOC according to the present invention.

The scan output controller SOC according to the eighth embodiment includes an A-scan output switching device A-SCO, a B-scan output switching device B-SCO, an A-scan discharging switching device A-SCD, a first control switching device CTr1, and a third control switching device CTr3, as shown in FIG. 15.

The A-scan output switching device A-SCO, B-scan output switching device B-SCO, A-scan discharging switching device A-SCD and first control switching device CTr1 in the eighth embodiment are the same as those in the first embodiment, stated above, respectively, and a description thereof will thus be replaced by the above description of the first embodiment.

The third control switching device CTr3 in the eighth embodiment is controlled by a voltage at a B-set node B-Q and is connected between a control voltage line and the B-set node B-Q. That is, the third control switching device CTr3 is turned on or off in response to the voltage at the B-set node B-Q, and interconnects the control voltage line and the B-set node B-Q when turned on. Here, the control voltage line is supplied with a control voltage Vc.

In particular, the control voltage Vc may be a charging voltage which is used to charge the A-set node A-Q and the B-set node B-Q, a high voltage which is used to charge the A-reset node A-QB and a B-reset node, a separate DC voltage which is externally provided, or a separate alternating current (AC) voltage which is externally provided. Alternatively, the control voltage Vc may be another B1-clock pulse B1-CLK having a phase different from that of the B1-clock pulse B1-CLK supplied to the B-sub-stage B-Sub. That is, when the B1-clock pulse B1-CLK is of two phases as stated previously, the control voltage Vc may be the first B1-clock pulse B1-CLK_1 if the second B1-clock pulse B1-CLK 2 is supplied to the B-sub-stage B-Sub.

Ninth Embodiment of Scan Output Controller SOC

Figure 16:
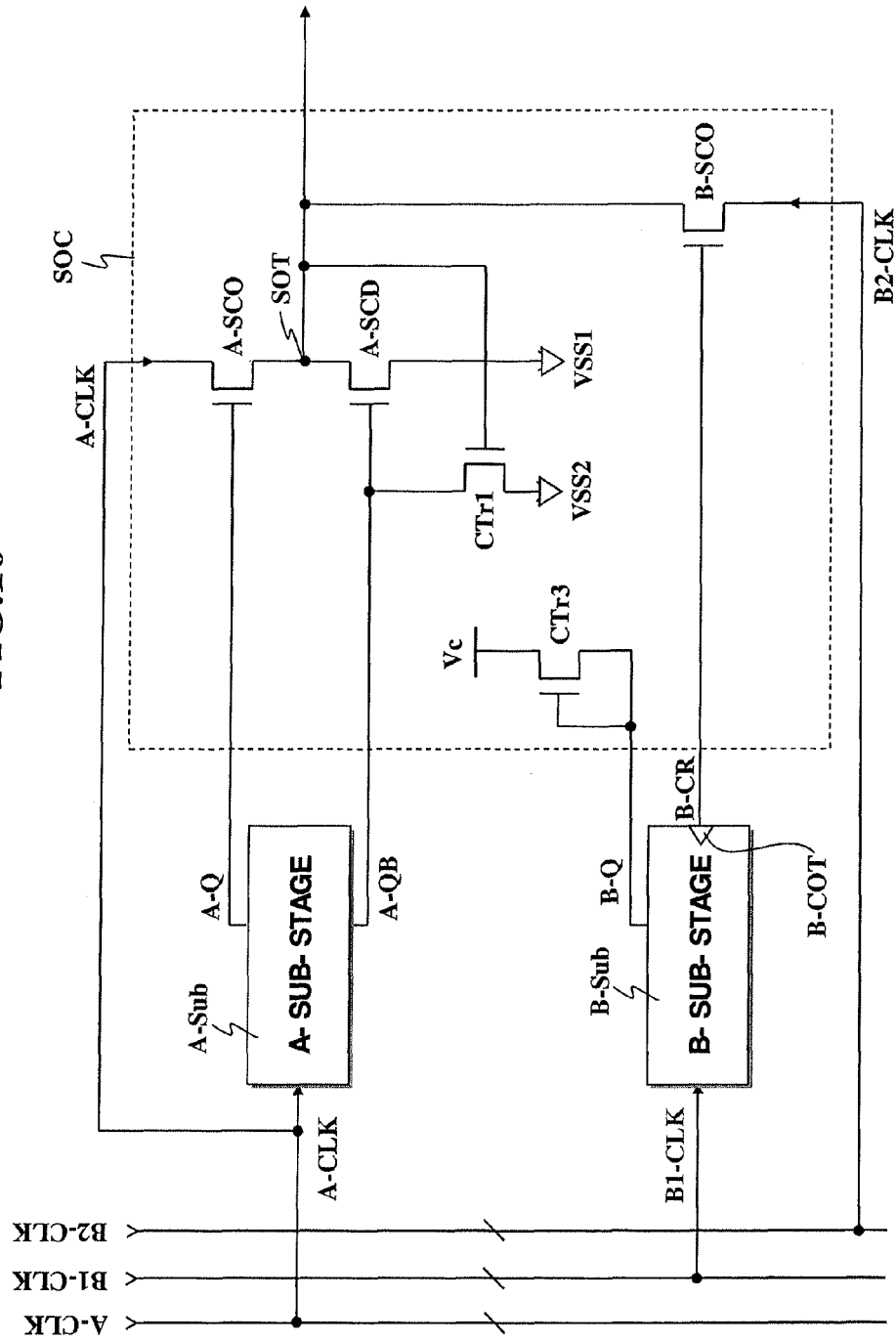
FIG. 16 is a circuit diagram of a ninth embodiment of the scan output controller according to the present invention.

FIG. 16 is a circuit diagram of a ninth embodiment of the scan output controller SOC according to the present invention.

The scan output controller SOC according to the ninth embodiment includes an A-scan output switching device A-SCO, a B-scan output switching device B-SCO, an A-scan discharging switching device A-SCD, a first control switching device CTr1, and a third control switching device CTr3, as shown in FIG. 16.

The A-scan output switching device A-SCO, B-scan output switching device B-SCO and A-scan discharging switching device A-SCD in the ninth embodiment are the same as those in the first embodiment, stated above, respectively, and a description thereof will thus be replaced by the above description of the first embodiment.

The first control switching device CTr1 in the ninth embodiment is the same as that in the second embodiment, stated above, and a description thereof will thus be replaced by the above description of the second embodiment.

The third control switching device CTr3 in the ninth embodiment is the same as that in the eighth embodiment, stated above, and a description thereof will thus be replaced by the above description of the eighth embodiment.

Figure 17:
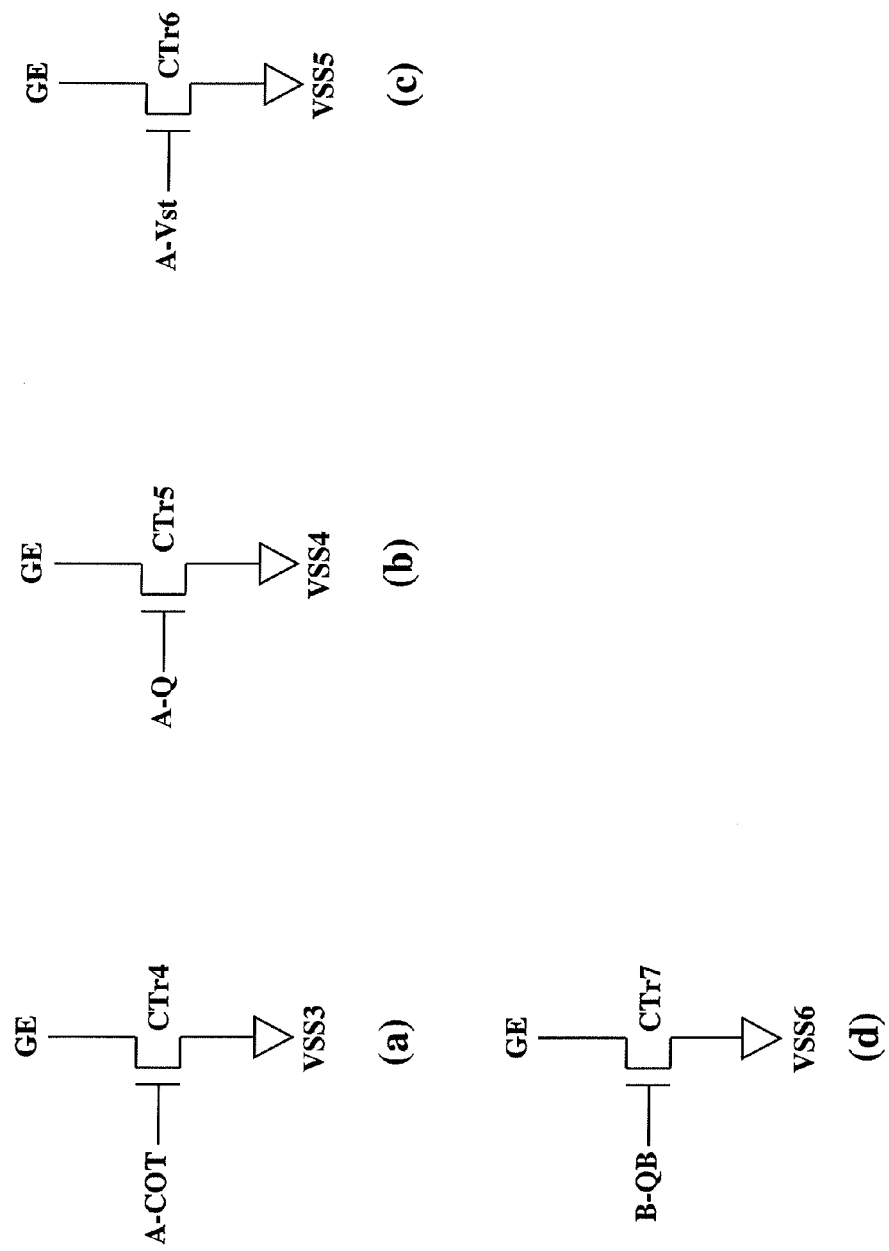
FIG. 17 is a view illustrating switching devices which may be additionally provided in the scan output controller.

FIG. 17 illustrates switching devices which may be additionally provided in the scan output controller SOC. The scan output controller SOC according to each of the third to seventh embodiments shown in FIGS. 9 to 13 may further include at least one of four switching devices shown in FIG. 17.

Each of the four switching devices, more particularly four control switching devices CTr4 to CTr7, will hereinafter be described in detail.

The fourth control switching device CTr4 shown in FIG. 17(a) is controlled by an A-carry pulse A-CR from an A-sub-stage A-Sub and is connected between the gate electrode GE of the B-scan output switching device B-SCO and a third discharging voltage line. That is, the fourth control switching device CTr4 is turned on or off in response to the A-carry pulse A-CR, and interconnects the gate electrode GE of the B-scan output switching device B-SCO and the third discharging voltage line when turned on. Here, the third discharging voltage line is supplied with a third discharging voltage VSS3.

The fifth control switching device CTr5 shown in FIG. 17(b) is controlled by the voltage at the A-set node A-Q and is connected between the gate electrode GE of the B-scan output switching device B-SCO and a fourth discharging voltage line. That is, the fifth control switching device CTr5 is turned on or off in response to the voltage at the A-set node A-Q, and interconnects the gate electrode GE of the B-scan output switching device B-SCO and the fourth discharging voltage line when turned on. Here, the fourth discharging voltage line is supplied with a fourth discharging voltage VSS4.

The sixth control switching device CTr6 shown in FIG. 17(c) is controlled by an A-start pulse A-Vst and is connected between the gate electrode GE of the B-scan output switching device B-SCO and a fifth discharging voltage line. That is, the sixth control switching device CTr6 is turned on or off in response to the A-start pulse A-Vst, and interconnects the gate electrode GE of the B-scan output switching device B-SCO and the fifth discharging voltage line when turned on. Here, the fifth discharging voltage line is supplied with a fifth discharging voltage VSS5.

The seventh control switching device CTr7 shown in FIG. 17(d) is controlled by a voltage at a B-reset node B-QB and is connected between the gate electrode GE of the B-scan output switching device B-SCO and a sixth discharging voltage line. That is, the seventh control switching device CTr7 is turned on or off in response to the voltage at the B-reset node B-QB, and interconnects the gate electrode GE of the B-scan output switching device B-SCO and the sixth discharging voltage line when turned on. Here, the sixth discharging voltage line is supplied with a sixth discharging voltage VSS6.

The scan output controller SOC according to the third embodiment shown in FIG. 9 may further include one or more of the fourth to seventh control switching devices CTr4 to CTr7 shown in FIG. 17.

Similarly, the scan output controller SOC according to the fourth embodiment shown in FIG. 10 may further include one or more of the fourth to seventh control switching devices CTr4 to CTr7 shown in FIG. 17.

Similarly, the scan output controller SOC according to the fifth embodiment shown in FIG. 11 may further include one or more of the fourth to seventh control switching devices CTr4 to CTr7 shown in FIG. 17.

Similarly, the scan output controller SOC according to the sixth embodiment shown in FIG. 12 may further include one or more of the fourth to seventh control switching devices CTr4 to CTr7 shown in FIG. 17.

Similarly, the scan output controller SOC according to the seventh embodiment shown in FIG. 13 may further include one or more of the fourth to seventh control switching devices CTr4 to CTr7 shown in FIG. 17.

FIG. 18 illustrates other switching devices which may be additionally provided in the scan output controller SOC. The scan output controller SOC according to each of the first to ninth embodiments shown in FIGS. 7 to 13 and FIGS. 15 and 16 may further include at least one of two control switching devices CTr8 and CTr9 shown in FIG. 18.

Each of the two control switching devices CTr8 and CTr9 will hereinafter be described in detail.

The eighth control switching device CTr8 shown in FIG. 18(a) is controlled by the B-carry pulse B-CR and is connected between the A-set node A-Q and a seventh discharging voltage line. That is, the eighth control switching device CTr8 is turned on or off in response to the B-carry pulse B-CR, and interconnects the A-set node A-Q and the seventh discharging voltage line when turned on. Here, the seventh discharging voltage line is supplied with a seventh discharging voltage VSS7.

The ninth control switching device CTr9 shown in FIG. 18(b) is controlled by an A-carry pulse A-CR from an A-substage A-Sub (or the voltage at the A-set node A-Q) and is connected between an output terminal which outputs the B-carry pulse B-CR and an eighth discharging voltage line. That is, the ninth control switching device CTr9 is turned on or off in response to the A-carry pulse A-CR (or the voltage at the A-set node A-Q), and interconnects the output terminal which outputs the B-carry pulse B-CR and the eighth discharging voltage line when turned on. Here, the eighth discharging voltage line is supplied with an eighth discharging voltage VSS8.

The scan output controller SOC according to the first embodiment shown in FIG. 7 may further include one or more of the eighth and ninth control switching devices CTr8 and CTr9 shown in FIG. 18. Here, when the ninth control switching device CTr9 is included in the scan output controller SOC of the first embodiment, the output terminal to which the ninth control switching device CTr9 is connected may be the B-carry output terminal B-COT.

Similarly, the scan output controller SOC according to the second embodiment shown in FIG. 8 may further include one or more of the eighth and ninth control switching devices CTr8 and CTr9 shown in FIG. 18. Here, when the ninth control switching device CTr9 is included in the scan output controller SOC of the second embodiment, the output terminal to which the ninth control switching device CTr9 is connected may be the B-carry output terminal B-COT.

Similarly, the scan output controller SOC according to the third embodiment shown in FIG. 9 may further include one or more of the eighth and ninth control switching devices CTr8 and CTr9 shown in FIG. 18. Here, when the eighth control switching device CTr8 is included in the scan output controller SOC of the third embodiment, the B-carry pulse B-CR applied to the eighth control switching device CTr8 may be provided from the B-carry output terminal B-COT or the gate electrode GE of the B-scan output switching device B-SCO. Also, when the ninth control switching device CTr9 is included in the scan output controller SOC of the third embodiment, the output terminal to which the ninth control switching device CTr9 is connected may be the B-carry output terminal B-COT or the gate electrode GE of the B-scan output switching device B-SCO.

Similarly, the scan output controller SOC according to the fourth embodiment shown in FIG. 10 may further include one or more of the eighth and ninth control switching devices CTr8 and CTr9 shown in FIG. 18. Here, when the eighth control switching device CTr8 is included in the scan output controller SOC of the fourth embodiment, the B-carry pulse B-CR applied to the eighth control switching device CTr8 may be provided from the B-carry output terminal B-COT or the gate electrode GE of the B-scan output switching device B-SCO. Also, when the ninth control switching device CTr9 is included in the scan output controller SOC of the fourth embodiment, the output terminal to which the ninth control switching device CTr9 is connected may be the B-carry output terminal B-COT or the gate electrode GE of the B-scan output switching device B-SCO.

Similarly, the scan output controller SOC according to the fifth embodiment shown in FIG. 11 may further include one or more of the eighth and ninth control switching devices CTr8 and CTr9 shown in FIG. 18. Here, when the eighth control switching device CTr8 is included in the scan output controller SOC of the fifth embodiment, the B-carry pulse B-CR applied to the eighth control switching device CTr8 may be provided from the B-carry output terminal B-COT or the gate electrode GE of the B-scan output switching device B-SCO. Also, when the ninth control switching device CTr9 is included in the scan output controller SOC of the fifth embodiment, the output terminal to which the ninth control switching device CTr9 is connected may be the B-carry output terminal B-COT or the gate electrode GE of the B-scan output switching device B-SCO.

Similarly, the scan output controller SOC according to the sixth embodiment shown in FIG. 12 may further include one or more of the eighth and ninth control switching devices CTr8 and CTr9 shown in FIG. 18. Here, when the eighth control switching device CTr8 is included in the scan output controller SOC of the sixth embodiment, the B-carry pulse B-CR applied to the eighth control switching device CTr8 may be provided from the B-carry output terminal B-COT or the gate electrode GE of the B-scan output switching device B-SCO. Also, when the ninth control switching device CTr9 is included in the scan output controller SOC of the sixth embodiment, the output terminal to which the ninth control switching device CTr9 is connected may be the B-carry output terminal B-COT or the gate electrode GE of the B-scan output switching device B-SCO.

Similarly, the scan output controller SOC according to the seventh embodiment shown in FIG. 13 may further include one or more of the eighth and ninth control switching devices CTr8 and CTr9 shown in FIG. 18. Here, when the eighth control switching device CTr8 is included in the scan output controller SOC of the seventh embodiment, the B-carry pulse B-CR applied to the eighth control switching device CTr8 may be provided from the B-carry output terminal B-COT or the gate electrode GE of the B-scan output switching device B-SCO. Also, when the ninth control switching device CTr9 is included in the scan output controller SOC of the seventh embodiment, the output terminal to which the ninth control switching device CTr9 is connected may be the B-carry output terminal B-COT or the gate electrode GE of the B-scan output switching device B-SCO.

Similarly, the scan output controller SOC according to the eighth embodiment shown in FIG. 15 may further include one or more of the eighth and ninth control switching devices CTr8 and CTr9 shown in FIG. 18. Here, when the ninth control switching device CTr9 is included in the scan output controller SOC of the eighth embodiment, the output terminal to which the ninth control switching device CTr9 is connected may be the B-carry output terminal B-COT.

Similarly, the scan output controller SOC according to the ninth embodiment shown in FIG. 16 may further include one or more of the eighth and ninth control switching devices CTr8 and CTr9 shown in FIG. 18. Here, when the ninth control switching device CTr9 is included in the scan output controller SOC of the ninth embodiment, the output terminal to which the ninth control switching device CTr9 is connected may be the B-carry output terminal B-COT.

Hereinafter, the configurations of the A-sub-stage A-Sub and B-sub-stage B-Sub of each stage will be described in detail.

First Embodiment of Stage

Figure 19:
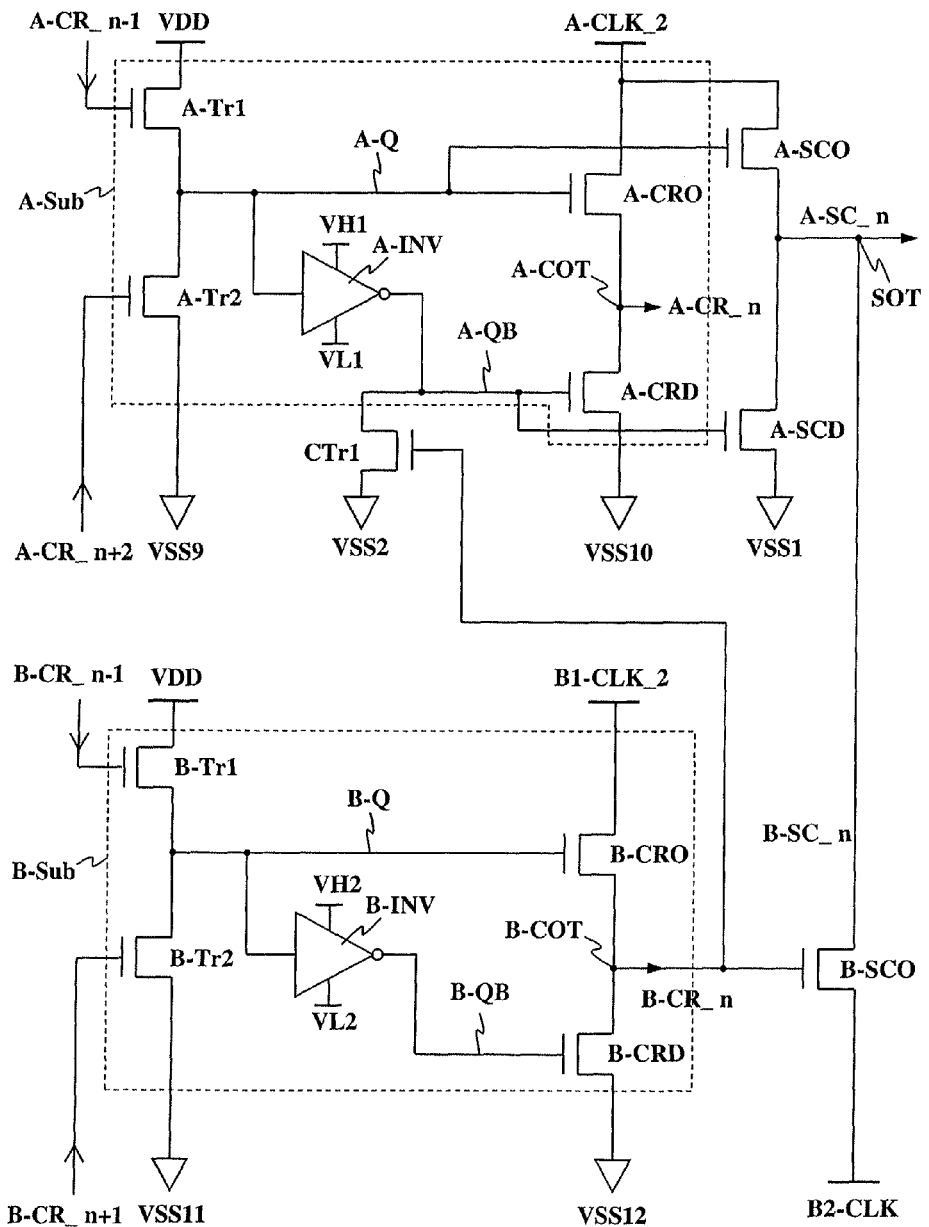
FIG. 19 is a circuit diagram of a first embodiment of a circuit configuration of an A-sub-stage, a B-sub-stage and a scan output controller provided in an nth stage in FIG. 1.

FIG. 19 is a circuit diagram of a first embodiment of a circuit configuration of an A-sub-stage A-Sub, a B-sub-stage B-Sub and a scan output controller SOC provided in the nth stage.

Configuration of A-Sub-Stage A-Sub of Nth Stage

The A-sub-stage A-Sub of the nth stage (referred to hereinafter as an nth A-sub-stage A-Sub) includes a first A-switching device A-Tr1, a second A-switching device A-Tr2, an A-inverter A-INV, an A-carry output switching device A-CRO, and an A-carry discharging switching device A-CRD, as shown in FIG. 19.

The first A-switching device A-Tr1 of the nth A-sub-stage A-Sub is controlled by an A-set signal (for example, an A-carry pulse A-CR from an (n−1)th A-sub-stage A-Sub) and is connected between a charging voltage line and an A-set node A-Q. That is, the first A-switching device A-Tr1 is turned on or off in response to the A-carry pulse A-CR from the (n−1)th A-sub-stage A-Sub, and interconnects the charging voltage line and the A-set node A-Q when turned on. Here, the charging voltage line is supplied with a charging voltage VDD. This charging voltage VDD is a DC voltage having a value capable of turning on corresponding switching devices.

Exceptionally, because there is no stage upstream of the first stage (not shown) which operates earliest among all stages in one frame period T_F, the A-sub-stage A-Sub of the first stage (referred to hereinafter as a first A-sub-stage A-Sub) is supplied with an A-start pulse A-Vst from a timing controller (not shown). As a result, the first A-switching device A-Tr1 of the first A-sub-stage A-Sub is supplied with the A-start pulse A-Vst instead of an upstream A-carry pulse A-CR.

The second A-switching device A-Tr2 of the nth A-sub-stage A-Sub is controlled by an A-reset signal (for example, an A-carry pulse A-CR from an (n+2)th A-sub-stage A-Sub) and is connected between the A-set node A-Q and a ninth discharging voltage line. That is, the second A-switching device A-Tr2 is turned on or off in response to the A-carry pulse A-CR from the (n+2)th A-sub-stage A-Sub, and interconnects the A-set node A-Q and the ninth discharging voltage line when turned on. Here, the ninth discharging voltage line is supplied with a ninth discharging voltage VSS9.

The A-inverter A-INV of the nth A-sub-stage A-Sub controls a voltage at an A-reset node A-QB based on a voltage at the A-set node A-Q such that the voltage at the A-set node A-Q and the voltage at the A-reset node A-QB have opposite logics. For example, when the voltage at the A-set node A-Q is high, the A-inverter A-INV makes the voltage at the A-reset node A-QB low. Conversely, when the voltage at the A-set node A-Q is low, the A-inverter A-INV makes the voltage at the A-reset node A-QB high. Here, the A-inverter A-INV makes the voltage at the A-reset node A-QB high using a first high voltage VH1, and low using a first low voltage VL1.

The A-carry output switching device A-CRO of the nth A-sub-stage A-Sub is controlled by the voltage at the A-set node A-Q and is connected between any one A-clock transfer line and an A-carry output terminal A-COT of the nth A-sub-stage A-Sub. That is, the A-carry output switching device A-CRO is turned on or off in response to the voltage at the A-set node A-Q, and interconnects the A-clock transfer line and the A-carry output terminal A-COT when turned on.

The A-carry discharging switching device A-CRD of the nth A-sub-stage A-Sub is controlled by the voltage at the A-reset node A-QB and is connected between the A-carry output terminal A-COT and a tenth discharging voltage line. That is, the A-carry discharging switching device A-CRD is turned on or off in response to the voltage at the A-reset node A-QB, and interconnects the A-carry output terminal A-COT and the tenth discharging voltage line when turned on. Here, the tenth discharging voltage line is supplied with a tenth discharging voltage VSS10.

Configuration of B-Sub-Stage B-Sub of Nth Stage

The B-sub-stage B-Sub of the nth stage (referred to hereinafter as an nth B-sub-stage B-Sub) includes a first B-switching device B-Tr1, a second B-switching device B-Tr2, a B-inverter B-INV, a B-carry output switching device B-CRO, and a B-carry discharging switching device B-CRD, as shown in FIG. 19.

The first B-switching device B-Tr1 of the nth B-sub-stage B-Sub is controlled by a B-set signal (for example, a B-carry pulse B-CR from an (n−1)th B-sub-stage B-Sub) and is connected between the charging voltage line and a B-set node B-Q. That is, the first B-switching device B-Tr1 is turned on or off in response to the B-carry pulse B-CR from the (n−1)th B-sub-stage B-Sub, and interconnects the charging voltage line and the B-set node B-Q when turned on.

Exceptionally, because there is no stage upstream of the first stage (not shown) which operates earliest among all stages in one frame period T_F, the B-sub-stage B-Sub of the first stage (referred to hereinafter as a first B-sub-stage B-Sub) is supplied with a B-start pulse B-Vst from the timing controller (not shown). As a result, the first B-switching device B-Tr1 of the first B-sub-stage B-Sub is supplied with the B-start pulse B-Vst instead of an upstream B-carry pulse B-CR.

The second B-switching device B-Tr2 of the nth B-sub-stage B-Sub is controlled by a B-reset signal (for example, a B-carry pulse B-CR from an (n+1)th B-sub-stage B-Sub) and is connected between the B-set node B-Q and an eleventh discharging voltage line. That is, the second B-switching device B-Tr2 is turned on or off in response to the B-carry pulse B-CR from the (n+1)th B-sub-stage B-Sub, and interconnects the B-set node B-Q and the eleventh discharging voltage line when turned on. Here, the eleventh discharging voltage line is supplied with an eleventh discharging voltage VSS11.

The B-inverter B-INV of the nth B-sub-stage B-Sub controls a voltage at a B-reset node B-QB based on a voltage at the B-set node B-Q such that the voltage at the B-set node B-Q and the voltage at the B-reset node B-QB have opposite logics. For example, when the voltage at the B-set node B-Q is high, the B-inverter B-INV makes the voltage at the B-reset node B-QB low. Conversely, when the voltage at the B-set node B-Q is low, the B-inverter B-INV makes the voltage at the B-reset node B-QB high. Here, the B-inverter B-INV makes the voltage at the B-reset node B-QB high using a second high voltage VH2, and low using a second low voltage VL2.

The B-carry output switching device B-CRO of the nth B-sub-stage B-Sub is controlled by the voltage at the B-set node B-Q and is connected between any one B1-clock transfer line and a B-carry output terminal B-COT of the nth B-sub-stage B-Sub. That is, the B-carry output switching device B-CRO is turned on or off in response to the voltage at the B-set node B-Q, and interconnects the B1-clock transfer line and the B-carry output terminal B-COT when turned on.

The B-carry discharging switching device B-CRD of the nth B-sub-stage B-Sub is controlled by the voltage at the B-reset node B-QB and is connected between the B-carry output terminal B-COT and a twelfth discharging voltage line. That is, the B-carry discharging switching device B-CRD is turned on or off in response to the voltage at the B-reset node B-QB, and interconnects the B-carry output terminal B-COT and the twelfth discharging voltage line when turned on. Here, the twelfth discharging voltage line is supplied with a twelfth discharging voltage VSS12.

The operations of the A-sub-stage A-Sub and B-sub-stage B-Sub with the above-stated configurations will hereinafter be described in detail.

First, the operation of the A-sub-stage A-Sub will be described with reference to FIGS. 4 to 6 and the configuration of the A-sub-stage A-Sub in FIG. 19.

1) Set Time

At a set time t_s of the nth A-sub-stage A-Sub, the A-carry pulse (A-CR_n−1 in FIG. 5) of the high state from the (n−1)th A-sub-stage A-Sub is supplied to the first A-switching device A-Tr1 of the nth A-sub-stage A-Sub. Accordingly, the first A-switching device A-Tr1 is turned on, and the charging voltage VDD is supplied to the A-set node A-Q of the nth A-sub-stage A-Sub through the turned-on first A-switching device A-Tr1. As a result, the A-set node A-Q is charged, and the A-carry output switching device A-CRO and an A-scan output switching device A-SCO, connected to the charged A-set node A-Q through the gate electrodes thereof, are turned on.

Also, because the voltage at the charged A-set node A-Q is high, the A-inverter A-INV discharges the A-reset node A-QB to the first low voltage VL1. As a result, the A-carry discharging switching device A-CRD and an A-scan discharging switching device A-SCD, connected to the discharged A-reset node A-QB through the gate electrodes thereof, are turned off.

On the other hand, at the set time t_s of the nth A-sub-stage A-Sub, the A-carry pulse A-CR_n+2 from the (n+2)th A-sub-stage A-Sub is low, thereby causing the second A-switching device A-Tr2, supplied with the A-carry pulse A-CR_n+2 through the gate electrode thereof, to be turned off.

Also, at the set time t_s of the nth A-sub-stage A-Sub, the B-set node B-Q of the nth B-sub-stage B-Sub is kept charged by the B-carry pulse B-CR from the (n−1)th B-sub-stage B-Sub, and the B-reset node B-QB of the nth B-sub-stage B-Sub is kept discharged by the B-carry pulse B-CR from the (n−1)th B-sub-stage B-Sub. As a result, the B-carry output switching device B-CRO is kept on, and the B-carry discharging switching device B-CRD is kept off. At this time, the second B1-clock pulse B1-CLK_2 is low. Accordingly, a B-carry pulse B-CR of the low state is output through the turned-on B-carry output switching device B-CRO. The output B-carry pulse B-CR of the low state is supplied to the gate electrode of a first control switching device CTr1 and the gate electrode of a B-scan output switching device B-SCO through the B-carry output terminal B-COT. As a result, at the set time t_s of the nth A-sub-stage A-Sub, the first control switching device CTr1 and the B-scan output switching device B-SCO are both turned off.

In this manner, at the set time t_s of the A-sub-stage A-Sub, the A-set node A-Q of the A-sub-stage A-Sub is charged and the A-reset node A-QB of the A-sub-stage A-Sub is discharged, so that the A-sub-stage A-Sub is set.

2) Output Time

Thereafter, at an output time t_o of the nth A-sub-stage A-Sub, the second A-clock pulse A-CLK_2 is applied to the nth A-sub-stage A-Sub. That is, the second A-clock pulse A-CLK_2 is applied to both the turned-on A-carry output switching device A-CRO and A-scan output switching device A-SCO. Thus, an A-carry pulse (A-CR_n in FIG. 5) is output via the turned-on A-carry output switching device A-CRO, and an A-scan pulse (A-SC_n in FIG. 4) is output via the turned-on A-scan output switching device A-SCO.

Also, at a falling time TL of the first A-clock pulse A-CLK_1, the first A-clock pulse A-CLK_1 makes a high to low transition, so that the (n−1)th A-carry pulse A-CR_n−1 generated by the first A-clock pulse A-CLK_1 makes a high to low transition, thereby causing the first A-switching device A-Tr1 of the nth A-sub-stage A-Sub to be turned off. As a result, the A-set node A-Q of the nth A-sub-stage A-Sub floats, and the voltage at the A-set node A-Q is thus bootstrapped by a coupling phenomenon at the moment that the second A-clock pulse A-CLK_2 is input to the A-sub-stage A-Sub. Accordingly, the A-carry output switching device A-CRO and the A-scan output switching device A-SCO are almost completely turned on, so that the A-carry pulse A-CR_n and the A-scan pulse A-SC_n are stably output therefrom.

In this manner, in the present invention, the A-set node A-Q is bootstrapped using the A-clock pulse A-CLK, not a constant voltage, and the floating structure, so that the A-carry pulse A-CR and the A-scan pulse A-SC can be stably output even using the A-clock pulse A-CLK of the relatively low voltage. Further, the stabilization of the output voltage by the bootstrapping makes it possible to prevent the output voltage from being attenuated even if the size of the A-scan output switching device A-SCO is made to be relatively small.

The A-carry pulse A-CR_n output through the A-carry output terminal A-COT is supplied to the (n+1)th A-sub-stage A-Sub and the (n−2)th A-sub-stage A-Sub. Therefore, the (n+1)th A-sub-stage A-Sub is set and the (n−2)th A-sub-stage A-Sub is reset.

The A-scan pulse A-SC_n output through the scan output terminal SOT is supplied to an nth gate line.

At the output time t_o of the nth A-sub-stage A-Sub, the first control switching device CTr1 and the B-scan output switching device B-SCO are both turned off.

3) Reset Time

Thereafter, at a reset time t_r of the nth A-sub-stage A-Sub, the A-carry pulse (A-CR_n+2 in FIG. 5) from the (n+2)th A-sub-stage A-Sub becomes high, thereby causing the second A-switching device A-Tr2 of the nth A-sub-stage A-Sub, supplied with the A-carry pulse A-CR_n+2, to be turned on. As a result, the ninth discharging voltage VSS9 is supplied to the A-set node A-Q through the turned-on second A-switching device A-Tr2. Accordingly, the A-set node A-Q is discharged, and the A-carry output switching device A-CRO and A-scan output switching device A-SCO, connected to the discharged A-set node A-Q through the gate electrodes thereof, are turned off.

Also, because the voltage at the discharged A-set node A-Q is low, the A-inverter A-INV charges the A-reset node A-QB to the first high voltage VH1. As a result, the A-carry discharging switching device A-CRD and A-scan discharging switching device A-SCD, connected to the charged A-reset node A-QB through the gate electrodes thereof, are turned on.

Accordingly, the tenth discharging voltage VSS10 is output to the A-carry output terminal A-COT via the turned-on A-carry discharging switching device A-CRD, and the first discharging voltage VSS1 is output to the scan output terminal SOT via the turned-on A-scan discharging switching device A-SCD.

The tenth discharging voltage VSS10 output through the A-carry output terminal A-COT is supplied to the (n+1)th A-sub-stage A-Sub and the (n−2)th A-sub-stage A-Sub.

The first discharging voltage VSS1 output through the scan output terminal SOT is supplied to the nth gate line.

At the reset time t_r of the nth A-sub-stage A-Sub, the first control switching device CTr1 and the B-scan output switching device B-SCO are both kept off.

After all A-sub-stages A-Sub output A-scan pulses A-SC and A-carry pulses A-CR once in the above manner, the second B1-clock pulse B1-CLK_2 and B2-clock pulse B2-CLK of the high state are applied to the nth stage ST_n in the B-output period T_B of this frame period T_F. That is, the second B1-clock pulse B1-CLK_2 of the high state is applied to the B-carry output switching device B-CRO of the nth B-sub-stage B-Sub. Because the B-carry output switching device B-CRO has already been turned on, the second B1-clock pulse B1-CLK 2 of the high state applied thereto is output as a B-carry pulse (B-CR_n in FIG. 6) through the B-carry output terminal B-COT.

Here, the high state of each of the B1-clock pulses B1-CLK_1 and B1-CLK_2 may be set to have a voltage higher than that of the high state of the B2-clock pulse B2-CLK. In this case, the voltage at the B-carry output terminal B-COT may be boosted, thereby causing the B-scan output switching device B-SCO to be almost completely turned on. Therefore, a B-scan pulse B-SC_n may be stably output from the B-scan output switching device B-SCO.

In this manner, in the present invention, the voltage at the B-carry output terminal B-COT can be boosted using the B1-clock pulse B1-CLK and the B2-clock pulse B2 -CLK, which has a voltage lower than that of the B1-clock pulse B1-CLK, not a constant voltage. That is, the B-scan pulse B-SC can be stably output even using the B2-clock pulse B2-CLK of the relatively low voltage. Further, because the output voltage is stabilized by the boosting of the voltage at the B-carry output terminal B-COT, it can be prevented from being attenuated even if the size of the B-scan output switching device B-SCO is made to be relatively small.

The B-carry pulse B-CR_n of the high state, output through the B-carry output terminal B-COT in the above manner, is applied to the (n+1)th B-sub-stage B-Sub, the (n−1)th B-sub-stage B-Sub and the first control switching device CTr1 of the nth A-sub-stage A-Sub, as well as the B-scan output switching device B-SCO of the nth stage, as stated previously. Therefore, the (n+1)th B-sub-stage B-Sub is set and the (n−1)th B-sub-stage B-Sub is reset.

On the other hand, the above B-carry pulse B-CR_n of the high state is applied to the gate electrode of the first control switching device CTr1 and the gate electrode of the B-scan output switching device B-SCO, so as to turn on the first control switching device CTr1 and the B-scan output switching device B-SCO. As a result, the second discharging voltage VSS2 is supplied to the A-reset node A-QB through the turned-on first control switching device CTr1, so as to discharge the A-reset node A-QB. Accordingly, the A-carry discharging switching device A-CRD and A-scan discharging switching device A-SCD, connected to the discharged A-reset node A-QB through the gate electrodes thereof, are turned off.

Also, the B2-clock pulse B2-CLK is applied to the scan output terminal SOT through the turned-on B-scan output switching device B-SCO. That is, the B2-clock pulse B2-CLK applied to the scan output terminal SOT is the very B-scan pulse (B-SC_n in FIG. 4).

The B-scan pulse B-SC_n output through the scan output terminal SOT is applied to the nth gate line.

Thereafter, at a reset time of the nth B-sub-stage B-Sub, the B-carry pulse B-CR_n+1 from the (n+1)th B-sub-stage B-Sub becomes high, thereby causing the second B-switching device B-Tr2 of the nth B-sub-stage B-Sub, supplied with the B-carry pulse B-CR_n+1, to be turned on. As a result, the eleventh discharging voltage VSS11 is supplied to the B-set node B-Q through the turned-on second B-switching device B-Tr2. Accordingly, the B-set node B-Q is discharged, and the B-carry output switching device B-CRO, connected to the discharged B-set node B-Q through the gate electrode thereof, is turned off.

Also, because the voltage at the discharged B-set node B-Q is low, the B-inverter B-INV charges the B-reset node B-QB to the second high voltage VH2. As a result, the B-carry discharging switching device B-CRD, connected to the charged B-reset node B-QB through the gate electrode thereof, is turned on.

Accordingly, the twelfth discharging voltage VSS12 is output to the B-carry output terminal B-COT via the turned-on B-carry discharging switching device B-CRD. The twelfth discharging voltage VSS12 output through the B-carry output terminal B-COT is applied to the (n+1)th B-sub-stage B-Sub, the (n−1)th B-sub-stage B-Sub, the first control switching device CTr1 of the nth A-sub-stage A-Sub, and the B-scan output switching device B-SCO of the nth stage. As a result, the first control switching device CTr1 and the B-scan output switching device B-SCO are both turned off.

The A-scan output switching device A-SCO, B-scan output switching device B-SCO, A-scan discharging switching device A-SCD and first control switching device CTr1 in FIG. 19 are the same as those in FIG. 7, stated previously, respectively.

Second Embodiment of Stage

Figure 20:
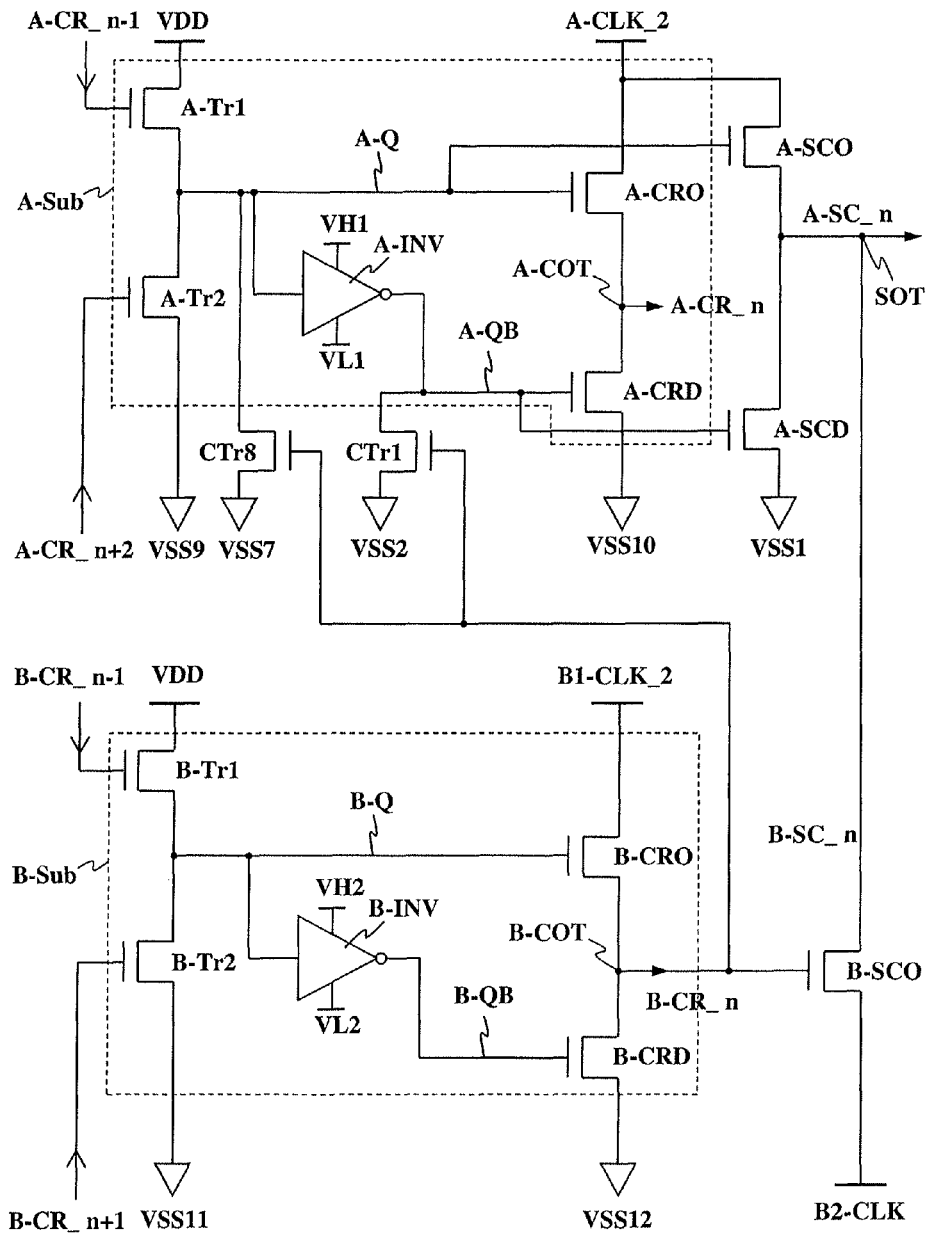
FIG. 20 is a circuit diagram of a second embodiment of the circuit configuration of the A-sub-stage, B-sub-stage and scan output controller provided in the nth stage.

FIG. 20 is a circuit diagram of a second embodiment of the circuit configuration of the A-sub-stage A-Sub, B-sub-stage B-Sub and scan output controller SOC provided in the nth stage.

The configuration of the A-sub-stage A-Sub and the configuration of the B-sub-stage B-Sub in the second embodiment are the same as those in the first embodiment, stated above, respectively, and a description thereof will thus be replaced by the above description of the first embodiment.

An A-scan output switching device A-SCO, B-scan output switching device B-SCO, A-scan discharging switching device A-SCD and first control switching device CTr1 in FIG. 20 are the same as those in FIG. 7, stated previously, respectively.

Also, an eighth control switching device CTr8 in FIG. 20 is the same as that in FIG. 18(a), stated previously.

On the other hand, the eighth control switching device CTr8 in FIG. 20 may be supplied with the first discharging voltage VSS1 instead of the seventh discharging voltage VSS7.

Third Embodiment of Stage

Figure 21:
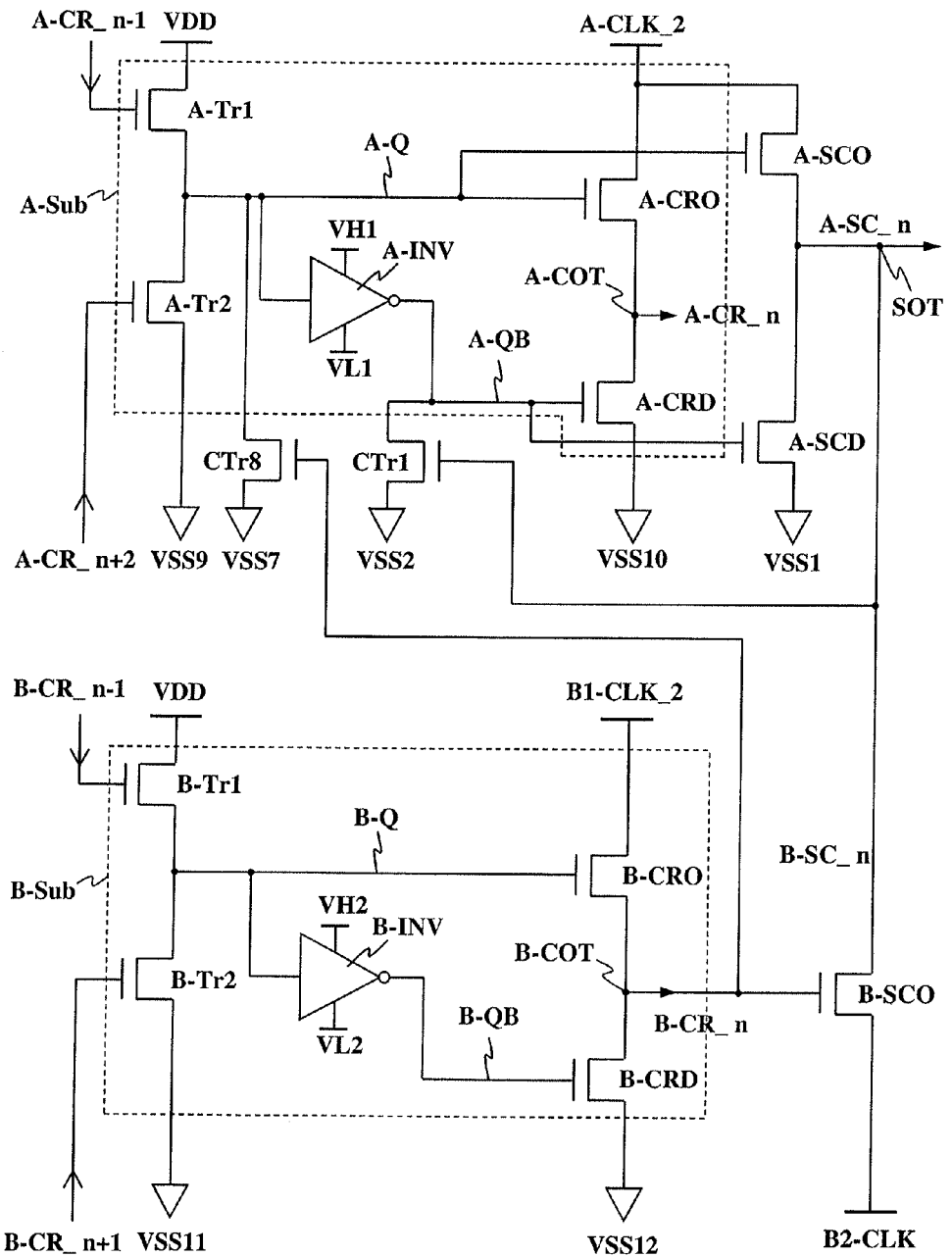
FIG. 21 is a circuit diagram of a third embodiment of the circuit configuration of the A-sub-stage, B-sub-stage and scan output controller provided in the nth stage.

FIG. 21 is a circuit diagram of a third embodiment of the circuit configuration of the A-sub-stage A-Sub, B-sub-stage B-Sub and scan output controller SOC provided in the nth stage.

The configuration of the A-sub-stage A-Sub and the configuration of the B-sub-stage B-Sub in the third embodiment are the same as those in the first embodiment, stated above, respectively, and a description thereof will thus be replaced by the above description of the first embodiment.

An A-scan output switching device A-SCO, B-scan output switching device B-SCO, A-scan discharging switching device A-SCD and first control switching device CTr1 in FIG. 21 are the same as those in FIG. 8, stated previously, respectively.

Also, an eighth control switching device CTr8 in FIG. 21 is the same as that in FIG. 18(a), stated previously.

On the other hand, the eighth control switching device CTr8 in FIG. 21 may be supplied with the ninth discharging voltage VSS9 instead of the seventh discharging voltage VSS7.

Fourth Embodiment of Stage

Figure 22:
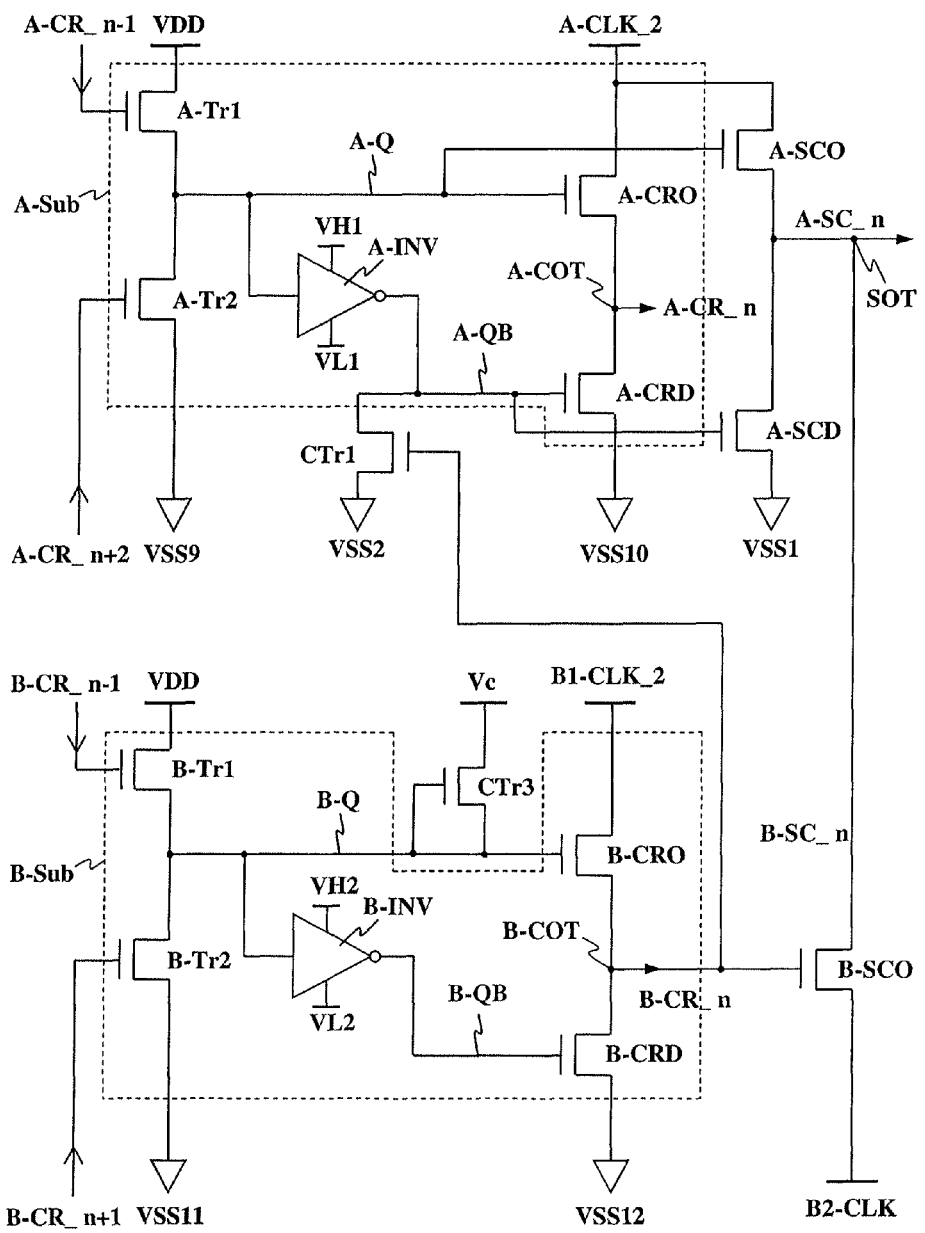
FIG. 22 is a circuit diagram of a fourth embodiment of the circuit configuration of the A-sub-stage, B-sub-stage and scan output controller provided in the nth stage.

FIG. 22 is a circuit diagram of a fourth embodiment of the circuit configuration of the A-sub-stage A-Sub, B-sub-stage B-Sub and scan output controller SOC provided in the nth stage.

The configuration of the A-sub-stage A-Sub and the configuration of the B-sub-stage B-Sub in the fourth embodiment are the same as those in the first embodiment, stated above, respectively, and a description thereof will thus be replaced by the above description of the first embodiment.

An A-scan output switching device A-SCO, B-scan output switching device B-SCO, A-scan discharging switching device A-SCD, first control switching device CTr1 and third control switching device CTr3 in FIG. 22 are the same as those in FIG. 15, stated previously, respectively.

Fifth Embodiment of Stage

Figure 23:
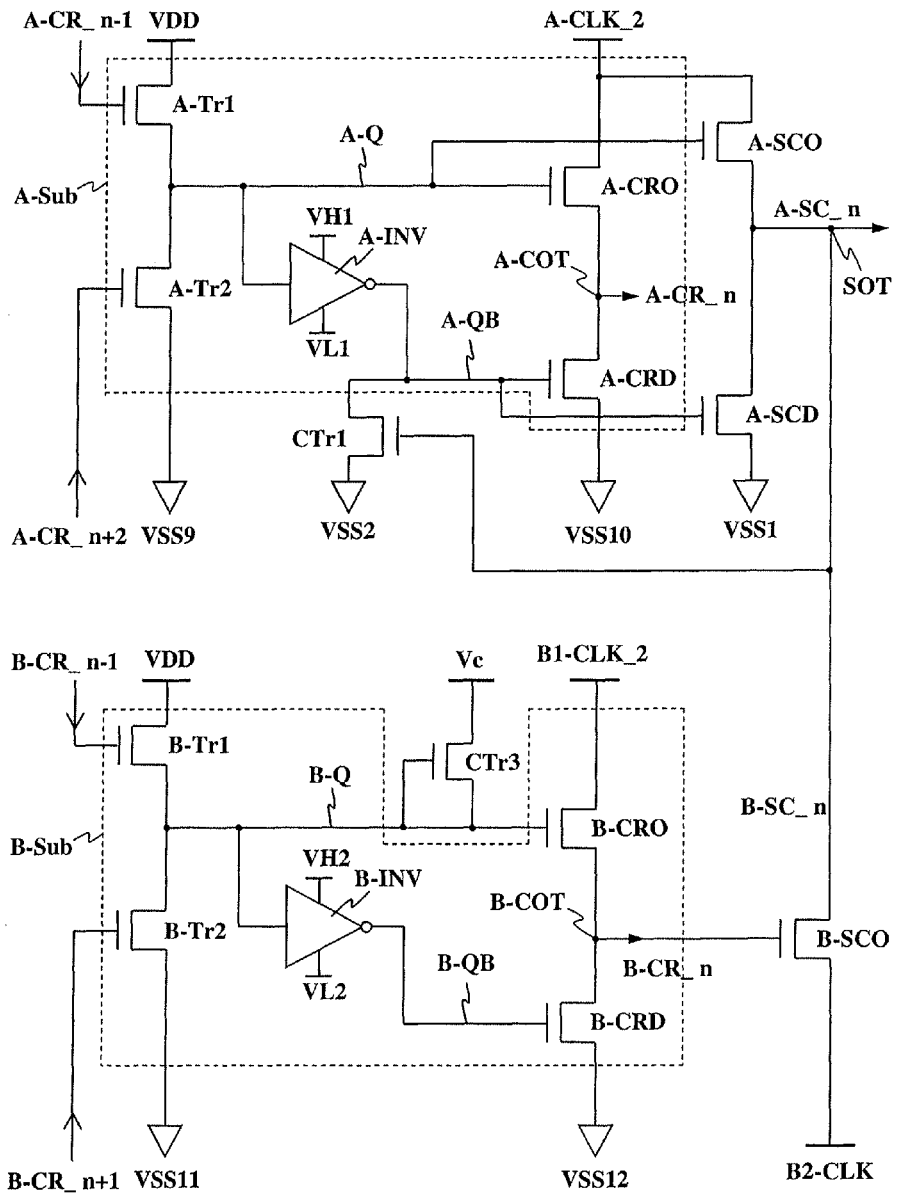
FIG. 23 is a circuit diagram of a fifth embodiment of the circuit configuration of the A-sub-stage, B-sub-stage and scan output controller provided in the nth stage.

FIG. 23 is a circuit diagram of a fifth embodiment of the circuit configuration of the A-sub-stage A-Sub, B-sub-stage B-Sub and scan output controller SOC provided in the nth stage.

The configuration of the A-sub-stage A-Sub and the configuration of the B-sub-stage B-Sub in the fifth embodiment are the same as those in the first embodiment, stated above, respectively, and a description thereof will thus be replaced by the above description of the first embodiment.

An A-scan output switching device A-SCO, B-scan output switching device B-SCO, A-scan discharging switching device A-SCD, first control switching device CTr1 and third control switching device CTr3 in FIG. 23 are the same as those in FIG. 16 (the ninth embodiment), stated previously, respectively.

Sixth Embodiment of Stage

Figure 24:
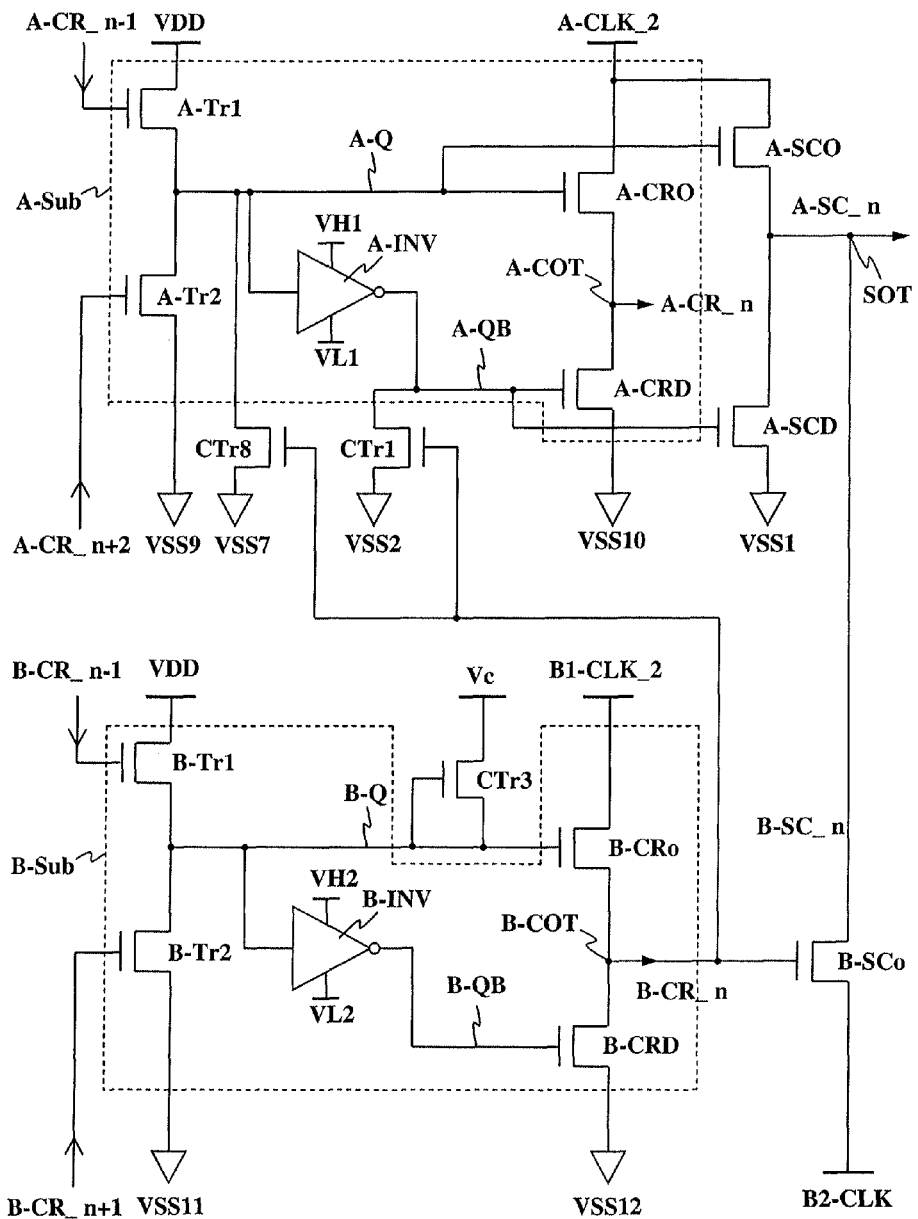
FIG. 24 is a circuit diagram of a sixth embodiment of the circuit configuration of the A-sub-stage, B-sub-stage and scan output controller provided in the nth stage.

FIG. 24 is a circuit diagram of a sixth embodiment of the circuit configuration of the A-sub-stage A-Sub, B-sub-stage B-Sub and scan output controller SOC provided in the nth stage.

The configuration of the A-sub-stage A-Sub and the configuration of the B-sub-stage B-Sub in the sixth embodiment are the same as those in the first embodiment, stated above, respectively, and a description thereof will thus be replaced by the above description of the first embodiment.

An A-scan output switching device A-SCO, B-scan output switching device B-SCO, A-scan discharging switching device A-SCD and first control switching device CTr1 in FIG. 24 are the same as those in FIG. 7, stated previously, respectively.

Also, an eighth control switching device CTr8 in FIG. 24 is the same as that in FIG. 18(a), stated previously.

Also, a third control switching device CTr3 in FIG. 24 is the same as that in FIG. 23, stated above.

On the other hand, in the case where the third control switching device CTr3 is provided in the stage as shown in FIGS. 22 to 24, the voltage at the B-carry output terminal may be bootstrapped in the same manner as that at the A-set node, as will hereinafter be described in detail.

That is, after all A-sub-stages A-Sub output A-scan pulses A-SC and A-carry pulses A-CR once as stated previously, the second B1-clock pulse B1-CLK_2 and B2-clock pulse B2-CLK of the high state are applied to the nth stage ST_n in the B-output period T_B of this frame period T_F. That is, the second B1-clock pulse B1-CLK_2 of the high state is applied to the B-carry output switching device B-CRO of the nth B-sub-stage B-Sub. Because the B-carry output switching device B-CRO has already been turned on, the second B1-clock pulse B1-CLK_2 of the high state applied thereto is output as a B-carry pulse (B-CR_n in FIG. 6) through the B-carry output terminal B-COT.

At this time, the B-carry pulse B-CR_n of the high state is generated at the B-carry output terminal B-COT and the control voltage Vc from the third control switching device CTr3 is supplied to the B-set node B-Q, thereby causing the B-scan output switching device B-SCO to be turned off.

That is, at an output time of the nth B-sub-stage B-Sub, the voltage at the B-set node B-Q is high, the second B1-clock pulse B1-CLK_2 is also high, and the voltage at the B-carry output terminal B-COT is also high. Moreover, the control voltage Vc is supplied to the B-set node B-Q through the turned-on third control switching device CTr3. As a result, the voltage at the B-set node B-Q is prevented from being bootstrapped, thereby causing the gate electrode, source electrode and drain electrode of the B-scan output switching device B-SCO to be kept at voltages of almost the same levels. Accordingly, the B-scan output switching device B-SCO is turned off at the output time of the nth B-sub-stage B-Sub.

Here, when the output of the B-scan output switching device B-SCO is generated, the B-carry output terminal B-COT floats because the B-carry discharging switching device B-CRD has already been turned off as stated previously. As a result, the voltage at the B-carry output terminal B-COT is bootstrapped by a coupling phenomenon at the moment that the B2-clock pulse B2-CLK is input to the B-scan output switching device B-SCO. Accordingly, the B-scan output switching device B-SCO is almost completely turned on, so that the B-scan pulse B-SC_n is stably output therefrom.

In this manner, in the present invention, the voltage at the B-carry output terminal B-COT is bootstrapped using the B2-clock pulse B2-CLK, not a constant voltage, and the floating structure, so that the B-scan pulse B-SC can be stably output. Further, the stabilization of the output voltage by the bootstrapping makes it possible to prevent the output voltage from being attenuated even if the size of the B-scan output switching device B-SCO is made to be relatively small.

Seventh Embodiment of Stage

Figure 25:
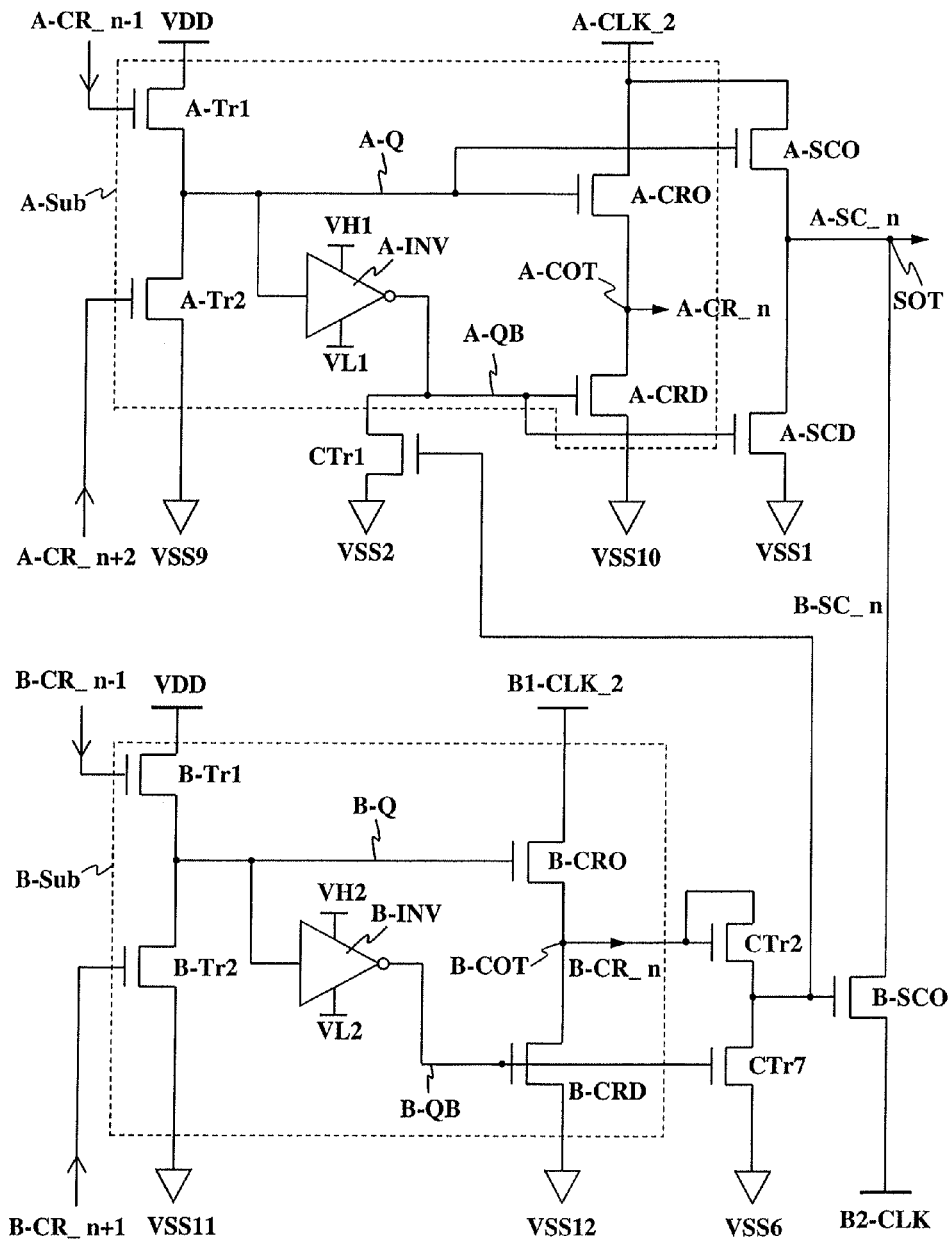
FIG. 25 is a circuit diagram of a seventh embodiment of the circuit configuration of the A-sub-stage, B-sub-stage and scan output controller provided in the nth stage.

FIG. 25 is a circuit diagram of a seventh embodiment of the circuit configuration of the A-sub-stage A-Sub, B-sub-stage B-Sub and scan output controller SOC provided in the nth stage.

The configuration of the A-sub-stage A-Sub and the configuration of the B-sub-stage B-Sub in the seventh embodiment are the same as those in the first embodiment, stated above, respectively, and a description thereof will thus be replaced by the above description of the first embodiment.

An A-scan output switching device A-SCO, B-scan output switching device B-SCO, A-scan discharging switching device A-SCD and first control switching device CTr1 in FIG. 25 are the same as those in FIG. 7, stated previously, respectively.

Also, a second control switching device CTr2 in FIG. 25 is the same as that in FIG. 9, stated previously.

Also, a seventh control switching device CTr7 in FIG. 25 is the same as that in FIG. 17(d), stated previously.

Eighth Embodiment of Stage

Figure 26:
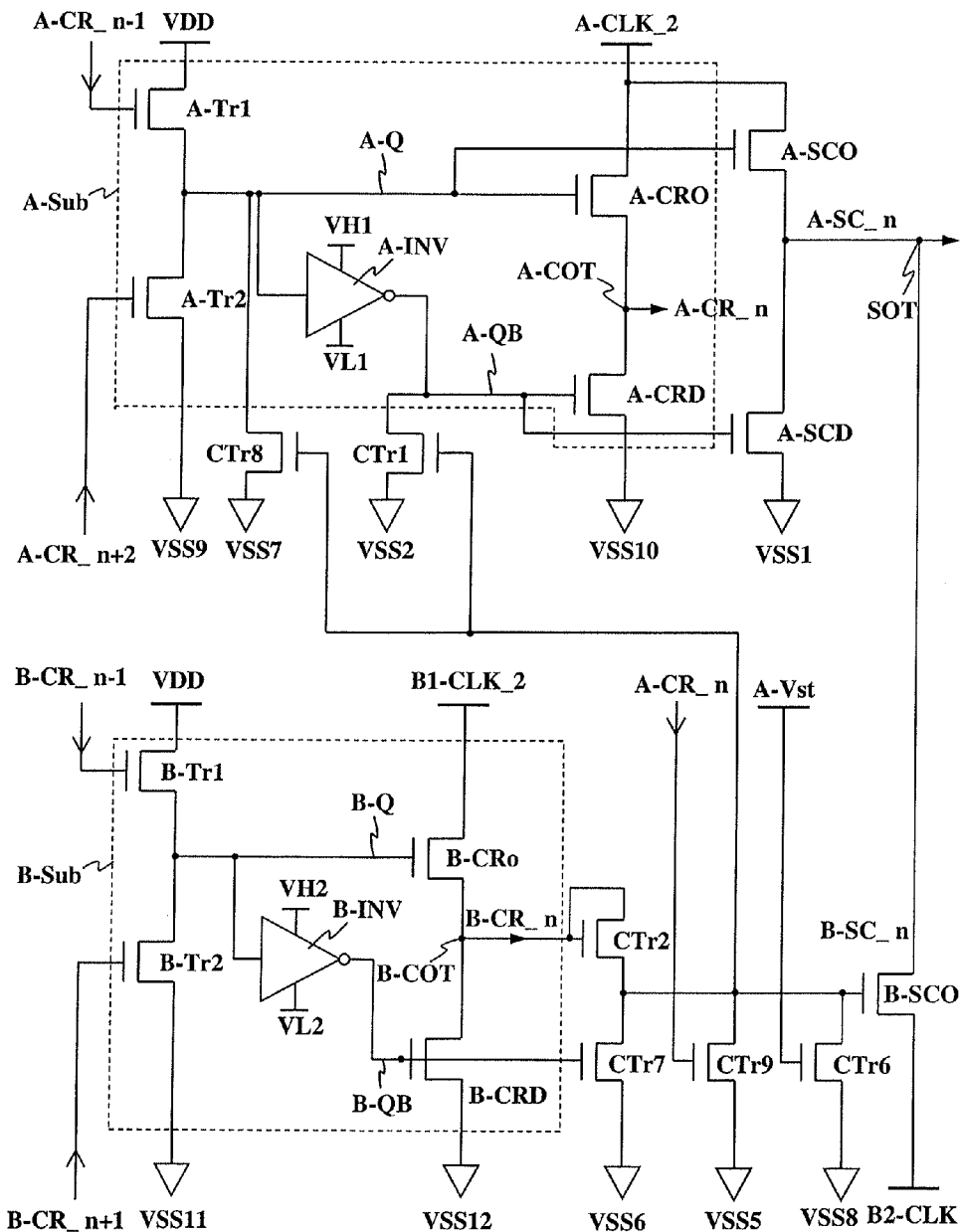
FIG. 26 is a circuit diagram of an eighth embodiment of the circuit configuration of the A-sub-stage, B-sub-stage and scan output controller provided in the nth stage.

FIG. 26 is a circuit diagram of an eighth embodiment of the circuit configuration of the A-sub-stage A-Sub, B-sub-stage B-Sub and scan output controller SOC provided in the nth stage.

The configuration of the A-sub-stage A-Sub and the configuration of the B-sub-stage B-Sub in the eighth embodiment are the same as those in the first embodiment, stated above, respectively, and a description thereof will thus be replaced by the above description of the first embodiment.

An A-scan output switching device A-SCO, B-scan output switching device B-SCO, A-scan discharging switching device A-SCD and first control switching device CTr1 in FIG. 26 are the same as those in FIG. 7, stated previously, respectively.

Also, an eighth control switching device CTr8 in FIG. 26 is the same as that in FIG. 18(a), stated previously.

Also, a second control switching device CTr2 in FIG. 26 is the same as that in FIG. 9, stated previously.

Also, a seventh control switching device CTr7 in FIG. 26 is the same as that in FIG. 17(d), stated previously.

Also, a sixth control switching device CTr6 in FIG. 26 is the same as that in FIG. 17(c), stated previously. This sixth control switching device CTr6 may be provided in all stages other than a stage that is set by the start pulse. For example, the sixth control switching device CTr6 may be provided in all stages other than the first stage that is set by the start pulse, as stated previously.

Also, a ninth control switching device CTr9 in FIG. 26 is the same as that in FIG. 18(b), stated previously.

On the other hand, the gate electrode of the ninth control switching device CTr9 in FIG. 26 may be connected to the A-set node A-Q instead of the A-carry output terminal A-COT.

On the other hand, the nth stage ST_n of the embodiment of FIG. 26 may selectively include only any one or any two of the sixth control switching device CTr6, seventh control switching device CTr7 and ninth control switching device CTr9.

Ninth Embodiment of Stage

Figure 27:
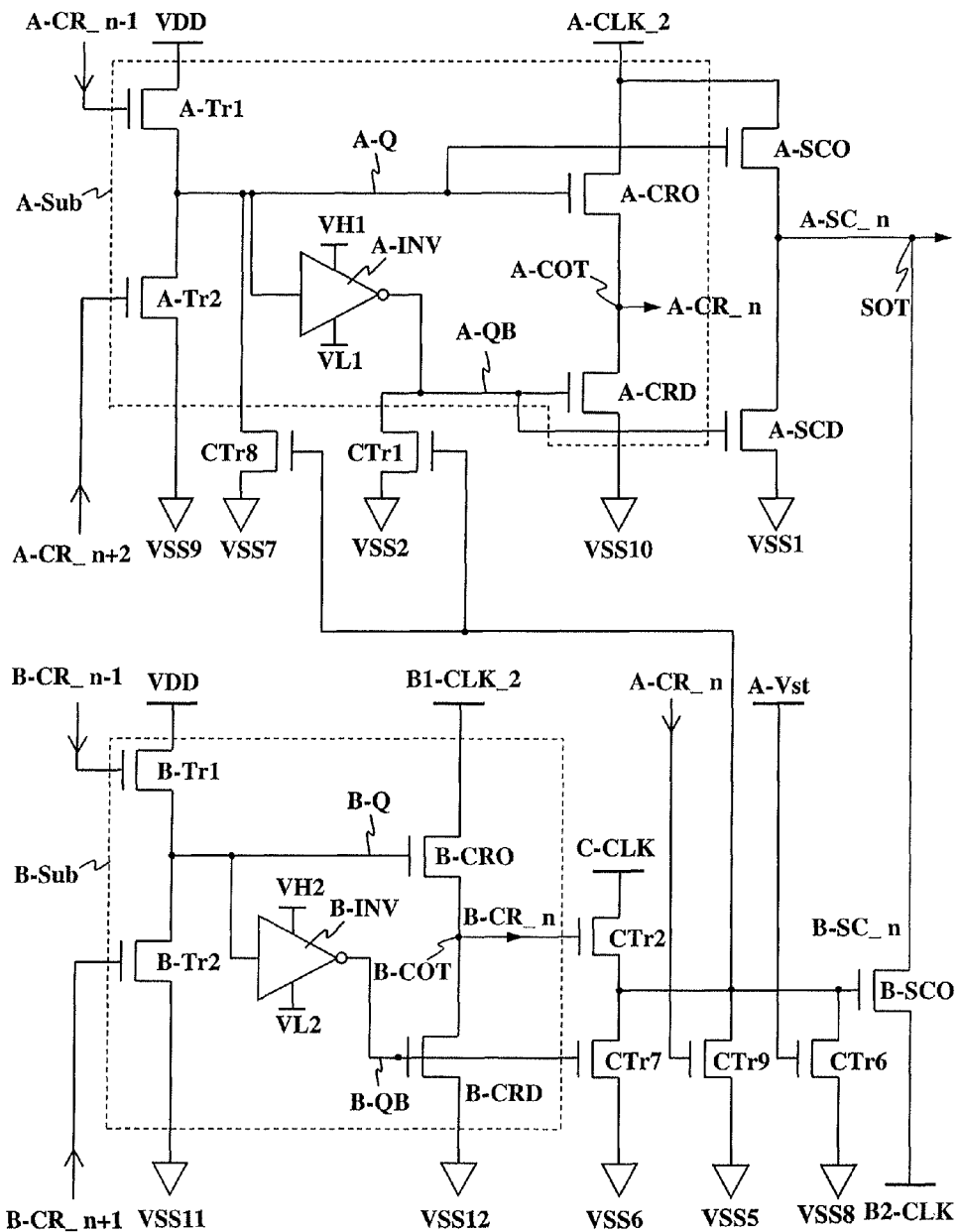
FIG. 27 is a circuit diagram of a ninth embodiment of the circuit configuration of the A-sub-stage, B-sub-stage and scan output controller provided in the nth stage.

FIG. 27 is a circuit diagram of a ninth embodiment of the circuit configuration of the A-sub-stage A-Sub, B-sub-stage B-Sub and scan output controller SOC provided in the nth stage.

The configuration of the A-sub-stage A-Sub and the configuration of the B-sub-stage B-Sub in the ninth embodiment are the same as those in the first embodiment, stated above, respectively, and a description thereof will thus be replaced by the above description of the first embodiment.

An A-scan output switching device A-SCO, B-scan output switching device B-SCO, A-scan discharging switching device A-SCD and first control switching device CTr1 in FIG. 27 are the same as those in FIG. 7, stated previously, respectively.

Also, an eighth control switching device CTr8 in FIG. 27 is the same as that in FIG. 18(a), stated previously.

Also, a second control switching device CTr2 in FIG. 27 is the same as that in FIG. 13, stated previously.

Also, a seventh control switching device CTr7 in FIG. 27 is the same as that in FIG. 17(d), stated previously.

Also, a sixth control switching device CTr6 in FIG. 27 is the same as that in FIG. 17(c), stated previously. This sixth control switching device CTr6 may be provided in all stages other than a stage that is set by the start pulse. For example, the sixth control switching device CTr6 may be provided in all stages other than the first stage that is set by the start pulse, as stated previously.

Also, a ninth control switching device CTr9 in FIG. 27 is the same as that in FIG. 18(b), stated previously.

On the other hand, the gate electrode of the ninth control switching device CTr9 in FIG. 27 may be connected to the A-set node A-Q instead of the A-carry output terminal A-COT.

On the other hand, the second control switching device CTr2 in FIG. 27 may be the same as that in FIG. 9 or 12 instead of that in FIG. 13.

On the other hand, the nth stage ST_n of the embodiment of FIG. 27 may selectively include only any one or any two of the sixth control switching device CTr6, seventh control switching device CTr7 and ninth control switching device CTr9.

First Embodiment of A-Inverter A-INV

Figure 28:
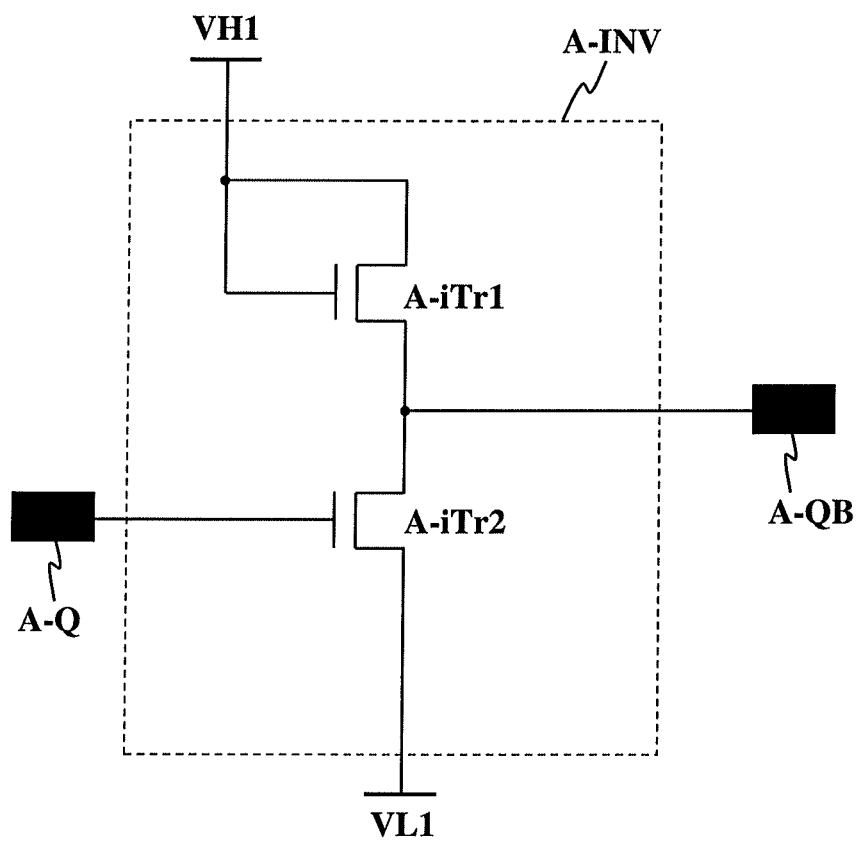
FIG. 28 is a detailed circuit diagram of a first embodiment of an A-inverter.

FIG. 28 is a detailed circuit diagram of a first embodiment of the A-inverter A-INV.

The A-inverter A-INV of the nth A-sub-stage A-Sub includes a first A-inverting switching device A-iTr1 and a second A-inverting switching device A-iTr2, as shown in FIG. 28.

The first A-inverting switching device A-iTr1 of the nth A-sub-stage A-Sub is controlled by the first high voltage VH1 from a high voltage line and is connected between the high voltage line and the A-reset node A-QB. That is, the first A-inverting switching device A-iTr1 is turned on or off in response to the first high voltage VH1, and interconnects the high voltage line and the A-reset node A-QB when turned on.

The second A-inverting switching device A-iTr2 of the nth A-sub-stage A-Sub is controlled by the voltage at the A-set node A-Q and is connected between the A-reset node A-QB and a low voltage line. That is, the second A-inverting switching device A-iTr2 is turned on or off in response to the voltage at the A-set node A-Q, and interconnects the A-reset node A-QB and the low voltage line when turned on. The low voltage line is supplied with the first low voltage VL1.

Here, the second A-inverting switching device A-iTr2 is larger in size (for example, channel width) than the first A-inverting switching device A-iTr1 such that the A-reset node A-QB is kept discharged when the first A-inverting switching device A-iTr1 and the second A-inverting switching device A-iTr2 are both kept on.

Second Embodiment of A-Inverter A-INV

Figure 29:
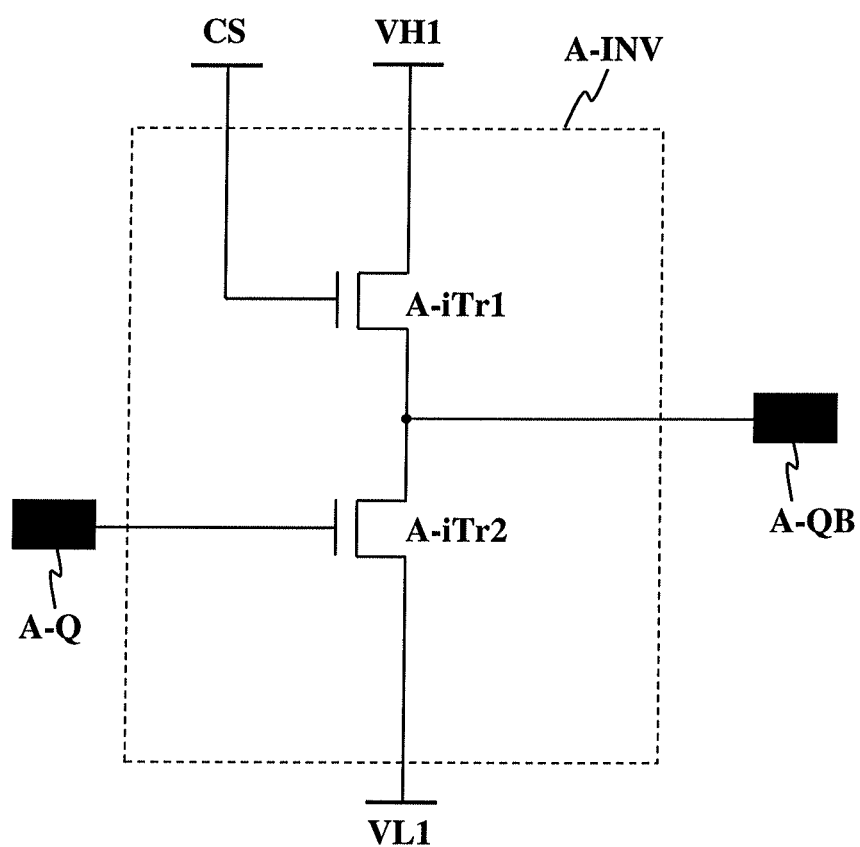
FIG. 29 is a detailed circuit diagram of a second embodiment of the A-inverter.

FIG. 29 is a detailed circuit diagram of a second embodiment of the A-inverter A-INV.

The A-inverter A-INV of the nth A-sub-stage A-Sub includes a first A-inverting switching device A-iTr1 and a second A-inverting switching device A-iTr2, as shown in FIG. 29.

The first A-inverting switching device A-iTr1 of the nth A-sub-stage A-Sub is controlled by an external control signal CS and is connected between a high voltage line and the A-reset node A-QB. That is, the first A-inverting switching device A-iTr1 is turned on or off in response to the control signal CS, and interconnects the high voltage line and the A-reset node A-QB when turned on. The high voltage line is supplied with the first high voltage VH1.

The second A-inverting switching device A-iTr2 of the nth A-sub-stage A-Sub is controlled by the voltage at the A-set node A-Q and is connected between the A-reset node A-QB and a low voltage line. That is, the second A-inverting switching device A-iTr2 is turned on or off in response to the voltage at the A-set node A-Q, and interconnects the A-reset node A-QB and the low voltage line when turned on. The low voltage line is supplied with the first low voltage VL1.

Here, the control signal CS is kept at a low voltage when the A-set node A-Q is kept charged (i.e., high), and at a high voltage when the A-set node A-Q is kept discharged (i.e., low). When the control signal CS has the high voltage, the first A-inverting switching device A-iTr1, supplied with the control signal CS, is turned on. In contrast, when the control signal CS has the low voltage, the first A-inverting switching device A-iTr1, supplied with the control signal CS, is turned off.

Also, the second A-inverting switching device A-iTr2 is larger in size (for example, channel width) than the first A-inverting switching device A-iTr1 such that the A-reset node A-QB is kept discharged when the first A-inverting switching device A-iTr1 and the second A-inverting switching device A-iTr2 are both kept on.

Third Embodiment of A-Inverter A-INV

Figure 30:
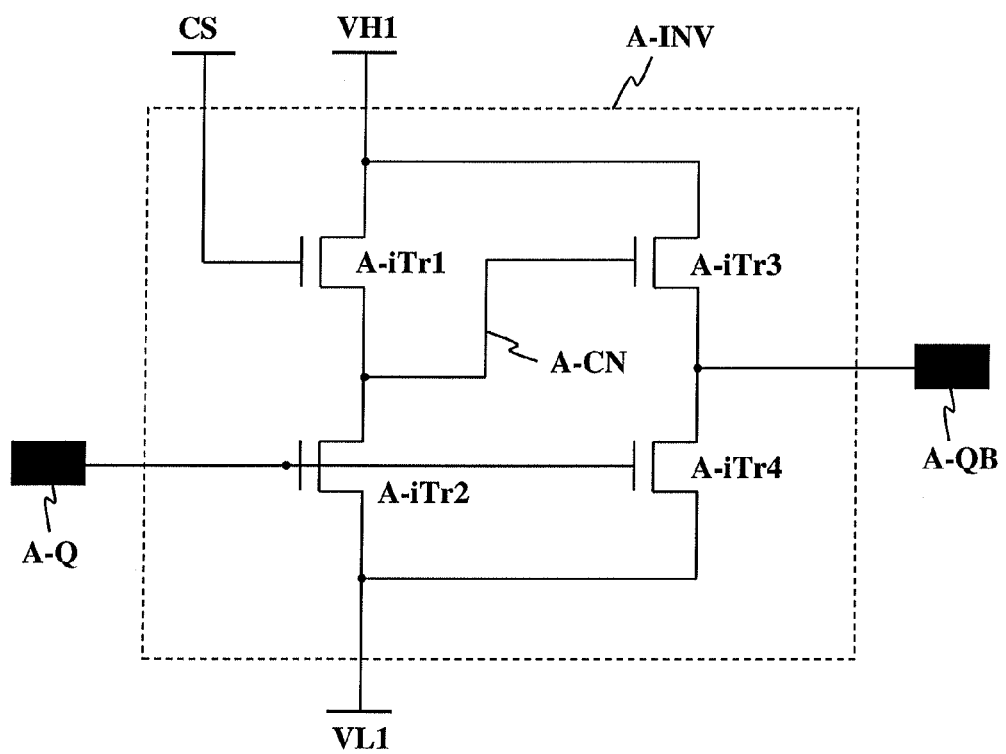
FIG. 30 is a detailed circuit diagram of a third embodiment of the A-inverter.

FIG. 30 is a detailed circuit diagram of a third embodiment of the A-inverter A-INV.

The A-inverter A-INV of the nth A-sub-stage A-Sub includes a first A-inverting switching device A-iTr1 to a fourth A-inverting switching device A-iTr4, as shown in FIG. 30.

The first A-inverting switching device A-iTr1 of the nth A-sub-stage A-Sub is controlled by an external control signal CS and is connected between a high voltage line and an A-common node A-CN. That is, the first A-inverting switching device A-iTr1 is turned on or off in response to the control signal CS, and interconnects the high voltage line and the A-common node A-CN when turned on. The high voltage line is supplied with the first high voltage VH1.

The second A-inverting switching device A-iTr2 of the nth A-sub-stage A-Sub is controlled by the voltage at the A-set node A-Q and is connected between the A-common node A-CN and a low voltage line. That is, the second A-inverting switching device A-iTr2 is turned on or off in response to the voltage at the A-set node A-Q, and interconnects the A-common node A-CN and the low voltage line when turned on. The low voltage line is supplied with the first low voltage VL1.

The third A-inverting switching device A-iTr3 of the nth A-sub-stage A-Sub is controlled by a voltage at the A-common node A-CN and is connected between the high voltage line and the A-reset node A-QB. That is, the third A-inverting switching device A-iTr3 is turned on or off in response to the voltage at the A-common node A-CN, and interconnects the high voltage line and the A-reset node A-QB when turned on.

The fourth A-inverting switching device A-iTr4 of the nth A-sub-stage A-Sub is controlled by the voltage at the A-set node A-Q and is connected between the A-reset node A-QB and the low voltage line. That is, the fourth A-inverting switching device A-iTr4 is turned on or off in response to the voltage at the A-set node A-Q, and interconnects the A-reset node A-QB and the low voltage line when turned on. The low voltage line is supplied with the first low voltage VL1, as stated above.

Here, the control signal CS is kept at a low voltage when the A-set node A-Q is kept charged (i.e., high), and at a high voltage when the A-set node A-Q is kept discharged (i.e., low). When the control signal CS has the high voltage, the first A-inverting switching device A-iTr1, supplied with the control signal CS, is turned on. In contrast, when the control signal CS has the low voltage, the first A-inverting switching device A-iTr1, supplied with the control signal CS, is turned off.

Also, the second A-inverting switching device A-iTr2 is larger in size (for example, channel width) than the first A-inverting switching device A-iTr1 such that the A-reset node A-QB is kept discharged when the first A-inverting switching device A-iTr1 and the second A-inverting switching device A-iTr2 are both kept on.

Fourth Embodiment of A-Inverter A-INV

Figure 31:
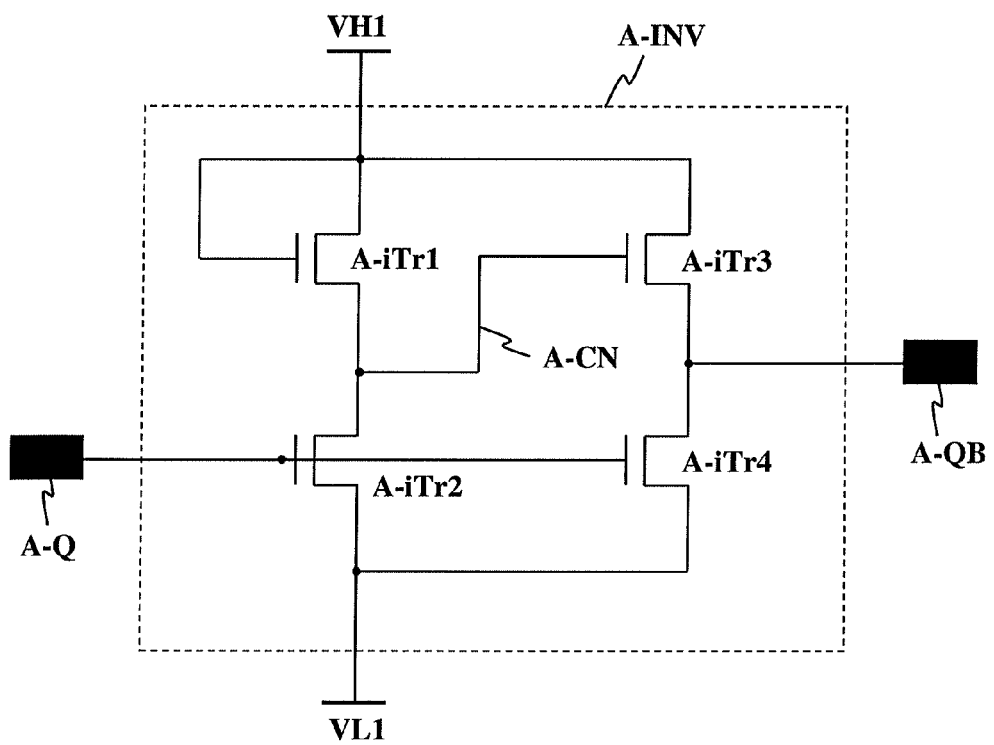
FIG. 31 is a detailed circuit diagram of a fourth embodiment of the A-inverter.

FIG. 31 is a detailed circuit diagram of a fourth embodiment of the A-inverter A-INV.

The A-inverter A-INV of the nth A-sub-stage A-Sub includes a first A-inverting switching device A-iTr1 to a fourth A-inverting switching device A-iTr4, as shown in FIG. 31.

The first A-inverting switching device A-iTr1 of the nth A-sub-stage A-Sub is controlled by the first high voltage VH1 from a high voltage line and is connected between the high voltage line and an A-common node A-CN. That is, the first A-inverting switching device A-iTr1 is turned on or off in response to the first high voltage VH1, and interconnects the high voltage line and the A-common node A-CN when turned on.

The second A-inverting switching device A-iTr2 of the nth A-sub-stage A-Sub is controlled by the voltage at the A-set node A-Q and is connected between the A-common node A-CN and a low voltage line. That is, the second A-inverting switching device A-iTr2 is turned on or off in response to the voltage at the A-set node A-Q, and interconnects the A-common node A-CN and the low voltage line when turned on. The low voltage line is supplied with the first low voltage VL1.

The third A-inverting switching device A-iTr3 of the nth A-sub-stage A-Sub is controlled by a voltage at the A-common node A-CN and is connected between the high voltage line and the A-reset node A-QB. That is, the third A-inverting switching device A-iTr3 is turned on or off in response to the voltage at the A-common node A-CN, and interconnects the high voltage line and the A-reset node A-QB when turned on.

The fourth A-inverting switching device A-iTr4 of the nth A-sub-stage A-Sub is controlled by the voltage at the A-set node A-Q and is connected between the A-reset node A-QB and the low voltage line. That is, the fourth A-inverting switching device A-iTr4 is turned on or off in response to the voltage at the A-set node A-Q, and interconnects the A-reset node A-QB and the low voltage line when turned on. The low voltage line is supplied with the first low voltage VL1, as stated above.

Here, the second A-inverting switching device A-iTr2 is larger in size (for example, channel width) than the first A-inverting switching device A-iTr1 such that the A-reset node A-QB is kept discharged when the first A-inverting switching device A-iTr1 and the second A-inverting switching device A-iTr2 are both kept on.

Fifth Embodiment of A-Inverter A-INV

Figure 32:
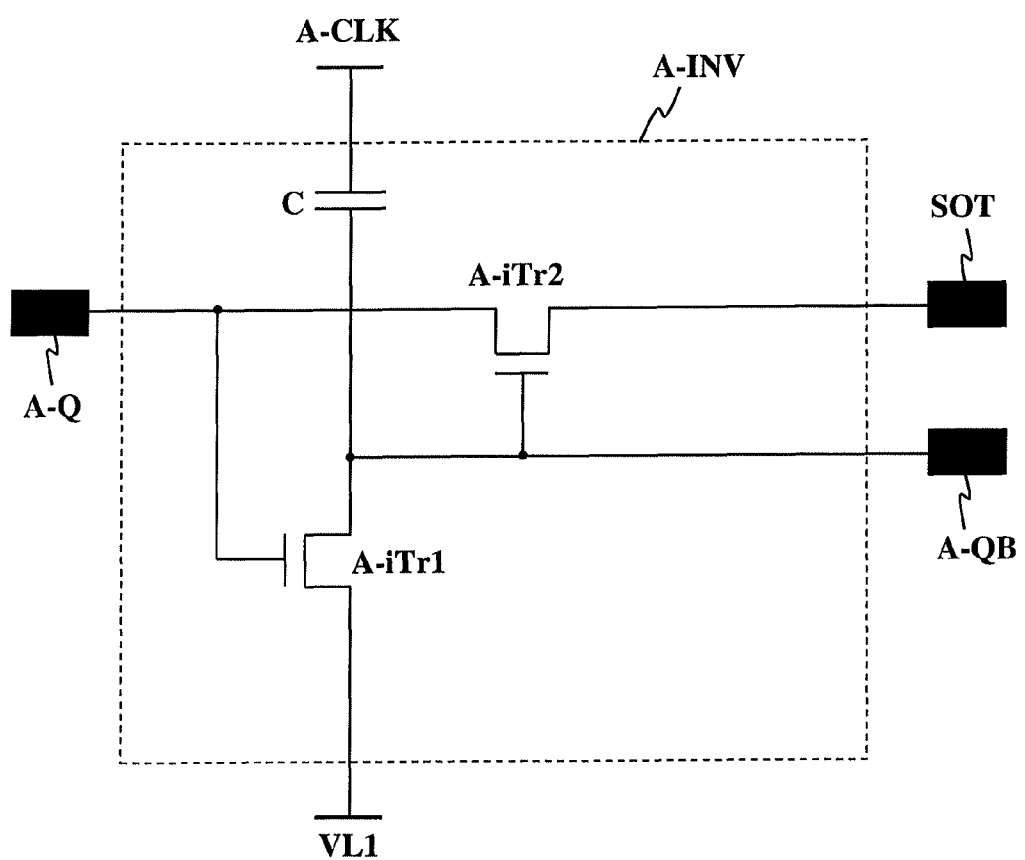
FIG. 32 is a detailed circuit diagram of a fifth embodiment of the A-inverter.

FIG. 32 is a detailed circuit diagram of a fifth embodiment of the A-inverter A-INV.

The A-inverter A-INV of the nth A-sub-stage A-Sub includes a first A-inverting switching device A-iTr1, a second A-inverting switching device A-iTr2, and a capacitor C, as shown in FIG. 32.

The first A-inverting switching device A-iTr1 of the nth A-sub-stage A-Sub is controlled by the voltage at the A-set node A-Q and is connected between the A-reset node A-QB and a low voltage line. That is, the first A-inverting switching device A-iTr1 is turned on or off in response to the voltage at the A-set node A-Q, and interconnects the A-reset node A-QB and the low voltage line when turned on. The low voltage line is supplied with the first low voltage VL1.

The second A-inverting switching device A-iTr2 of the nth A-sub-stage A-Sub is controlled by the voltage at the A-reset node A-QB and is connected between the A-set node A-Q and the scan output terminal SOT. That is, the second A-inverting switching device A-iTr2 is turned on or off in response to the voltage at the A-reset node A-QB, and interconnects the A-set node A-Q and the scan output terminal SOT when turned on.

The capacitor C of the nth A-sub-stage A-Sub is connected between any one A-clock transfer line and the A-reset node A-QB. Here, the A-clock transfer line is supplied with an A-clock pulse A-CLK.

Figure 33:
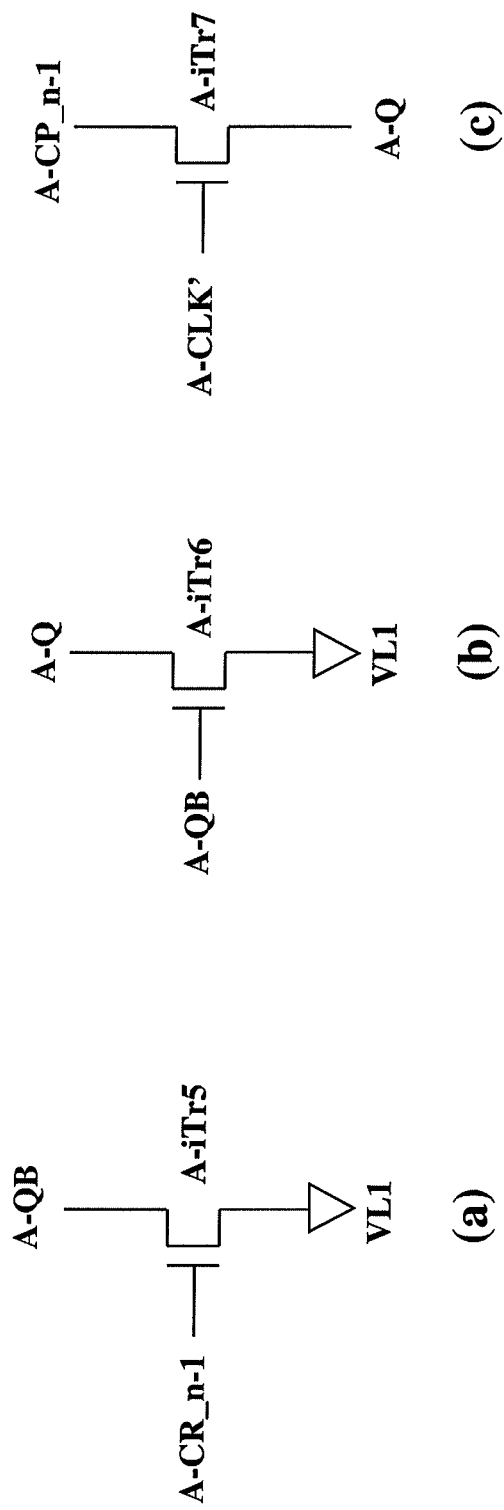
FIG. 33 is a view illustrating inverting switching devices which may be additionally provided in the A-inverter.

FIG. 33 illustrates inverting switching devices which may be additionally provided in the A-inverter A-INV. The A-inverter A-INV according to each of the first to fifth embodiments shown in FIGS. 28 to 32 may further include at least one of three inverting switching devices A-iTr5 to A-iTr7 shown in FIG. 33.

Each of the three inverting switching devices A-iTr5 to A-iTr7 will hereinafter be described in detail.

As shown in FIG. 33(a), the fifth A-inverting switching device A-iTr5 of the nth A-sub-stage A-Sub is controlled by the A-set signal (i.e., the A-carry pulse A-CR_n−1 from the (n−1)th A-sub-stage A-Sub) and is connected between the A-reset node A-QB of the nth A-sub-stage A-Sub and the low voltage line. That is, the fifth A-inverting switching device A-iTr5 is turned on or off in response to the A-carry pulse A-CR_n−1 from the upstream A-sub-stage A-Sub, and interconnects the A-reset node A-QB and the low voltage line when turned on.

As shown in FIG. 33(b), the sixth A-inverting switching device A-iTr6 of the nth A-sub-stage A-Sub is controlled by the voltage at the A-reset node A-QB and is connected between the A-set node A-Q and the low voltage line. That is, the sixth A-inverting switching device A-iTr6 is turned on or off in response to the voltage at the A-reset node A-QB, and interconnects the A-set node A-Q and the low voltage line when turned on.

As shown in FIG. 33(c), the seventh A-inverting switching device A-iTr7 of the nth A-sub-stage A-Sub is controlled by an A-clock pulse A-CLK from any one A-clock transfer line and is connected between an output terminal (i.e., an A-carry output terminal A-COT of the (n−1)th A-sub-stage A-Sub) which outputs the A-set signal (i.e., the A-carry pulse A-CR_n−1 from the (n−1)th A-sub-stage A-Sub) and the A-set node A-Q of the nth A-sub-stage A-Sub. That is, the seventh A-inverting switching device A-iTr7 is turned on Or off in response to the A-clock pulse A-CLK, and interconnects the A-carry output terminal A-COT of the (n−1)th A-sub-stage A-Sub) and the A-set node A-Q of the nth A-sub-stage A-Sub when turned on.

The A-inverter A-INV according to the first embodiment shown in FIG. 28 may further include one or more of the fifth to seventh A-inverting switching devices A-iTr5 to A-iTr7 shown in FIG. 33.

Similarly, the A-inverter A-INV according to the second embodiment shown in FIG. 29 may further include one or more of the fifth to seventh A-inverting switching devices A-iTr5 to A-iTr7 shown in FIG. 33.

Similarly, the A-inverter A-INV according to the third embodiment shown in FIG. 30 may further include one or more of the fifth to seventh A-inverting switching devices A-iTr5 to A-iTr7 shown in FIG. 33.

Similarly, the A-inverter A-INV according to the fourth embodiment shown in FIG. 31 may further include one or more of the fifth to seventh A-inverting switching devices A-iTr5 to A-iTr7 shown in FIG. 33.

Similarly, the A-inverter A-INV according to the fifth embodiment shown in FIG. 32 may further include one or more of the fifth to seventh A-inverting switching devices A-iTr5 to A-iTr7 shown in FIG. 33.

Figure 34:
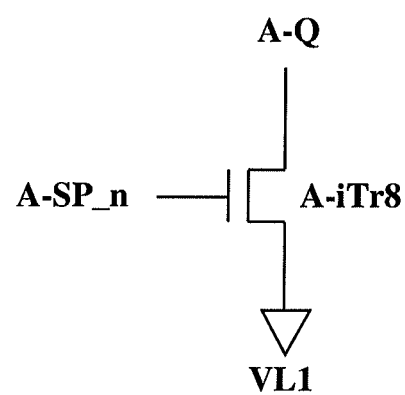
FIG. 34 is a view illustrating another inverting switching device which may be additionally provided in the third and fourth embodiments of the A-inverter.

FIG. 34 illustrates another inverting switching device which may be additionally provided in the third and fourth embodiments of the A-inverter A-INV. The A-inverter A-INV according to each of the third and fourth embodiments shown in FIGS. 30 and 31 may further include the inverting switching device A-iTr8 shown in FIG. 34.

This inverting switching device A-iTr8 will hereinafter be described in detail.

As shown in FIG. 34, the eighth A-inverting switching device A-iTr8 of the nth A-sub-stage A-Sub is controlled by the voltage applied to the gate electrode GE of the B-scan output switching device B-SCO and is connected between the A-common node A-CN and the low voltage line. That is, the eighth A-inverting switching device A-iTr8 is turned on or off in response to the voltage applied to the gate electrode GE of the B-scan output switching device B-SCO, and interconnects the A-common node A-CN and the low voltage line when turned on.

Here, the B-carry output terminal B-COT, instead of the gate electrode GE of the B-scan output switching device B-SCO, may be directly connected to the gate electrode of the eighth A-inverting switching device A-iTr8.

The A-inverter A-INV according to the third embodiment shown in FIG. 30 may further include the eighth A-inverting switching device A-iTr8 shown in FIG. 34.

Similarly, the A-inverter A-INV according to the fourth embodiment shown in FIG. 31 may further include the eighth A-inverting switching device A-iTr8 shown in FIG. 34.

On the other hand, the B-inverter B-INV may also have the configurations as shown in FIGS. 28 to 34. For example, the B-inverter B-INV may have a configuration as shown in FIG. 35.

Figure 35:
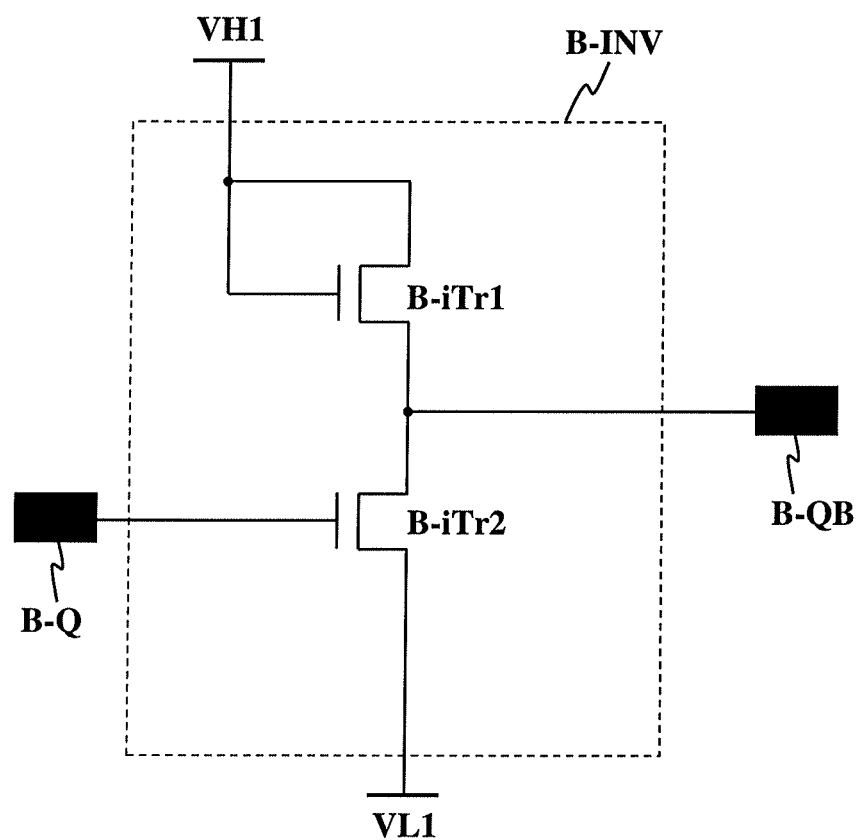
FIG. 35 is a detailed circuit diagram of a B-inverter.

FIG. 35 is a detailed circuit diagram of the B-inverter B-INV.

The B-inverter B-INV of the nth B-sub-stage B-Sub includes a first B-inverting switching device B-iTr1 and a second B-inverting switching device B-iTr2, as shown in FIG. 35.

The first B-inverting switching device B-iTr1 of the nth B-sub-stage B-Sub is controlled by the second high voltage VH2 from a high voltage line and is connected between the high voltage line and the B-reset node B-QB. That is, the first B-inverting switching device B-iTr1 is turned on or off in response to the second high voltage VH2, and interconnects the high voltage line and the B-reset node B-QB when turned on.

The second B-inverting switching device B-iTr2 of the nth B-sub-stage B-Sub is controlled by the voltage at the B-set node B-Q and is connected between the B-reset node B-QB and a low voltage line. That is, the second B-inverting switching device B-iTr2 is turned on or off in response to the voltage at the B-set node B-Q, and interconnects the B-reset node B-QB and the low voltage line when turned on. The low voltage line is supplied with the second low voltage VL2.

Here, the second B-inverting switching device B-iTr2 is larger in size (for example, channel width) than the first B-inverting switching device B-iTr1 such that the B-reset node B-QB is kept discharged when the first B-inverting switching device B-iTr1 and the second B-inverting switching device B-iTr2 are both kept on.

On the other hand, each of the A-sub-stage A-Sub and B-sub-stage B-Sub according to the present invention may have a circuit configuration having two or more reset nodes. Hereinafter, a description will be given of circuit configurations of the A-sub-stage A-Sub and B-sub-stage B-Sub each having two reset nodes, as one example.

Figure 36:
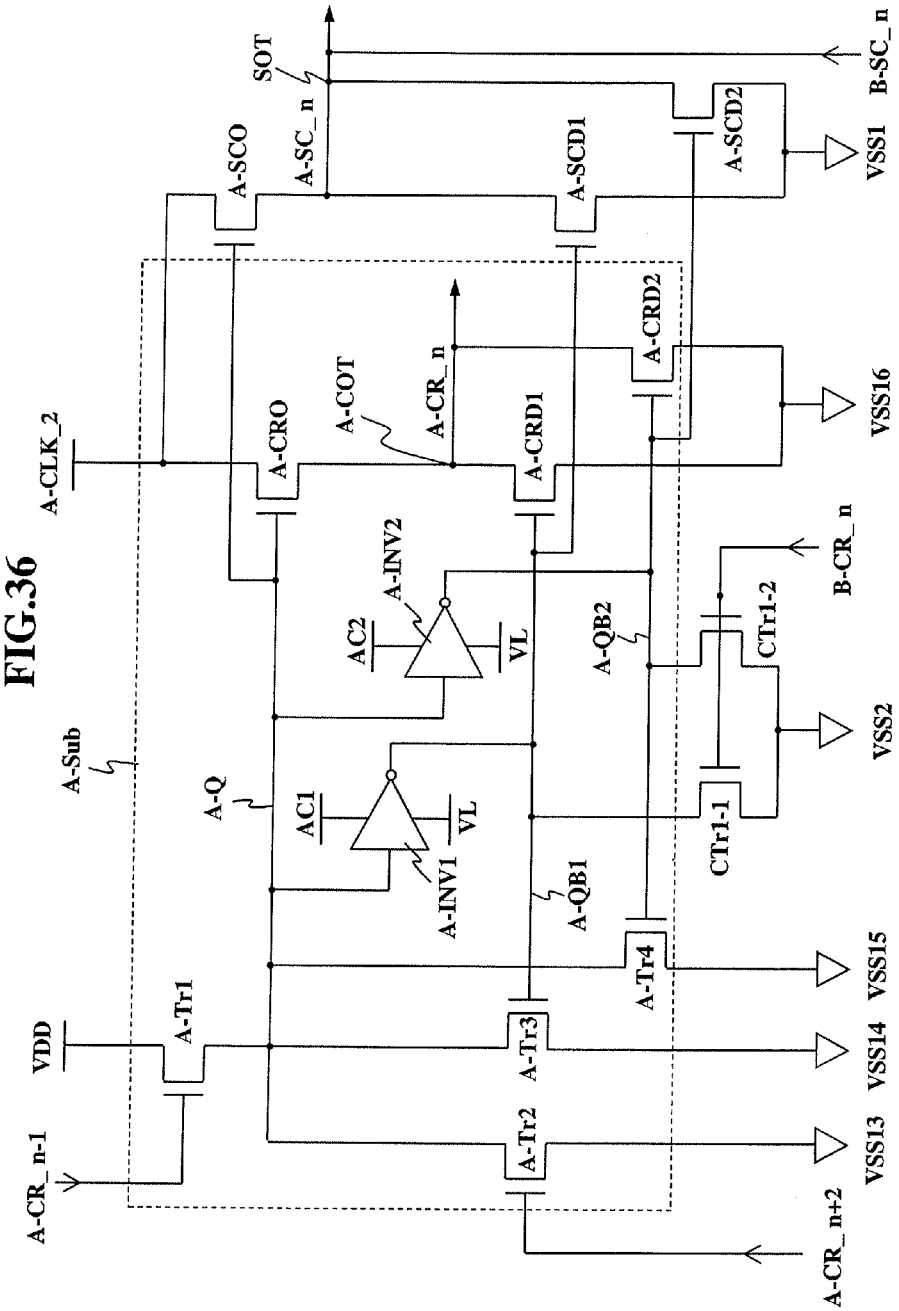
FIG. 36 is a circuit diagram of another embodiment of the A-sub-stage in the nth stage.

FIG. 36 is a circuit diagram of another embodiment of the A-sub-stage A-Sub in the nth stage.

The A-sub-stage A-Sub of the nth stage (referred to hereinafter as an nth A-sub-stage A-Sub) includes first to fourth A-switching devices A-Tr1 to A-Tr4, a first A-inverter A-INV1, a second A-inverter A-INV2, an A-carry output switching device A-CRO, a first A-carry discharging switching device A-CRD1, and a second A-carry discharging switching device A-CRD2, as shown in FIG. 36.

The first A-switching device A-Tr1 of the nth A-sub-stage A-Sub is controlled by an A-set signal (for example, an A-carry pulse A-CR_n−1 from an (n−1)th A-sub-stage A-Sub) and is connected between a charging voltage line and an A-set node A-Q. That is, the first A-switching device A-Tr1 is turned on or off in response to the A-carry pulse A-CR_n−1 from the (n−1)th A-sub-stage A-Sub, and interconnects the charging voltage line and the A-set node A-Q when turned on. Here, the charging voltage line is supplied with a charging voltage VDD. This charging voltage VDD is a DC voltage having a value capable of turning on corresponding switching devices.

Exceptionally, because there is no stage upstream of the first stage (not shown) which operates earliest among all stages in one frame period T_F, the A-sub-stage A-Sub of the first stage (referred to hereinafter as a first A-sub-stage A-Sub) is supplied with an A-start pulse A-Vst from a timing controller (not shown). As a result, the first A-switching device A-Tr1 of the first A-sub-stage A-Sub is supplied with the A-start pulse A-Vst instead of an upstream A-carry pulse.

The second A-switching device A-Tr2 of the nth A-sub-stage A-Sub is controlled by an A-reset signal (for example, an A-carry pulse A-CR_n+2 from an (n+2)th A-sub-stage A-Sub) and is connected between the A-set node A-Q and a thirteenth discharging voltage line. That is, the second A-switching device A-Tr2 is turned on or off in response to the A-carry pulse A-CR_n+2 from the (n+2)th A-sub-stage A-Sub, and interconnects the A-set node A-Q and the thirteenth discharging voltage line when turned on. Here, the thirteenth discharging voltage line is supplied with a thirteenth discharging voltage VSS13.

The third A-switching device A-Tr3 of the nth A-sub-stage A-Sub is controlled by a voltage at a first A-reset node A-QB1 and is connected between the A-set node A-Q and a fourteenth discharging voltage line. That is, the third A-switching device A-Tr3 is turned on or off in response to the voltage at the first A-reset node A-QB1, and interconnects the A-set node A-Q and the fourteenth discharging voltage line when turned on. Here, the fourteenth discharging voltage line is supplied with a fourteenth discharging voltage VSS14.

The fourth A-switching device A-Tr4 of the nth A-sub-stage A-Sub is controlled by a voltage at a second A-reset node A-QB2 and is connected between the A-set node A-Q and a fifteenth discharging voltage line. That is, the fourth A-switching device A-Tr4 is turned on or off in response to the voltage at the second A-reset node A-QB2, and interconnects the A-set node A-Q and the fifteenth discharging voltage line when turned on. Here, the fifteenth discharging voltage line is supplied with a fifteenth discharging voltage VSS15.

The first A-inverter A-INV1 of the nth A-sub-stage A-Sub controls the voltage at the first A-reset node A-QB1 based on a voltage at the A-set node A-Q such that the voltage at the A-set node A-Q and the voltage at the first A-reset node A-QB1 have opposite logics. In detail, when the voltage at the A-set node A-Q is logic high, the first A-inverter A-INV1 applies a low voltage VL to the first A-reset node A-QB1 to discharge the first A-reset node A-QB1. In contrast, when the voltage at the A-set node A-Q is logic low, the first A-inverter A-INV1 applies a first AC voltage AC1 to the first A-reset node A-QB1.

The second A-inverter A-INV2 of the nth A-sub-stage A-Sub controls the voltage at the second A-reset node A-QB2 based on the voltage at the A-set node A-Q such that the voltage at the A-set node A-Q and the voltage at the second A-reset node A-QB2 have opposite logics. In detail, when the voltage at the A-set node A-Q is logic high, the second A-inverter A-INV2 applies the low voltage VL to the second A-reset node A-QB2 to discharge the second A-reset node A-QB2. In contrast, when the voltage at the A-set node A-Q is logic low, the second A-inverter A-INV2 applies a second AC voltage AC2 to the second A-reset node A-QB2.

Here, each of the first AC voltage AC1 and second AC voltage AC2 is an AC signal which alternately has a high voltage VH and the low voltage VL at intervals of f frames (where f is a natural number). The first AC voltage AC1 is 180° phase-inverted with respect to the second AC voltage AC2. In this regard, provided that the first AC voltage AC1 is kept at the high voltage VH for a specific frame period, the second AC voltage AC2 will be kept at the low voltage VL for the same period.

The A-carry output switching device A-CRO of the nth A-sub-stage A-Sub is controlled by the voltage at the A-set node A-Q and is connected between any one A-clock transfer line and an A-carry output terminal A-COT of the nth A-sub-stage A-Sub. That is, the A-carry output switching device A-CRO is turned on or off in response to the voltage at the A-set node A-Q, and interconnects the A-clock transfer line and the A-carry output terminal A-COT when turned on.

The first A-carry discharging switching device A-CRD1 of the nth A-sub-stage A-Sub is controlled by the voltage at the first A-reset node A-QB1 and is connected between the A-carry output terminal A-COT and a sixteenth discharging voltage line. That is, the first A-carry discharging switching device A-CRD1 is turned on or off in response to the voltage at the first A-reset node A-QB1, and interconnects the A-carry output terminal A-COT and the sixteenth discharging voltage line when turned on. Here, the sixteenth discharging voltage line is supplied with a sixteenth discharging voltage VSS16.

The second A-carry discharging switching device A-CRD2 of the nth A-sub-stage A-Sub is controlled by the voltage at the second A-reset node A-QB2 and is connected between the A-carry output terminal A-COT and the sixteenth discharging voltage line. That is, the second A-carry discharging switching device A-CRD2 is turned on or off in response to the voltage at the second A-reset node A-QB2, and interconnects the A-carry output terminal A-COT and the sixteenth discharging voltage line when turned on.

Figure 37:
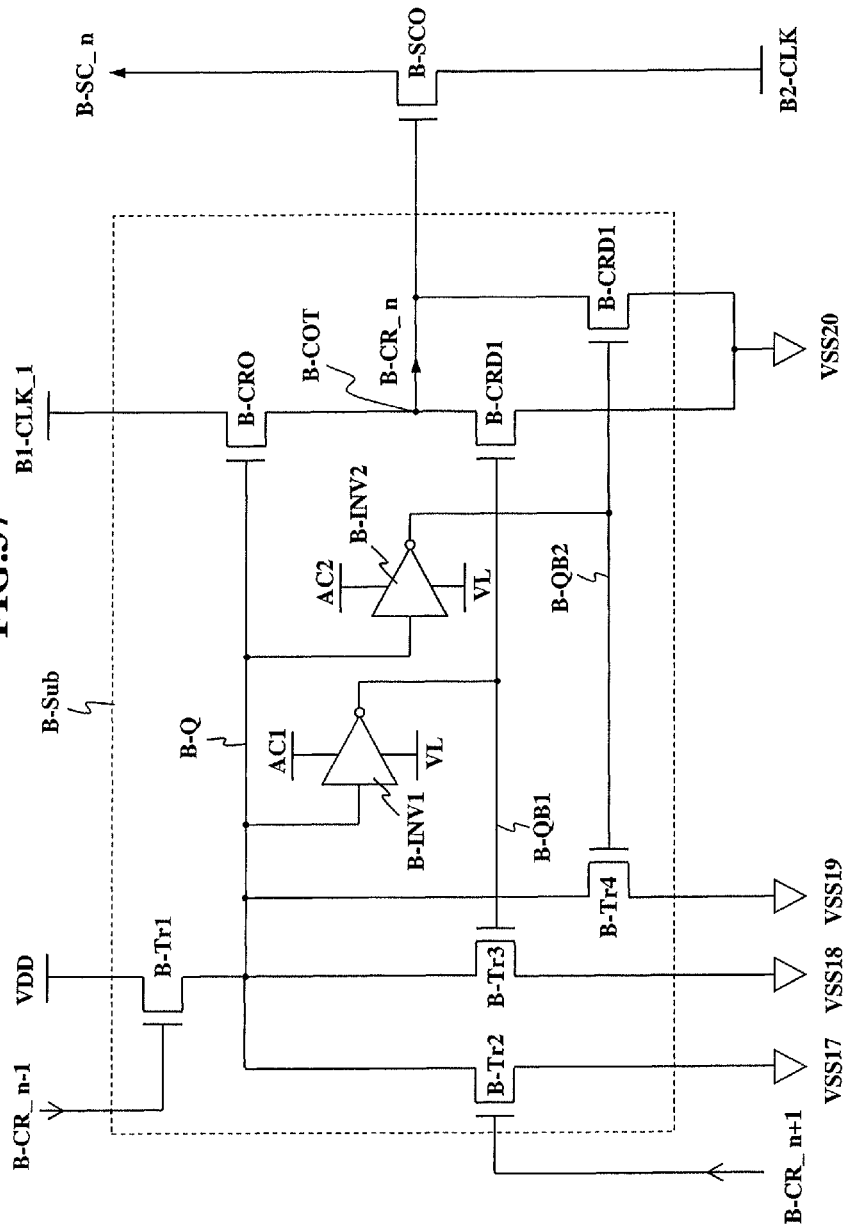
FIG. 37 is a circuit diagram of another embodiment of the B-sub-stage in the nth stage.

FIG. 37 is a circuit diagram of another embodiment of the B-sub-stage in the nth stage.

The B-sub-stage B-Sub of the nth stage (referred to hereinafter as an nth B-sub-stage B-Sub) includes first to fourth B-switching devices B-Tr1 to B-Tr4, a first B-inverter B-INV1, a second B-inverter B-INV2, a B-carry output switching device B-CRO, a first B-carry discharging switching device B-CRD1, and a second B-carry discharging switching device B-CRD2, as shown in FIG. 37.

The first B-switching device B-Tr1 of the nth B-sub-stage B-Sub is controlled by a B-set signal (for example, a B-carry pulse B-CR_n−1 from an (n−1)th B-sub-stage B-Sub) and is connected between the charging voltage line and a B-set node B-Q. That is, the first B-switching device B-Tr1 is turned on or off in response to the B-carry pulse B-CR_n−1 from the (n−1)th B-sub-stage B-Sub, and interconnects the charging voltage line and the B-set node B-Q when turned on.

Exceptionally, because there is no stage upstream of the first stage (not shown) which operates earliest among all stages in one frame period T_F, the B-sub-stage B-Sub of the first stage (referred to hereinafter as a first B-sub-stage B-Sub) is supplied with a B-start pulse B-Vst from the timing controller (not shown). As a result, the first B-switching device B-Tr1 of the first B-sub-stage B-Sub is supplied with the B-start pulse B-Vst instead of an upstream B-carry pulse B-CR.

The second B-switching device B-Tr2 of the nth B-sub-stage B-Sub is controlled by a B-reset signal (for example, a B-carry pulse B-CR_n+1 from an (n+1)th B-sub-stage B-Sub) and is connected between the B-set node B-Q and a seventeenth discharging voltage line. That is, the second B-switching device B-Tr2 is turned on or off in response to the B-carry pulse B-CR_n+1 from the (n+1)th B-sub-stage B-Sub, and interconnects the B-set node B-Q and the seventeenth discharging voltage line when turned on. Here, the seventeenth discharging voltage line is supplied with a seventeenth discharging voltage VSS17.

The third B-switching device B-Tr3 of the nth B-sub-stage B-Sub is controlled by a voltage at a first B-reset node B-QB1 and is connected between the B-set node B-Q and an eighteenth discharging voltage line. That is, the third B-switching device B-Tr3 is turned on or off in response to the voltage at the first B-reset node B-QB1, and interconnects the B-set node B-Q and the eighteenth discharging voltage line when turned on. Here, the eighteenth discharging voltage line is supplied with an eighteenth discharging voltage VSS18.

The fourth B-switching device B-Tr4 of the nth B-sub-stage B-Sub is controlled by a voltage at a second B-reset node B-QB2 and is connected between the B-set node B-Q and a nineteenth discharging voltage line. That is, the fourth B-switching device B-Tr4 is turned on or off in response to the voltage at the second B-reset node B-QB2, and interconnects the B-set node B-Q and the nineteenth discharging voltage line when turned on. Here, the nineteenth discharging voltage line is supplied with a nineteenth discharging voltage VSS19.

The first B-inverter B-INV1 of the nth B-sub-stage B-Sub controls the voltage at the first B-reset node B-QB1 based on a voltage at the B-set node B-Q such that the voltage at the B-set node B-Q and the voltage at the first B-reset node B-QB1 have opposite logics. In detail, when the voltage at the B-set node B-Q is logic high, the first B-inverter B-INV1 applies the low voltage VL to the first B-reset node B-QB1 to discharge the first B-reset node B-QB1. In contrast, when the voltage at the B-set node B-Q is logic low, the first B-inverter B-INV1 applies the first AC voltage AC1 to the first B-reset node B-QB1.

The second B-inverter B-INV2 of the nth B-sub-stage B-Sub controls the voltage at the second B-reset node B-QB2 based on the voltage at the B-set node B-Q such that the voltage at the B-set node B-Q and the voltage at the second B-reset node B-QB2 have opposite logics. In detail, when the voltage at the B-set node B-Q is logic high, the second B-inverter B-INV2 applies the low voltage VL to the second B-reset node B-QB2 to discharge the second B-reset node B-QB2. In contrast, when the voltage at the B-set node B-Q is logic low, the second B-inverter B-INV2 applies the second AC voltage AC2 to the second B-reset node B-QB2.

The B-carry output switching device B-CRO of the nth B-sub-stage B-Sub is controlled by the voltage at the B-set node B-Q and is connected between any one B1-clock transfer line and a B-carry output terminal B-COT of the nth B-sub-stage B-Sub. That is, the B-carry output switching device B-CRO is turned on or off in response to the voltage at the B-set node B-Q, and interconnects the B1-clock transfer line and the B-carry output terminal B-COT when turned on.

The first B-carry discharging switching device B-CRD1 of the nth B-sub-stage B-Sub is controlled by the voltage at the first B-reset node B-QB1 and is connected between the B-carry output terminal B-COT and a twentieth discharging voltage line. That is, the first B-carry discharging switching device B-CRD1 is turned on or off in response to the voltage at the first B-reset node B-QB1, and interconnects the B-carry output terminal B-COT and the twentieth discharging voltage line when turned on. Here, the twentieth discharging voltage line is supplied with a twentieth discharging voltage VSS20.

The second B-carry discharging switching device B-CRD2 of the nth B-sub-stage B-Sub is controlled by the voltage at the second B-reset node B-QB2 and is connected between the B-carry output terminal B-COT and the twentieth discharging voltage line. That is, the second B-carry discharging switching device B-CRD2 is turned on or off in response to the voltage at the second B-reset node B-QB2, and interconnects the B-carry output terminal B-COT and the twentieth discharging voltage line when turned on.

On the other hand, provided that each of the A-sub-stage A-Sub and B-sub-stage B-Sub adopts the structure having the two reset nodes in the above manner, the scan output controller SOC will also need a larger number of switching devices.

That is, the scan output controller SOC includes, as shown in FIGS. 36 and 37, an A-scan output switching device A-SCO, a B-scan output switching device B-SCO, a first A-scan discharging switching device A-SCD1, a second A-scan discharging switching device A-SCD2, a (1-1)th control switching device CTr1-1, and a (1-2)th control switching device CTr1-2.

The A-scan output switching device A-SCO is controlled by the voltage at the A-set node A-Q and is connected between the A-clock transfer line and the scan output terminal SOT of the corresponding stage. That is, the A-scan output switching device A-SCO is turned on or off in response to the voltage at the A-set node A-Q, and interconnects the A-clock transfer line and the scan output terminal SOT of the corresponding stage when turned on. Here, the A-clock transfer line is supplied with an A-clock pulse A-CLK.

The B-scan output switching device B-SCO is controlled by the B-carry pulse B-CR from the B-sub-stage B-Sub and is connected between the scan output terminal SOT and a B2-clock transfer line. That is, the B-scan output switching device B-SCO is turned on or off in response to the B-carry pulse B-CR, and interconnects the scan output terminal SOT and the B2-clock transfer line when turned on. Here, the B2-clock transfer line is supplied with a B2-clock pulse B2-CLK.

The first A-scan discharging switching device A-SCD1 is controlled by the voltage at the first A-reset node A-QB1 and is connected between the scan output terminal SOT and a first discharging voltage line. That is, the first A-scan discharging switching device A-SCD1 is turned on or off in response to the voltage at the first A-reset node A-QB1, and interconnects the scan output terminal SOT and the first discharging voltage line when turned on.

The second A-scan discharging switching device A-SCD2 is controlled by the voltage at the second A-reset node A-QB2 and is connected between the scan output terminal SOT and the first discharging voltage line. That is, the second A-scan discharging switching device A-SCD2 is turned on or off in response to the voltage at the second A-reset node A-QB2, and interconnects the scan output terminal SOT and the first discharging voltage line when turned on.

The (1-1)th control switching device CTr1-1 is controlled by the B-carry pulse B-CR and is connected between the first A-reset node A-QB1 and a second discharging voltage line. That is, the (1-1)th control switching device CTr1-1 is turned on or off in response to the B-carry pulse B-CR, and interconnects the first A-reset node A-QB1 and the second discharging voltage line when turned on. This (1-1)th control switching device CTr1-1 acts to make the first A-reset node A-QB1 discharged (i.e., low) irrespective of the output of the first A-inverter A-INV1.

The (1-2)th control switching device CTr1-2 is controlled by the B-carry pulse B-CR and is connected between the second A-reset node A-QB2 and the second discharging voltage line. That is, the (1-2)th control switching device CTr1-2 is turned on or off in response to the B-carry pulse B-CR, and interconnects the second A-reset node A-QB2 and the second discharging voltage line when turned on. This (1-2)th control switching device CTr1-2 acts to make the second A-reset node A-QB2 discharged (i.e., low) irrespective of the output of the second A-inverter A-INV2.

On the other hand, the B2-clock pulse B2-CLK may be of two or more phases. A description will hereinafter be given of an example when the B2-clock pulse B2-CLK may be of two phases.

Figure 38:
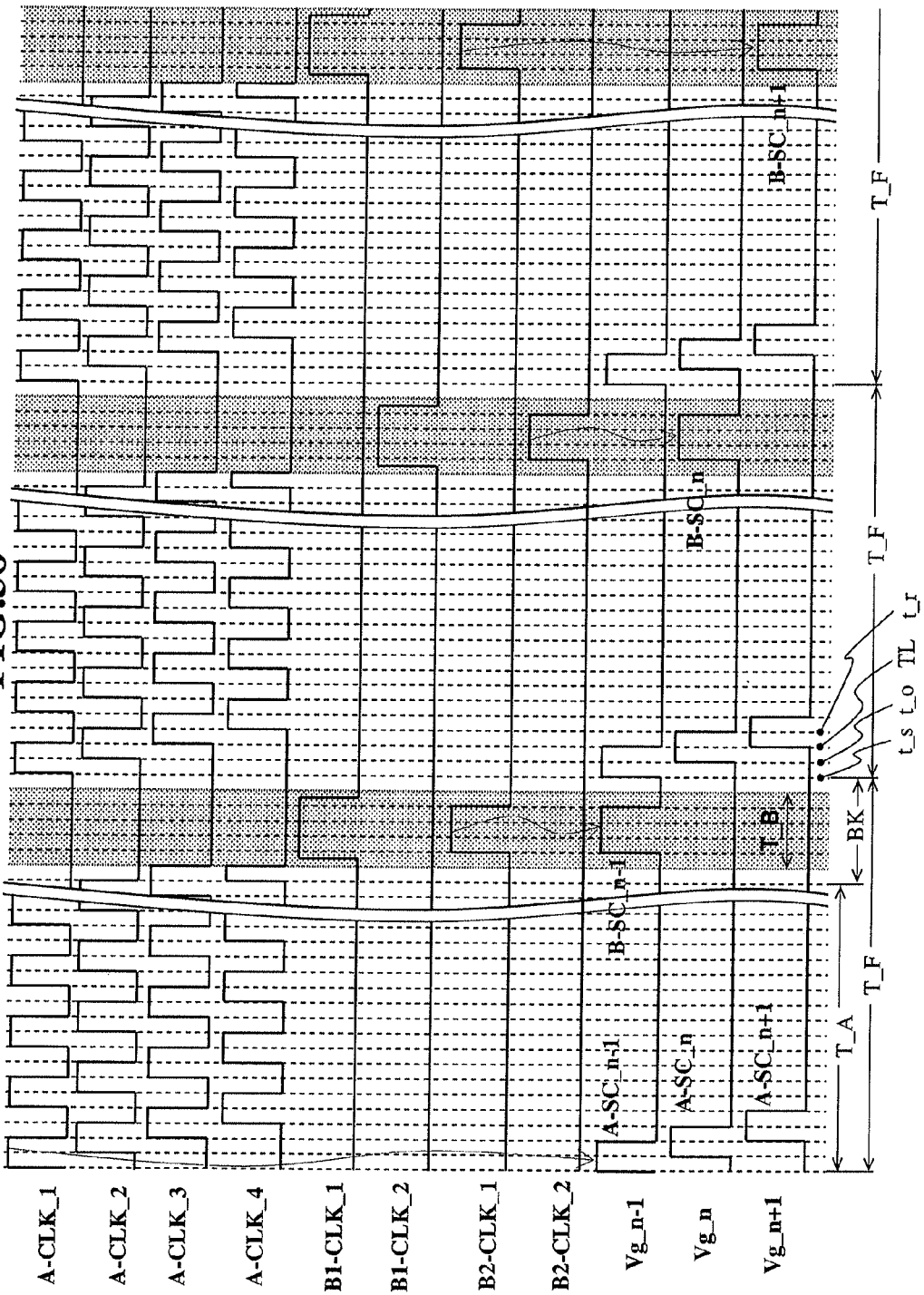
FIG. 38 is a timing diagram when the B2-clock pulse is of two phases.

FIG. 38 is a timing diagram when the B2-clock pulse B2-CLK is of two phases.

As shown in FIG. 38, a first B2-clock pulse B2 -CLK_1 is selectively output only in an odd-numbered B-output period T_B, whereas a second B2-clock pulse B2-CLK_2 is selectively output only in an even-numbered B-output period T_B.

Hence, the B-scan pulse B-SC is generated by the first B2-clock pulse B2-CLK_1 in the odd-numbered B-output period T_B, and by the second B2-clock pulse B2-CLK_2 in the even-numbered B-output period T_B.

On the other hand, at least one of the control switching devices provided in the scan output controller SOC may be built in the A-sub-stage A-Sub or B-sub-stage B-Sub of the corresponding stage.

Figure 39:
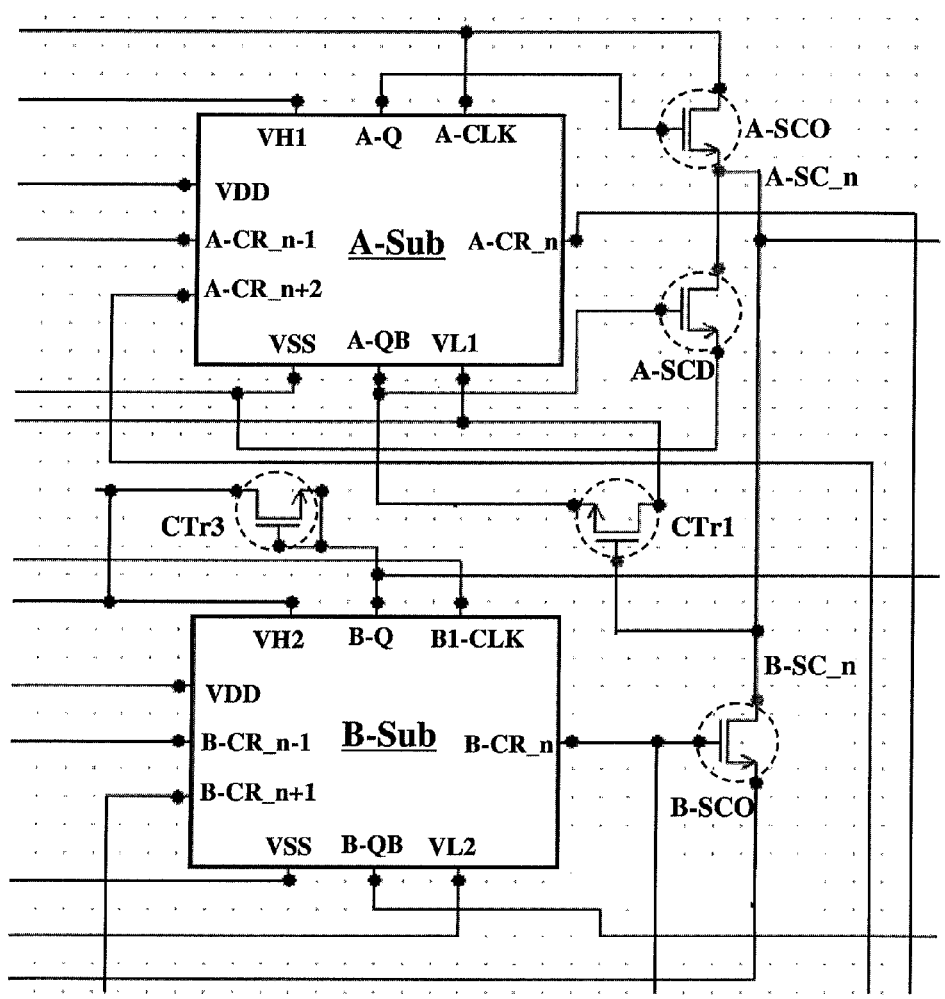
FIG. 39 is a circuit diagram illustrating a reconstructed version of the structure of the nth stage including the configuration of FIG. 15 based on a simulation program.
Figure 40:
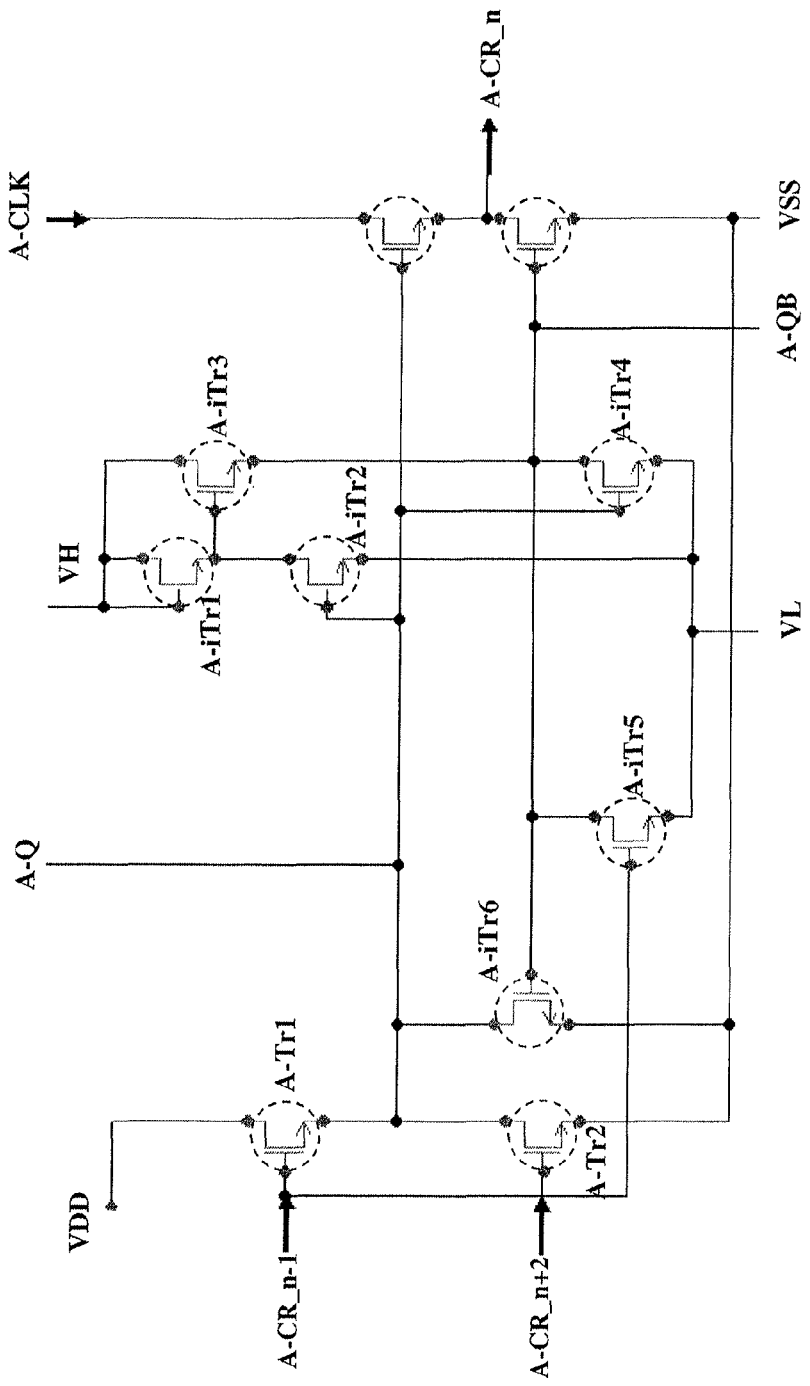
FIG. 40 is a circuit diagram illustrating a reconstructed version of the structure of the A-sub-stage in FIG. 19 based on a simulation program.
Figure 41:
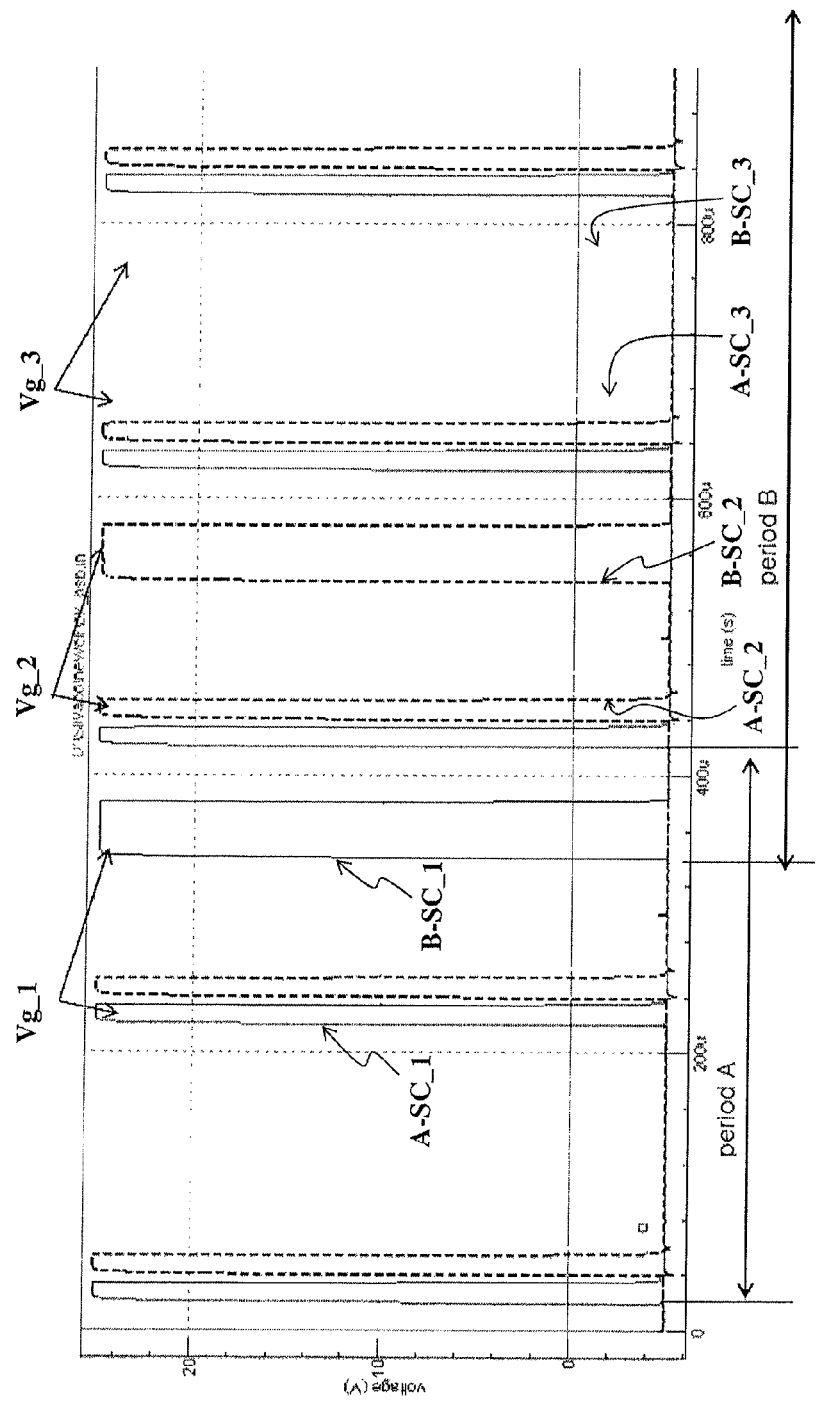
FIG. 41 is a waveform diagram of scan pulses from (n+1)th and (n+2)th stages, including the nth stage of FIG. 40, based on a simulation program.

FIGS. 39 to 41 illustrate results of verifying the operation of the shift register according to the present invention using simulation programs.

In detail, FIG. 39 is a circuit diagram illustrating a reconstructed version of the structure of the nth stage including the configuration of FIG. 15 based on a simulation program. Exceptionally, in FIG. 39, Vc in FIG. 15 is replaced with a constant voltage, which is one of various examples proposed. Here, FIG. 39 illustrates an example of use of the second high voltage VH2 as the constant voltage.

VSS in FIG. 39 may be any one of the previously-stated first to twentieth discharging voltages VSS1 to VSS20. These first to twentieth discharging voltages VSS1 to VSS20 are DC voltages having voltage levels capable of turning off the corresponding switching devices, stated previously. The first to twentieth discharging voltages VSS1 to VSS20 may all have the same values. Alternatively, some of the first to twentieth discharging voltages VSS1 to VSS20 may have the same values and the others may have different values. As another alternative, the first to twentieth discharging voltages VSS1 to VSS20 may all have different values.

For example, the first discharging voltage VSS1, the seventh discharging voltage VSS7, the eighth discharging voltage VSS8, the tenth discharging voltage VSS10, the eleventh discharging voltage VSS11, the twelfth discharging voltage VSS12, and the fifth discharging voltage VSS5 may all have the same values (VSS1=VSS7=VSS8=VSS10=VSS11=VSS12=VSS5).

Also, the second discharging voltage VSS2 and the first low voltage VL1 may have the same values (VSS2=VL1).

FIG. 40 is a circuit diagram illustrating a reconstructed version of the structure of the A-sub-stage A-Sub in FIG. 19 based on a simulation program. An A-inverter A-INV in FIG. 40 includes the first to fourth A-inverting switching devices A-iTr1 to A-iTr4 shown in FIG. 31, and the fifth and sixth A-inverting switching devices A-iTr5 and A-iTr6 shown in FIGS. 33(a) and 33(b).

FIG. 41 is a waveform diagram of scan pulses from the (n+1)th and (n+2)th stages, including the nth stage of FIG. 40, based on a simulation program.

In FIG. 41, Vg_1 signifies the scan pulse output from the nth stage, which is divided into an A-scan pulse A-SC and a B-scan pulse B-SC. Vg_2 signifies the scan pulse output from the (n+1)th stage, which is divided into an A-scan pulse A-SC and a B-scan pulse B-SC. Vg_3 signifies the scan pulse output from the (n+2)th stage, which is divided into an A-scan pulse A-SC and a B-scan pulse B-SC.

On the other hand, a period A in FIG. 41 signifies a period between a time at which an A-scan pulse A-SC is output from a specific stage and a time at which the A-scan pulse A-SC is again output from the specific stage. This period A corresponds to one frame period.

Also, a period B in FIG. 41 signifies a period between a time at which a B-scan pulse B-SC is output from the specific stage and a time at which the B-scan pulse B-SC is again output from the specific stage. This period B corresponds to "number of gate lines*one frame period".

As is apparent from the above description, a shift register according to the present invention has effects as follows.

In the present invention, a set node is bootstrapped using clock pulses, not a constant voltage, and a floating structure, so that an A-scan pulse and a B-scan pulse can be stably output even if the clock pulses have relatively low voltages. Further, the stabilization of the output voltages by the bootstrapping makes it possible to prevent the output voltages from being attenuated even if the sizes of scan output switching devices are made to be relatively small. Therefore, the occupied area of a display device is minimized, which is advantageous to reducing the size of the display device.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A shift register comprising a plurality of stages for sequentially outputting A-scan pulses and B-scan pulses, wherein at least one of the stages comprises:
   an A-sub-stage that controls a voltage at an A-set node and a voltage at at least one A-reset node in response to an external A-control signal and generates an A-carry pulse based on the voltage at the A-set node, the voltage at the at least one A-reset node and any one A-clock pulse;

a B-sub-stage that controls a voltage at a B-set node and a voltage at at least one B-reset node in response to an external B-control signal and generates a B-carry pulse based on the voltage at the B-set node, the voltage at the at least one B-reset node and any one B1-clock pulse; and a scan output controller that generates a corresponding one of the A-scan pulses based on the voltage at the A-set node and the A-clock pulse and generates a corresponding one of the B-scan pulses based on the B-carry pulse and any one B2-clock pulse.

2. The shift register according to claim 1, wherein the scan output controller comprises:

an A-scan output switching device controlled by the voltage at the A-set node and connected between an A-clock transfer line, the A-clock transfer line transferring the A-clock pulse, and a scan output terminal of the at least one stage; and a B-scan output switching device controlled by the B-carry pulse and connected between the scan output terminal and a B2-clock transfer line, the B2-clock transfer line transferring the B2-clock pulse.

3. The shift register according to claim 2, wherein the scan output controller further comprises:

an A-scan discharging switching device controlled by the voltage at the at least one A-reset node and connected between the scan output terminal and a first discharging voltage line, the first discharging voltage line transferring a first discharging voltage; and a first control switching device controlled by the B-carry pulse and connected between the at least one A-reset node and a second discharging voltage line, the second discharging voltage line transferring a second discharging voltage.

4. The shift register according to claim 2, wherein the scan output controller further comprises:

an A-scan discharging switching device controlled by the voltage at the at least one A-reset node and connected between the scan output terminal and a first discharging voltage line, the first discharging voltage line transferring a first discharging voltage; and a first control switching device controlled by a voltage at the scan output terminal and connected between the at least one A-reset node and a second discharging voltage line, the second discharging voltage line transferring a second discharging voltage.

5. The shift register according to claim 2, wherein the scan output controller comprises a second control switching device controlled by a switching control signal and connected between a B-carry output terminal of the B-sub-stage, the B-carry output terminal outputting the B-carry pulse, and a gate electrode of the B-scan output switching device.

6. The shift register according to claim 5, wherein the switching control signal is any one of the B-carry pulse from the B-sub-stage, the B1-clock pulse, a constant voltage and a C-clock pulse.

7. The shift register according to claim 6, wherein the C-clock pulse and the B1-clock pulse have one of:

a timing set such that a rising edge of the C-clock pulse is ahead of a rising edge of the B1-clock pulse and a falling edge of the C-clock pulse is behind a falling edge of the B1-clock pulse; or a timing set such that the rising edge of the C-clock pulse is positioned between the rising edge and falling edge of the B1-clock pulse and the falling edge of the C-clock pulse is behind the falling edge of the B1-clock pulse.

8. The shift register according to claim 5, wherein the scan output controller further comprises:

an A-scan discharging switching device controlled by the voltage at the at least one A-reset node and connected between the scan output terminal and a first discharging voltage line, the first discharging voltage line transferring a first discharging voltage; and a first control switching device controlled by the B-carry pulse passed through the second control switching device and connected between the at least one A-reset node and a second discharging voltage line, the second discharging voltage line transferring a second discharging voltage.

9. The shift register according to claim 5, wherein the scan output controller comprises:

an A-scan discharging switching device controlled by the voltage at the at least one A-reset node and connected between the scan output terminal and a first discharging voltage line, the first discharging voltage line transferring a first discharging voltage; and a first control switching device controlled by the B-carry pulse from the B-sub-stage and connected between the at least one A-reset node and a second discharging voltage line, the second discharging voltage line transferring a second discharging voltage.

10. The shift register according to claim 5, wherein the scan output controller comprises:

an A-scan discharging switching device controlled by the voltage at the at least one A-reset node and connected between the scan output terminal and a first discharging voltage line, the first discharging voltage line transferring a first discharging voltage; and a first control switching device controlled by a voltage at the scan output terminal and connected between the at least one A-reset node and a second discharging voltage line, the second discharging voltage line transferring a second discharging voltage.

11. The shift register according to claim 3, wherein the scan output controller comprises a third control switching device controlled by the voltage at the B-set node and connected between a control voltage line, the control voltage line transferring a control voltage, and the B-set node.

12. The shift register according to claim 4, wherein the scan output controller comprises a third control switching device controlled by the voltage at the B-set node and connected between a control voltage line, the control voltage line transferring a control voltage, and the B-set node.

13. The shift register according to claim 11, wherein the control voltage is any one of:

a charging voltage used to charge the A-set node and the B-set node;

a high voltage used to charge the at least one A-reset node and the at least one B-reset node;

an external direct current (DC) voltage;

an external alternating current (AC) voltage; and another B1-clock pulse having a phase different from that of the B1-clock pulse supplied to the B-sub-stage.

14. The shift register according to claim 5, wherein the scan output controller comprises at least one of:

a fourth control switching device controlled by the A-carry pulse from the A-sub-stage and connected between the gate electrode of the B-scan output switching device and a third discharging voltage line, the third discharging voltage line transferring a third discharging voltage;

a fifth control switching device controlled by the voltage at the A-set node and connected between the gate electrode of the B-scan output switching device and a fourth discharging voltage line, the fourth discharging voltage line transferring a fourth discharging voltage;

a sixth control switching device controlled by an A-start pulse and connected between the gate electrode of the B-scan output switching device and a fifth discharging voltage line, the fifth discharging voltage line transferring a fifth discharging voltage; and a seventh control switching device shown controlled by the voltage at the at least one B-reset node and connected between the gate electrode of the B-scan output switching device and a sixth discharging voltage line, the sixth discharging voltage line transferring a sixth discharging voltage.

15. The shift register according to claim 3, wherein the scan output controller further comprises at least one of:

an eighth control switching device controlled by a voltage applied to a gate electrode of the B-scan output switching device and connected between the A-set node and a seventh discharging voltage line, the seventh discharging voltage line transferring a seventh discharging voltage; and a ninth control switching device controlled by the A-carry pulse from the A-sub-stage or the voltage at the A-set node and connected between a B-carry output terminal of the B-sub-stage, the B-carry output terminal outputting the B-carry pulse, and an eighth discharging voltage line, the eighth discharging voltage line transferring an eighth discharging voltage.

16. The shift register according to claim 5, wherein the scan output controller further comprises at least one of:

an eighth control switching device controlled by the B-carry pulse from the B-sub-stage or the B-carry pulse applied through the second control switching device and connected between the A-set node and a seventh discharging voltage line, the seventh discharging voltage line transferring a seventh discharging voltage; and a ninth control switching device controlled by the A-carry pulse from the A-sub-stage or the voltage at the A-set node and connected between the B-carry output terminal and an eighth discharging voltage line, the eighth discharging voltage line transferring an eighth discharging voltage.

17. The shift register according to claim 1, wherein:
the A-clock pulse is of two or more phases;
the B1-clock pulse is of two or more phases; and
the B2-clock pulse is of one or more phases,
wherein the B1-clock pulse has a period longer than that of the A-clock pulse, and the A-clock pulse, the B1-clock pulse and the B2-clock pulse have the same pulse widths or at least two of the A-clock pulse, the B1-clock pulse and the B2-clock pulse have different pulse widths.

18. The shift register according to claim 17, wherein the A-clock pulse is kept low while the B1-clock pulse is kept high.

19. The shift register according to claim 1, wherein the external A-control signal comprises an A-set signal and an A-reset signal,
wherein the A-sub-stage of the at least one stage comprises:
a first A-switching device controlled by the A-set signal and connected between a charging voltage line, the charging voltage line transferring a charging voltage, and the A-set node;

a second A-switching device controlled by the A-reset signal and connected between the A-set node and a ninth discharging voltage line, the ninth discharging voltage line transferring a ninth discharging voltage;

an A-inverter that controls the voltage at the at least one A-reset node based on the voltage at the A-set node such that the voltage at the A-set node and the voltage at the at least one A-reset node have opposite logics;

an A-carry output switching device controlled by the voltage at the A-set node and connected between an A-clock transfer line, the A-clock transfer line transferring the A-clock pulse, and an A-carry output terminal of the A-sub-stage; and an A-carry discharging switching device controlled by the voltage at the at least one A-reset node and connected between the A-carry output terminal and a tenth discharging voltage line, the tenth discharging voltage line transferring a tenth discharging voltage.

20. The shift register according to claim 19, wherein the A-inverter comprises:
a first A-inverting switching device controlled by a high voltage from a high voltage line and connected between the high voltage line and the at least one A-reset node; and
a second A-inverting switching device controlled by the voltage at the A-set node and connected between the at least one A-reset node and a low voltage line, the low voltage line transferring a low voltage.

21. The shift register according to claim 19, wherein the A-inverter comprises:
a first A-inverting switching device controlled by an external control signal and connected between a high voltage line, the high voltage line transferring a high voltage, and the at least one A-reset node; and
a second A-inverting switching device controlled by the voltage at the A-set node and connected between the at least one A-reset node and a low voltage line, the low voltage line transferring a low voltage.

22. The shift register according to claim 19, wherein the A-inverter comprises:
a first A-inverting switching device controlled by an external control signal and connected between a high voltage line, the high voltage line transferring a high voltage, and an A-common node;
a second A-inverting switching device controlled by the voltage at the A-set node and connected between the A-common node and a low voltage line, the low voltage line transferring a low voltage;
a third A-inverting switching device controlled by a voltage at the A-common node and connected between the high voltage line and the at least one A-reset node; and
a fourth A-inverting switching device controlled by the voltage at the A-set node and connected between the at least one A-reset node and the low voltage line.

23. The shift register according to claim 19, wherein the A-inverter comprises:
a first A-inverting switching device controlled by a high voltage from a high voltage line and connected between the high voltage line and an A-common node;
a second A-inverting switching device controlled by the voltage at the A-set node and connected between the A-common node and a low voltage line, the low voltage line transferring a low voltage;
a third A-inverting switching device controlled by a voltage at the A-common node and connected between the high voltage line and the at least one A-reset node; and a fourth A-inverting switching device controlled by the voltage at the A-set node and connected between the at least one A-reset node and the low voltage line.

24. The shift register according to claim 19, wherein the A-inverter comprises:
a first A-inverting switching device controlled by the voltage at the A-set node and connected between the at least one A-reset node and a low voltage line, the low voltage line transferring a low voltage;
a second A-inverting switching device controlled by the voltage at the at least one A-reset node and connected between the A-set node and a scan output terminal of the scan output controller or between the A-set node and the A-carry output terminal; and
an A-capacitor connected between the A-clock transfer line and the at least one A-reset node.

25. The shift register according to claim 20, wherein the A-inverter comprises at least one of:
a fifth A-inverting switching device controlled by the A-set signal and connected between the at least one A-reset node and the low voltage line;
a sixth A-inverting switching device controlled by the voltage at the at least one A-reset node and connected between the A-set node and the low voltage line; and
a seventh A-inverting switching device controlled by the A-clock pulse from the A-clock transfer line and connected between an output terminal, the output terminal outputting the A-set signal, and the A-set node.

26. The shift register according to claim 22, wherein the A-inverter comprises an eighth A-inverting switching device controlled by the B-carry pulse or a voltage applied to a gate electrode of a B-scan output switching device of the scan output controller and connected between the A-common node and the low voltage line.

27. The shift register according to claim 19, wherein:
the A-set signal is an A-start pulse, or an A-carry pulse output from any one of stages operating earlier than the at least one stage, among the plurality of stages; and
the A-reset signal is an A-carry pulse output from any one of stages operating later than the at least one stage, among the plurality of stages.

28. The shift register according to claim 1, wherein the external B-control signal comprises a B-set signal and a B-reset signal,
wherein the B-sub-stage of the at least one stage comprises:
a first B-switching device controlled by the B-set signal and connected between a charging voltage line, the charging voltage line transferring a charging voltage, and the B-set node;
a second B-switching device controlled by the B-reset signal and connected between the B-set node and an eleventh discharging voltage line, the eleventh discharging voltage line transferring an eleventh discharging voltage;
a B-inverter that controls the voltage at the at least one B-reset node based on the voltage at the B-set node such that the voltage at the B-set node and the voltage at the at least one B-reset node have opposite logics;
a B-carry output switching device controlled by the voltage at the B-set node and connected between a B1-clock transfer line, the B1-clock transfer line transferring the B1-clock pulse, and a B-carry output terminal of the B-sub-stage; and
a B-carry discharging switching device controlled by the voltage at the at least one B-reset node and connected between the B-carry output terminal and a twelfth discharging voltage line, the twelfth discharging voltage line transferring a twelfth discharging voltage.

29. The shift register according to claim 28, wherein the B-inverter comprises:
a first B-inverting switching device controlled by a high voltage from a high voltage line and connected between the high voltage line and the at least one B-reset node; and
a second B-inverting switching device controlled by the voltage at the B-set node and connected between the at least one B-reset node and a low voltage line, the low voltage line transferring a low voltage.

30. The shift register according to claim 28, wherein the B-inverter comprises:
a first B-inverting switching device controlled by an external control signal and connected between a high voltage line, the high voltage line transferring a high voltage, and the at least one B-reset node; and
a second B-inverting switching device controlled by the voltage at the B-set node and connected between the at least one B-reset node and a low voltage line, the low voltage line transferring a low voltage.

31. The shift register according to claim 28, wherein the B-inverter comprises:
a first B-inverting switching device controlled by an external control signal and connected between a high voltage line, the high voltage line transferring a high voltage, and a B-common node;
a second B-inverting switching device controlled by the voltage at the B-set node and connected between the B-common node and a low voltage line, the low voltage line transferring a low voltage;
a third B-inverting switching device controlled by a voltage at the B-common node and connected between the high voltage line and the at least one B-reset node; and
a fourth B-inverting switching device controlled by the voltage at the B-set node and connected between the at least one B-reset node and the low voltage line.

32. The shift register according to claim 28, wherein the B-inverter comprises:
a first B-inverting switching device controlled by a high voltage from a high voltage line and connected between the high voltage line and a B-common node;
a second B-inverting switching device controlled by the voltage at the B-set node and connected between the B-common node and a low voltage line, the low voltage line transferring a low voltage;
a third B-inverting switching device controlled by a voltage at the B-common node and connected between the high voltage line and the at least one B-reset node; and
a fourth B-inverting switching device controlled by the voltage at the B-set node and connected between the at least one B-reset node and the low voltage line.

33. The shift register according to claim 28, wherein the B-inverter comprises:
a first B-inverting switching device controlled by the voltage at the B-set node and connected between the at least one B-reset node and a low voltage line, the low voltage line transferring a low voltage;
a second B-inverting switching device controlled by the voltage at the at least one B-reset node and connected between the B-set node and a scan output terminal of the scan output controller or between the B-set node and the B-carry output terminal; and
a B-capacitor connected between the B1-clock transfer line and the at least one B-reset node.

34. The shift register according to claim 29, wherein the B-inverter comprises at least one of:
- a fifth B-inverting switching device controlled by the B-set signal and connected between the at least one B-reset node and the low voltage line;
- a sixth B-inverting switching device controlled by the voltage at the at least one B-reset node and connected between the B-set node and the low voltage line; and
- a seventh B-inverting switching device controlled by the B1-clock pulse from the B1-clock transfer line and connected between an output terminal, the output terminal outputting the B-set signal, and the B-set node.

35. The shift register according to claim 28, wherein:
the B-set signal is a B-start pulse, or a B-carry pulse output from any one of stages operating earlier than the at least one stage, among the plurality of stages; and
the B-reset signal is a B-carry pulse output from any one of stages operating later than the at least one stage, among the plurality of stages.

36. The shift register according to claim 2, wherein the at least one A-reset node comprises a first A-reset node and a second A-reset node,
wherein the scan output controller further comprises:
- a first A-scan discharging switching device controlled by a voltage at the first A-reset node and connected between the scan output terminal and a first discharging voltage line, the first discharging voltage line transferring a first discharging voltage;
- a second A-scan discharging switching device controlled by a voltage at the second A-reset node and connected between the scan output terminal and the first discharging voltage line;
- a (1-1) th control switching device controlled by the B-carry pulse and connected between the first A-reset node and a second discharging voltage line, the second discharging voltage line transferring a second discharging voltage; and
- a (1-2) th control switching device controlled by the B-carry pulse and connected between the second A-reset node and the second discharging voltage line.

37. The shift register according to claim 1, wherein:
the at least one A-reset node comprises a first A-reset node and a second A-reset node; and
the external A-control signal comprises an A-set signal and an A-reset signal,
wherein the A-sub-stage of the at least one stage comprises:
- a first A-switching device controlled by the A-set signal and connected between a charging voltage line, the charging voltage line transferring a charging voltage, and the A-set node;
- a second A-switching device controlled by the A-reset signal and connected between the A-set node and a thirteenth discharging voltage line, the thirteenth discharging voltage line transferring a thirteenth discharging voltage;
- a third A-switching device controlled by a voltage at the first A-reset node and connected between the A-set node and a fourteenth discharging voltage line, the fourteenth discharging voltage line transferring a fourteenth discharging voltage;
- a fourth A-switching device controlled by a voltage at the second A-reset node and connected between the A-set node and a fifteenth discharging voltage line, the fifteenth discharging voltage line transferring a fifteenth discharging voltage;
- a first A-inverter for controlling the voltage at the first A-reset node based on the voltage at the A-set node such that the voltage at the A-set node and the voltage at the first A-reset node have opposite logics;
- a second A-inverter for controlling the voltage at the second A-reset node based on the voltage at the A-set node such that the voltage at the A-set node and the voltage at the second A-reset node have opposite logics;
- an A-carry output switching device controlled by the voltage at the A-set node and connected between an A-clock transfer line, the A-clock transfer line transferring the A-clock pulse, and an A-carry output terminal of the A-sub-stage;
- a first A-carry discharging switching device controlled by the voltage at the first A-reset node and connected between the A-carry output terminal and a sixteenth discharging voltage line, the sixteenth discharging voltage line transferring a sixteenth discharging voltage; and
- a second A-carry discharging switching device controlled by the voltage at the second A-reset node and connected between the A-carry output terminal and the sixteenth discharging voltage line.

38. The shift register according to claim 1, wherein:
the at least one B-reset node comprises a first B-reset node and a second B-reset node; and
the external B-control signal comprises a B-set signal and a B-reset signal,
wherein the B-sub-stage of the at least one stage comprises:
- a first B-switching device controlled by the B-set signal and connected between a charging voltage line, the charging voltage line transferring a charging voltage, and the B-set node;
- a second B-switching device controlled by the B-reset signal and connected between the B-set node and a seventeenth discharging voltage line, the seventeenth discharging voltage line transferring a seventeenth discharging voltage;
- a third B-switching device controlled by a voltage at the first B-reset node and connected between the B-set node and an eighteenth discharging voltage line, the eighteenth discharging voltage line transferring an eighteenth discharging voltage;
- a fourth B-switching device controlled by a voltage at the second B-reset node and connected between the B-set node and a nineteenth discharging voltage line, the nineteenth discharging voltage line transferring a nineteenth discharging voltage;
- a first B-inverter for controlling the voltage at the first B-reset node based on the voltage at the B-set node such that the voltage at the B-set node and the voltage at the first B-reset node have opposite logics;
- a second B-inverter that controls the voltage at the second B-reset node based on the voltage at the B-set node such that the voltage at the B-set node and the voltage at the second B-reset node have opposite logics;
- a B-carry output switching device controlled by the voltage at the B-set node and connected between a B1-clock transfer line, the B1-clock transfer line transferring the B1-clock pulse, and a B-carry output terminal of the B-sub-stage;
- a first B-carry discharging switching device controlled by the voltage at the first B-reset node and connected between the B-carry output terminal and a twentieth discharging voltage line, the twentieth discharging voltage line transferring a twentieth discharging voltage; and a second B-carry discharging switching device controlled by the voltage at the second B-reset node and connected between the B-carry output terminal and the twentieth discharging voltage line.

* * * * *